US012787399B2

(12) United States Patent
Hsu et al.

(10) Patent No.: US 12,787,399 B2
(45) Date of Patent: Nov. 3, 2026

(54) STI LOSS MITIGATION BY RADICAL OXIDATION TREATMENT

(71) Applicant: Taiwan Semiconductor Manufacturing Co., Ltd., Hsinchu (TW)

(72) Inventors: Shao-Hua Hsu, Taitung (TW); Chia-I Lin, Taipei (TW); Hsiu-Hao Tsao, Taichung (TW); Kai-Min Chien, New Taipei (TW); Chen-Huang Huang, Hsinchu (TW); An Chyi Wei, Hsinchu (TW); Ryan Chia-Jen Chen, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 573 days.

(21) Appl. No.: 18/303,989

(22) Filed: Apr. 20, 2023

(65) Prior Publication Data

US 2024/0355906 A1 Oct. 24, 2024

(51) Int. Cl.

| | |
|---|---|
| ***H10D 64/01*** | (2025.01) |
| ***H10D 30/01*** | (2025.01) |
| ***H10D 62/00*** | (2025.01) |
| ***H10D 84/01*** | (2025.01) |
| ***H10W 10/00*** | (2026.01) |
| ***H10W 10/17*** | (2026.01) |

(52) U.S. Cl.

CPC ......... *H10D 64/015* (2025.01); *H10D 30/024* (2025.01); *H10D 30/0245* (2025.01); *H10D 62/021* (2025.01); *H10D 64/017* (2025.01); *H10D 84/0151* (2025.01); *H10D 84/0188* (2025.01); *H10W 10/0147* (2026.01); *H10W 10/17* (2026.01)

(58) Field of Classification Search

CPC ............. H10D 64/015; H10D 84/0151; H10D 84/0188; H10D 30/024; H01L 21/76235; H10P 14/6304; H10P 14/6519; H10P 14/6319; H10P 14/6532

See application file for complete search history.

(56) References Cited

U.S. PATENT DOCUMENTS

2005/0101143 A1* 5/2005 Lee ....................... H10P 50/692 257/E21.546
2006/0003603 A1* 1/2006 Fukuchi ............ H01J 37/32192 438/787
2010/0151694 A1* 6/2010 Peuse .................. H10P 14/6304 438/770
2017/0250280 A1* 8/2017 Wu ...................... H10D 30/024
2020/0075729 A1* 3/2020 Yen ...................... H10D 30/024

(Continued)

FOREIGN PATENT DOCUMENTS

CN 115732326 A 3/2023
DE 102020104379 A1 * 8/2021 ............ H10P 50/283

(Continued)

*Primary Examiner* — Joseph C. Nicely
(74) *Attorney, Agent, or Firm* — Slater Matsil, LLP

(57) ABSTRACT

Embodiments include a method and device resulting from the method, including using a radical oxidation process to oxidize a spacer layer which lines the opening after removing a dummy gate electrode. The oxidized layer is removed by an etching process. An STI region disposed below the dummy gate electrode may be partially etched.

20 Claims, 51 Drawing Sheets

(56) References Cited

U.S. PATENT DOCUMENTS

| | | | | |
|---|---|---|---|---|
| 2021/0249271 | A1* | 8/2021 | Peng | H10D 30/024 |
| 2022/0032031 | A1 | 2/2022 | Feith et al. | |
| 2023/0138136 | A1* | 5/2023 | Li | H10D 62/118<br>257/288 |
| 2024/0038872 | A1* | 2/2024 | Lin | H10D 30/014 |
| 2024/0304687 | A1* | 9/2024 | Yao | H10D 30/014 |

FOREIGN PATENT DOCUMENTS

| | | | | |
|---|---|---|---|---|
| JP | 2002334971 | A * | 11/2002 | G11C 11/161 |
| TW | 201535730 | A | 9/2015 | |

* cited by examiner

STI LOSS MITIGATION BY RADICAL OXIDATION TREATMENT

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
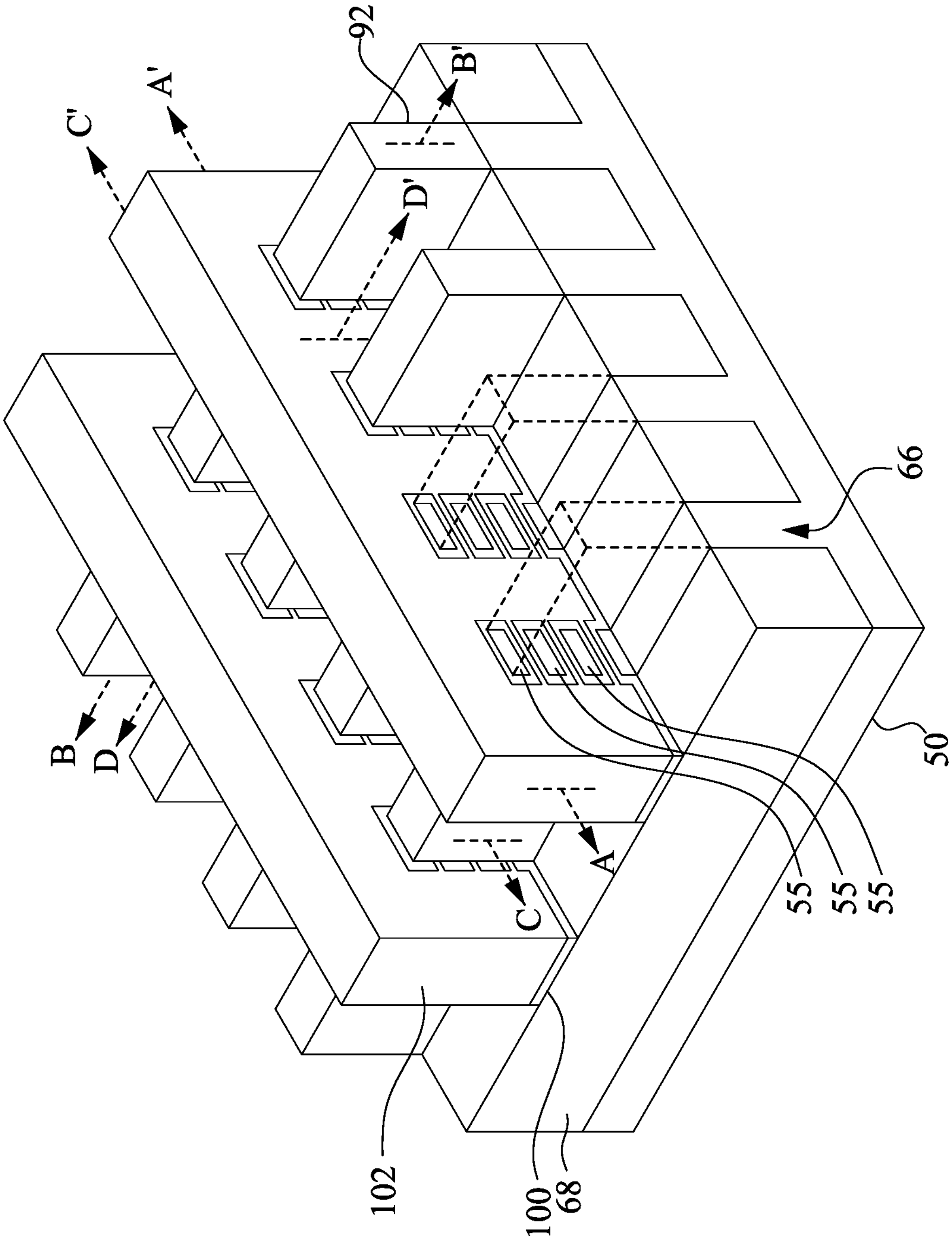
FIG. 1 illustrates an example of a nanostructure field-effect transistor (nano-FET) in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments are described below in a particular context, a die comprising nano-FETs. Various embodiments may be applied, however, to dies comprising other types of transistors (e.g., fin field effect transistors (FinFETs), planar transistors, or the like) in lieu of or in combination with the nano-FETs.

In a dummy gate replacement process, when the dummy gate is removed to form a gate opening, isolation regions underlying the dummy gate may be exposed. Then, gate spacers may be trimmed to improve the aspect ratio of the gate opening. In the trimming process, the exposed isolation regions may be etched. However, due to the trimming process being on thin, vertical spacers and the exposed isolation regions being exposed, etchant consumption is non-uniform and the isolation regions may become damaged so that their effectiveness is reduced. Embodiments provide a radical treatment process to oxidize the spacer layer which provides a uniform top to bottom oxidation layer on the spacer. Then uniform etchant consumption is achieved and less isolation region loss with a smoother surface.

FIG. 1 illustrates an example of nano-FETs (e.g., nanowire FETs, nanosheet FETs (Nano-FETs), or the like) in a three-dimensional view, in accordance with some embodiments. The nano-FETs comprise nanostructures 55 (e.g., nanosheets, nanowire, or the like) over fins 66 on a substrate 50 (e.g., a semiconductor substrate), wherein the nanostructures 55 act as channel regions for the nano-FETs. The nanostructure 55 may include p-type nanostructures, n-type nanostructures, or a combination thereof. Isolation regions 68 are disposed between adjacent fins 66, which may protrude above and from between neighboring isolation regions 68. Although the isolation regions 68 are described/illustrated as being separate from the substrate 50, as used herein, the term "substrate" may refer to the semiconductor substrate alone or a combination of the semiconductor substrate and the isolation regions. Additionally, although a bottom portion of the fins 66 are illustrated as being single, continuous materials with the substrate 50, the bottom portion of the fins 66 and/or the substrate 50 may comprise a single material or a plurality of materials. In this context, the fins 66 refer to the portion extending between the neighboring isolation regions 68.

Gate dielectric layers 100 are over top surfaces of the fins 66 and along top surfaces, sidewalls, and bottom surfaces of the nanostructures 55. Gate electrodes 102 are over the gate dielectric layers 100. Epitaxial source/drain regions 92 are disposed on the fins 66 on opposing sides of the gate dielectric layers 100 and the gate electrodes 102. Source/drain region(s) 92 may refer to a source or a drain, individually or collectively dependent upon the context.

FIG. 1 further illustrates reference cross-sections that are used in later figures. Cross-section A-A' is along a longitudinal axis of a gate electrode 102 and in a direction, for example, perpendicular to the direction of current flow between the epitaxial source/drain regions 92 of a nano-FET. Cross-section B-B' is perpendicular to cross-section A-A' and is parallel to a longitudinal axis of a fin 66 of the nano-FET and in a direction of, for example, a current flow between the epitaxial source/drain regions 92 of the nano-FET. Cross-section C-C' is parallel to cross-section A-A' and extends through epitaxial source/drain regions of the nano-FETs. Cross-section D-D' is parallel to cross-section B-B' and extends between the epitaxial source/drain regions 92 and between adjacent rows of nanostructures 55. Subsequent figures refer to these reference cross-sections for clarity.

Some embodiments discussed herein are discussed in the context of nano-FETs formed using a gate-last process. In other embodiments, a gate-first process may be used. Also, some embodiments contemplate aspects used in planar devices, such as planar FETs or in fin field-effect transistors (FinFETs).

FIGS. 2 through 20C are cross-sectional views of intermediate stages in the manufacturing of nano-FETs, in accordance with some embodiments. FIGS. 2 through 4, 5A, 6A, 13A, 14A, 15A, 17A, 18A, 18B, 19A, 20A, 21A, and 22A illustrate reference cross-section A-A' illustrated in FIG. 1. FIGS. 6B, 7B, 8B, 9B, 10B, 11B, 11C, 12B, 12D, 13B, 14B, 15B, 16B, 17B, 19B, 20B, 21B, and 22B illustrate reference cross-section B-B' illustrated in FIG. 1. FIGS. 7A, 8A, 9A, 10A, 11A, 12A, 12C, 13C, 20C, 21C, and 22C illustrate reference cross-section C-C' illustrated in FIG. 1. FIGS. 5B, 6C, 7C, 8C, 12E, 13D, 14C, 15C, 16A, 16B, 16C, 16D, 16E, 16F, 19C, 20D, 21D, and 22D illustrate reference cross-section D-D' illustrated in FIG. 1.

Figure 2:
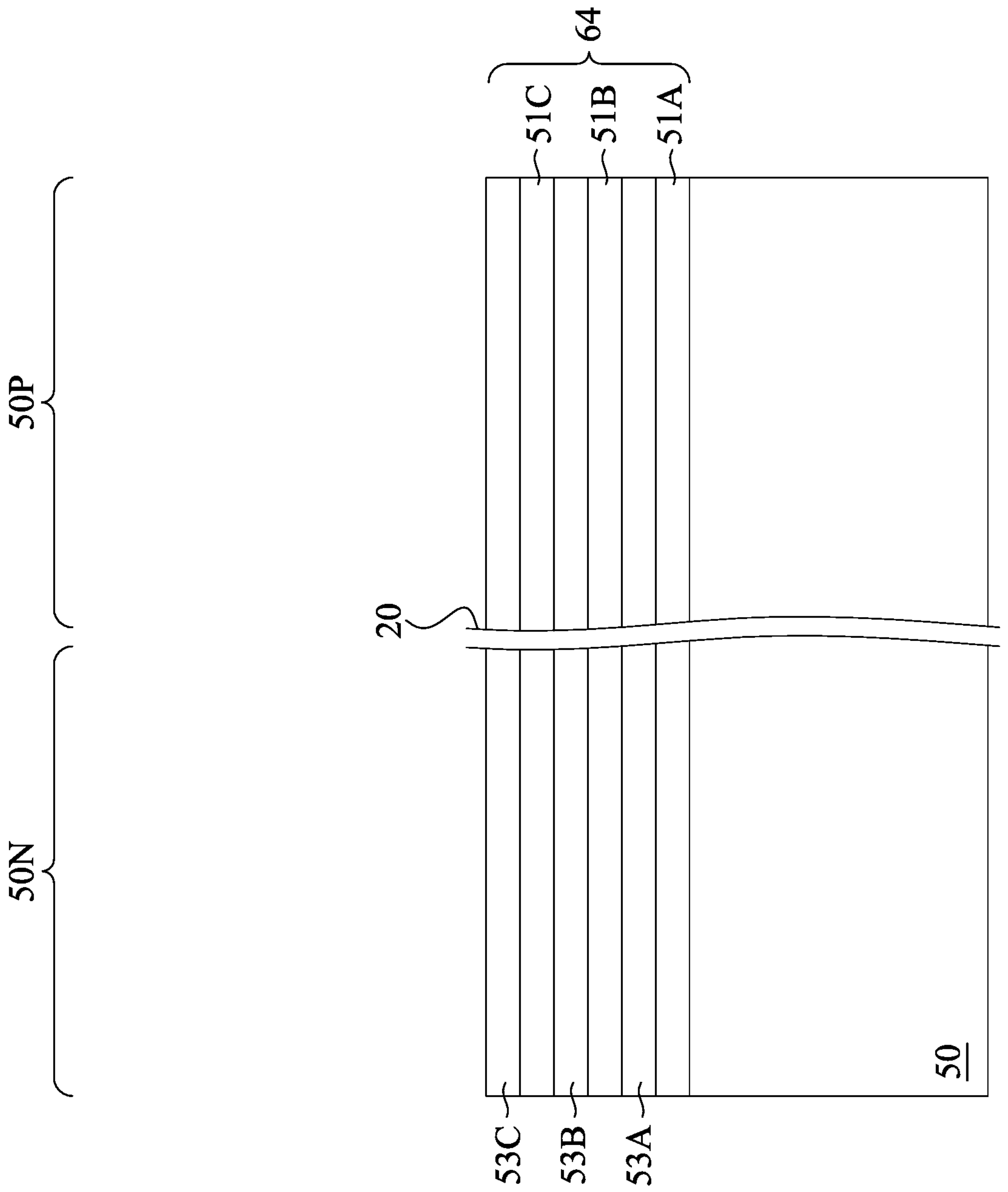
FIGS. 2, 3, 4, 5A, 5B, 6A, 6B, 6C, 7A, 7B, 7C, 8A, 8B, 8C, 9A, 9B, 10A, 10B, 11A, 11B, 11C, 12A, 12B, 12C, 12D, 12E, 13A, 13B, 13C, 13D, 14A, 14B, 14C, 15A, 15B, 15C, 16A, 16B, 16C, 16D, 16E, 16F, 17A, 17B, 18A, 18B, 19A, 19B, 19C, 20A, 20B, 20C, 20D, 21A, 21B, 21C, 21D, 22A, 22B, 22C, and 22D are cross-sectional views of intermediate stages in the manufacturing of nano-FETs, in accordance with some embodiments.

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has an n-type region 50N and a p-type region 50P. The n-type region 50N can be for forming n-type devices, such as NMOS transistors, e.g., n-type nano-FETs, and the p-type region 50P can be for forming p-type devices, such as PMOS transistors, e.g., p-type nano-FETs. The n-type region 50N may be physically separated from the p-type region 50P (as illustrated by divider 20), and any number of device features (e.g., other active devices, doped regions, isolation structures, etc.) may be disposed between the n-type region 50N and the p-type region 50P. Although one n-type region 50N and one p-type region 50P are illustrated, any number of n-type regions 50N and p-type regions 50P may be provided.

Further in FIG. 2, a multi-layer stack 64 is formed over the substrate 50. The multi-layer stack 64 includes alternating layers of first semiconductor layers 51A-C (collectively referred to as first semiconductor layers 51) and second semiconductor layers 53A-C (collectively referred to as second semiconductor layers 53). For purposes of illustration and as discussed in greater detail below, the second semiconductor layers 53 will be removed and the first semiconductor layers 51 will be patterned to form channel regions of nano-FETs in the p-type region 50P. Also, the first semiconductor layers 51 will be removed and the second semiconductor layers 53 will be patterned to form channel regions of nano-FETs in the n-type region 50N. Nevertheless, in some embodiments the first semiconductor layers 51 may be removed and the second semiconductor layers 53 may be patterned to form channel regions of nano-FETs in the n-type region 50N, and the second semiconductor layers 53 may be removed and the first semiconductor layers 51 may be patterned to form channel regions of nano-FETs in the p-type region 50P.

Figure 23A:
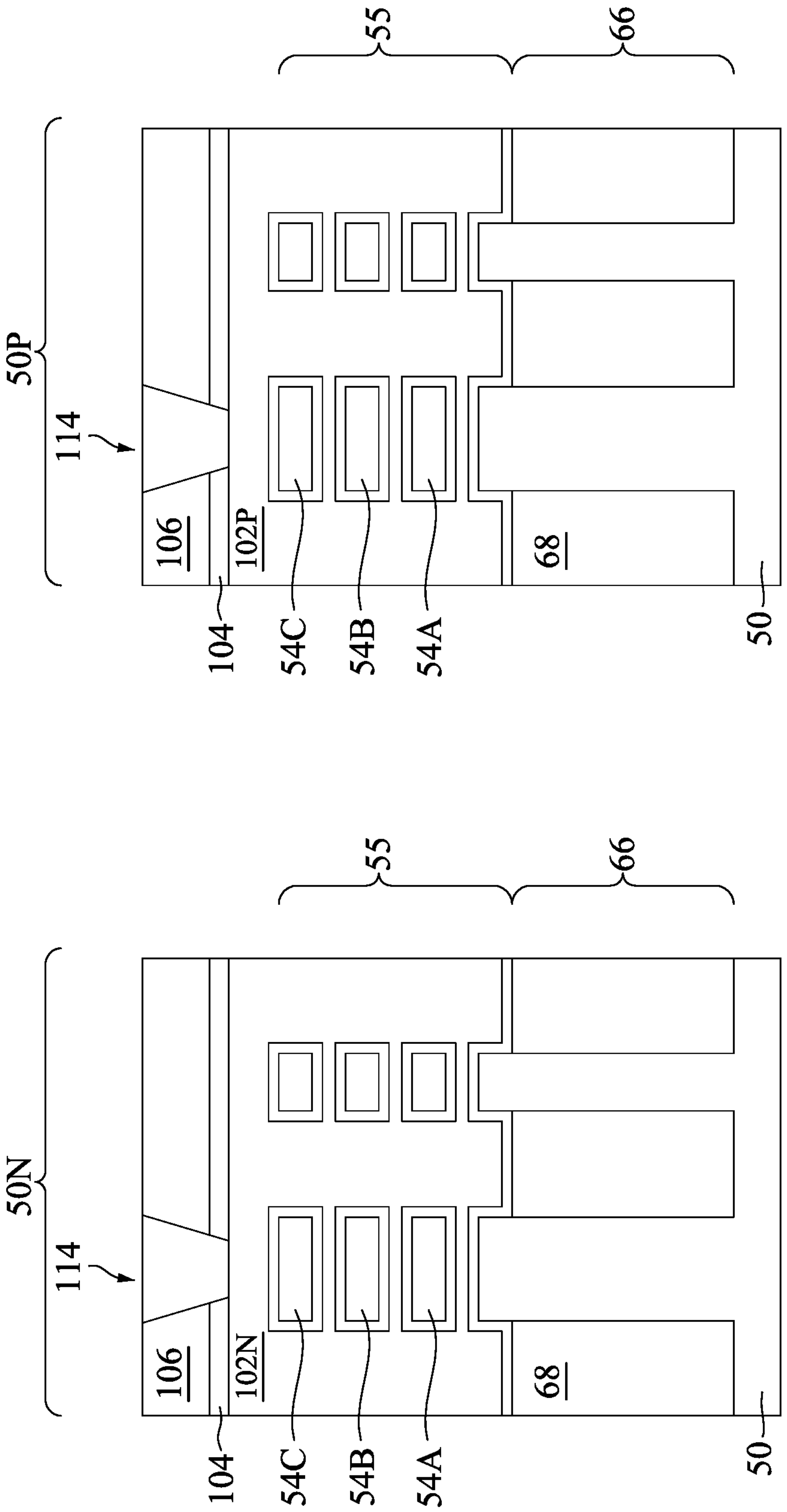
FIGS. 23A, 23B, 23C, and 23D are cross-sectional views of a nano-FET, in accordance with some embodiments.
Figure 23B:
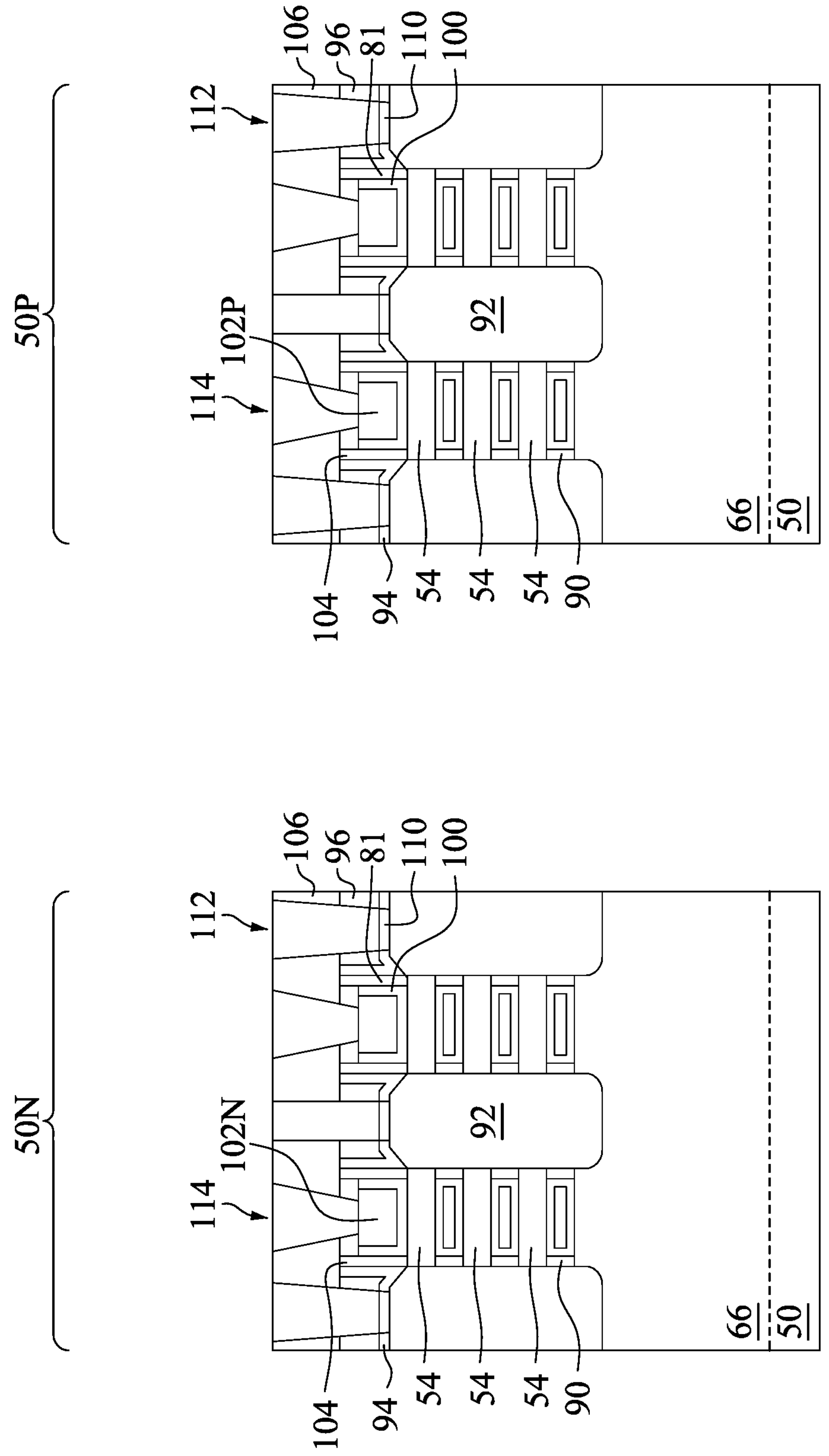

In still other embodiments, the first semiconductor layers 51 may be removed and the second semiconductor layers 53 may be patterned to form channel regions of nano-FETS in both the n-type region 50N and the p-type region 50P. In other embodiments, the second semiconductor layers 53 may be removed and the first semiconductor layers 51 may be patterned to form channel regions of nano-FETs in both the n-type region 50N and the p-type region 50P. In such embodiments, the channel regions in both the n-type region 50N and the p-type region 50P may have a same material composition (e.g., silicon, or the another semiconductor material) and be formed simultaneously. FIGS. 23A, 23B, and 23C illustrate a structure resulting from such embodiments where the channel regions in both the p-type region 50P and the n-type region 50N comprise silicon, for example.

The multi-layer stack 64 is illustrated as including three layers of each of the first semiconductor layers 51 and the second semiconductor layers 53 for illustrative purposes. In some embodiments, the multi-layer stack 64 may include any number of the first semiconductor layers 51 and the second semiconductor layers 53. Each of the layers of the multi-layer stack 64 may be epitaxially grown using a process such as chemical vapor deposition (CVD), atomic layer deposition (ALD), vapor phase epitaxy (VPE), molecular beam epitaxy (MBE), or the like. In various embodiments, the first semiconductor layers 51 may be formed of a first semiconductor material suitable for p-type nano-FETs, such as silicon germanium, or the like, and the second semiconductor layers 53 may be formed of a second semiconductor material suitable for n-type nano-FETs, such as silicon, silicon carbon, or the like. The multi-layer stack 64 is illustrated as having a bottommost semiconductor layer suitable for p-type nano-FETs for illustrative purposes. In some embodiments, multi-layer stack 64 may be formed such that the bottommost layer is a semiconductor layer suitable for n-type nano-FETs.

The first semiconductor materials and the second semiconductor materials may be materials having a high-etch selectivity to one another. As such, the first semiconductor layers 51 of the first semiconductor material may be removed without significantly removing the second semiconductor layers 53 of the second semiconductor material in the n-type region 50N, thereby allowing the second semiconductor layers 53 to be patterned to form channel regions of n-type nano-FETs. Similarly, the second semiconductor layers 53 of the second semiconductor material may be removed without significantly removing the first semiconductor layers 51 of the first semiconductor material in the p-type region 50P, thereby allowing the first semiconductor layers 51 to be patterned to form channel regions of p-type nano-FETs.

Figure 3:
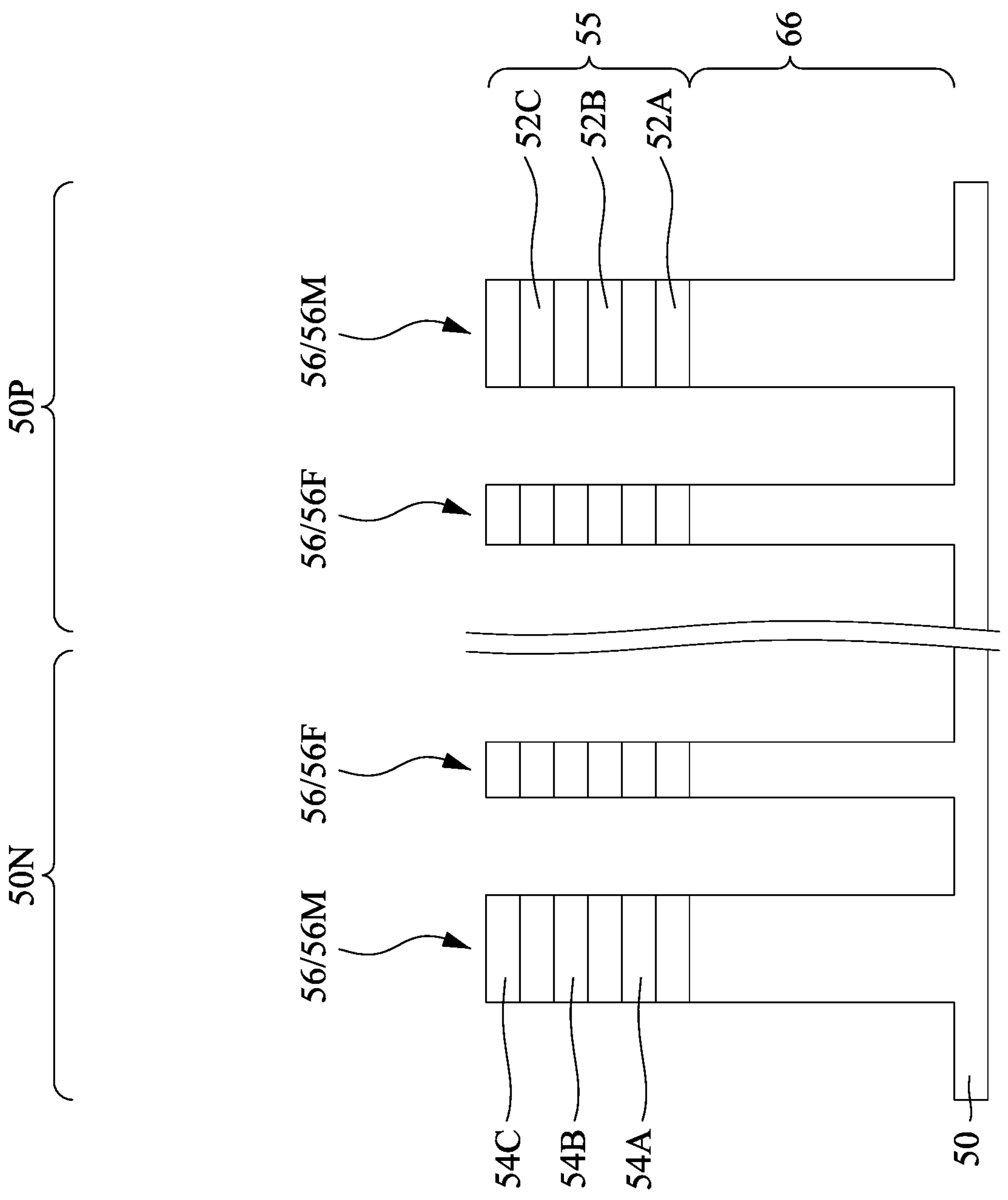

Referring now to FIG. 3, fins 66 are formed in the substrate 50 and nanostructures 55 are formed in the multi-layer stack 64, in accordance with some embodiments. In some embodiments, the nanostructures 55 and the fins 66 may be formed in the multi-layer stack 64 and the substrate 50, respectively, by etching trenches in the multi-layer stack 64 and the substrate 50. The etching may be any acceptable etch process, such as a reactive ion etch (RIE), neutral beam etch (NBE), the like, or a combination thereof. The etching may be anisotropic. Forming the nanostructures 55 by etching the multi-layer stack 64 may further define first nanostructures 52A-C (collectively referred to as the first nanostructures 52) from the first semiconductor layers 51 and define second nanostructures 54A-C (collectively referred to as the second nanostructures 54) from the second semiconductor layers 53. The first nanostructures 52 and the second nanostructures 54 may further be collectively referred to as nanostructures 55.

The fins 66 and the nanostructures 55 may be patterned by any suitable method. For example, the fins 66 and the nanostructures 55 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins 66.

The fins 66 and nanostructures 55 together may be referred to as a stacked semiconductor structure 56 or stacked fin, including a mesa fin 56M and the fin 56F. The mesa fin 56M is similar to the fin 56F, however, it is formed to be wider than the fin 56F. The mesa fin 56M can handle a larger power throughput due to its larger size. It should be noted that while each of the fins 66 and the nanostructures 55 are illustrated as having a consistent width throughout their heights, in other embodiments, the fins 66 and/or the nanostructures 55 may have tapered sidewalls such that a width of each of the fins 66 and/or the nanostructures 55 continuously increases in a direction towards the substrate 50. In such embodiments, each of the nanostructures 55 may have a different width and be trapezoidal in shape.

Figure 4:
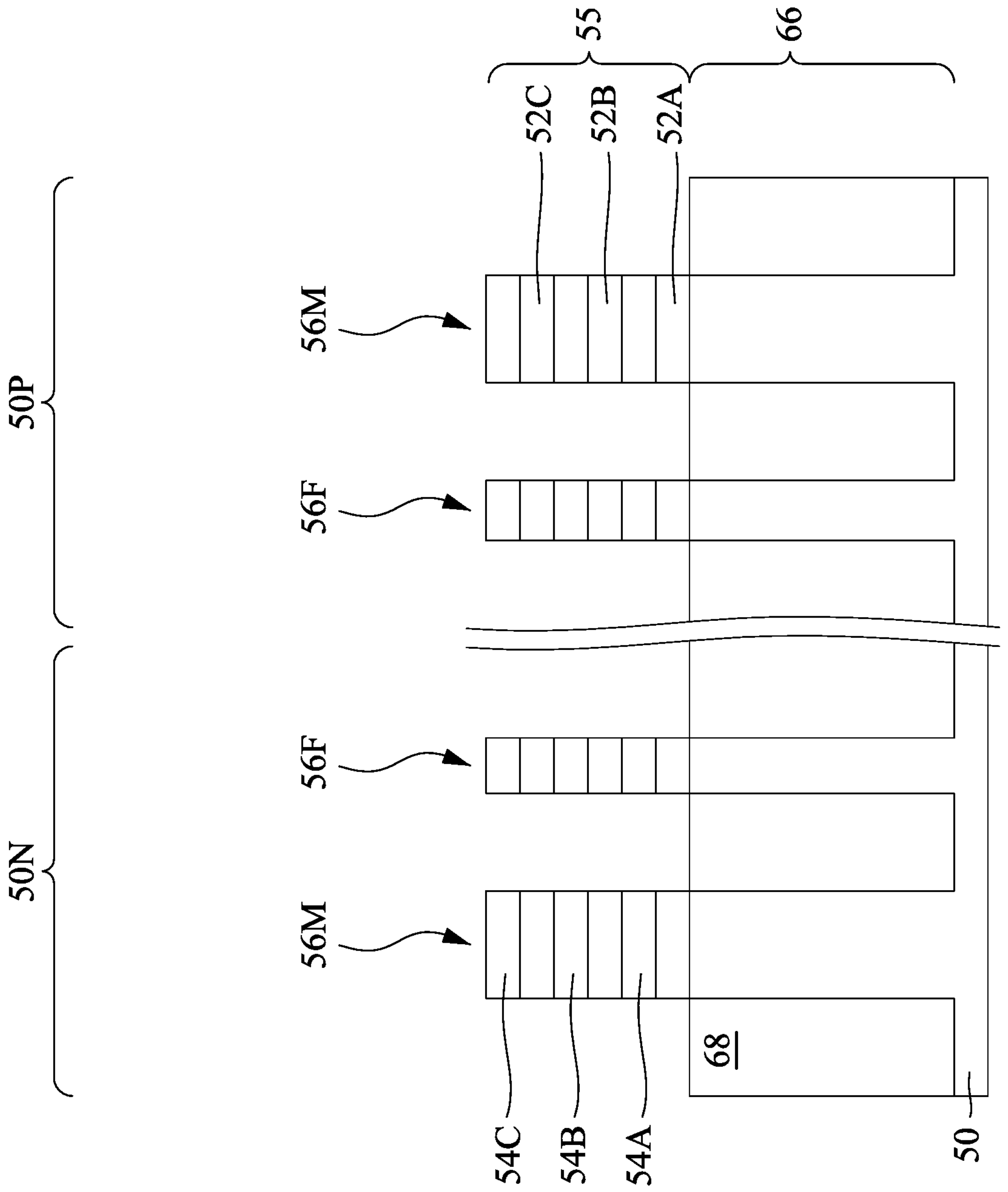

In FIG. 4, shallow trench isolation (STI) regions 68 are formed adjacent the fins 66. The STI regions 68 may be formed by depositing an insulation material over the substrate 50, the fins 66, and nanostructures 55, and between adjacent fins 66. The insulation material may be an oxide, such as silicon oxide, a nitride, the like, or a combination thereof, and may be formed by high-density plasma CVD (HDP-CVD), flowable CVD (FCVD), the like, or a combination thereof. Other insulation materials formed by any acceptable process may be used. In the illustrated embodiment, the insulation material is silicon oxide formed by an FCVD process. An anneal process may be performed once the insulation material is formed. In an embodiment, the insulation material is formed such that excess insulation material covers the nanostructures 55. Although the insulation material is illustrated as a single layer, some embodiments may utilize multiple layers. For example, in some embodiments a liner (not separately illustrated) may first be formed along a surface of the substrate 50, the fins 66, and the nanostructures 55. Thereafter, a fill material, such as those discussed above may be formed over the liner.

A removal process is then applied to the insulation material to remove excess insulation material over the nanostructures 55. In some embodiments, a planarization process such as a chemical mechanical polish (CMP), an etch-back process, combinations thereof, or the like may be utilized. The planarization process exposes the nanostructures 55 such that top surfaces of the nanostructures 55 and the insulation material are level after the planarization process is complete.

The insulation material is then recessed to form the STI regions 68. The insulation material is recessed such that upper portions of fins 66 in the n-type region 50N and the p-type region 50P protrude from between neighboring STI regions 68. Further, the top surfaces of the STI regions 68 may have a flat surface as illustrated, a convex surface, a concave surface (such as dishing), or a combination thereof. The top surfaces of the STI regions 68 may be formed flat, convex, and/or concave by an appropriate etch. The STI regions 68 may be recessed using an acceptable etching process, such as one that is selective to the material of the insulation material (e.g., etches the material of the insulation material at a faster rate than the material of the fins 66 and the nanostructures 55). For example, an oxide removal using, for example, dilute hydrofluoric (dHF) acid may be used.

The process described above with respect to FIGS. 2 through 4 is just one example of how the fins 66 and the nanostructures 55 may be formed. In some embodiments, the fins 66 and/or the nanostructures 55 may be formed using a mask and an epitaxial growth process. For example, a dielectric layer can be formed over a top surface of the substrate 50, and trenches can be etched through the dielectric layer to expose the underlying substrate 50. Epitaxial structures can be epitaxially grown in the trenches, and the dielectric layer can be recessed such that the epitaxial structures protrude from the dielectric layer to form the fins 66 and/or the nanostructures 55. The epitaxial structures may comprise the alternating semiconductor materials discussed above, such as the first semiconductor materials and the second semiconductor materials. In some embodiments where epitaxial structures are epitaxially grown, the epitaxially grown materials may be in situ doped during growth, which may obviate prior and/or subsequent implantations, although in situ and implantation doping may be used together.

Additionally, the first semiconductor layers 51 (and resulting nanostructures 52) and the second semiconductor layers 53 (and resulting nanostructures 54) are illustrated and discussed herein as comprising the same materials in the p-type region 50P and the n-type region 50N for illustrative purposes only. As such, in some embodiments one or both of the first semiconductor layers 51 and the second semiconductor layers 53 may be different materials or formed in a different order in the p-type region 50P and the n-type region 50N.

Further in FIG. 4, appropriate wells (not separately illustrated) may be formed in the fins 66, the nanostructures 55, and/or the STI regions 68. In embodiments with different well types, different implant steps for the n-type region 50N and the p-type region 50P may be achieved using a photoresist or other masks (not separately illustrated). For example, a photoresist may be formed over the fins 66 and the STI regions 68 in the n-type region 50N and the p-type region 50P. The photoresist is patterned to expose the p-type region 50P. The photoresist can be formed by using a spin-on technique and can be patterned using acceptable photolithography techniques. Once the photoresist is patterned, an n-type impurity implant is performed in the p-type region 50P, and the photoresist may act as a mask to substantially prevent n-type impurities from being implanted into the n-type region 50N. The n-type impurities may be phosphorus, arsenic, antimony, or the like implanted in the region to a concentration in a range from about $10^{13}$ atoms/$cm^3$ to about $10^{14}$ atoms/$cm^3$. After the implant, the photoresist is removed, such as by an acceptable ashing process.

Following or prior to the implanting of the p-type region 50P, a photoresist or other masks (not separately illustrated) is formed over the fins 66, the nanostructures 55, and the STI regions 68 in the p-type region 50P and the n-type region 50N. The photoresist is patterned to expose the n-type region 50N. The photoresist can be formed by using a spin-on technique and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P. The p-type impurities may be boron, boron fluoride, indium, or the like implanted in the region to a concentration in a range from about $10^{13}$ atoms/$cm^3$ to about $10^{14}$ atoms/$cm^3$. After the implant, the photoresist may be removed, such as by an acceptable ashing process.

After the implants of the n-type region 50N and the p-type region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 5A:
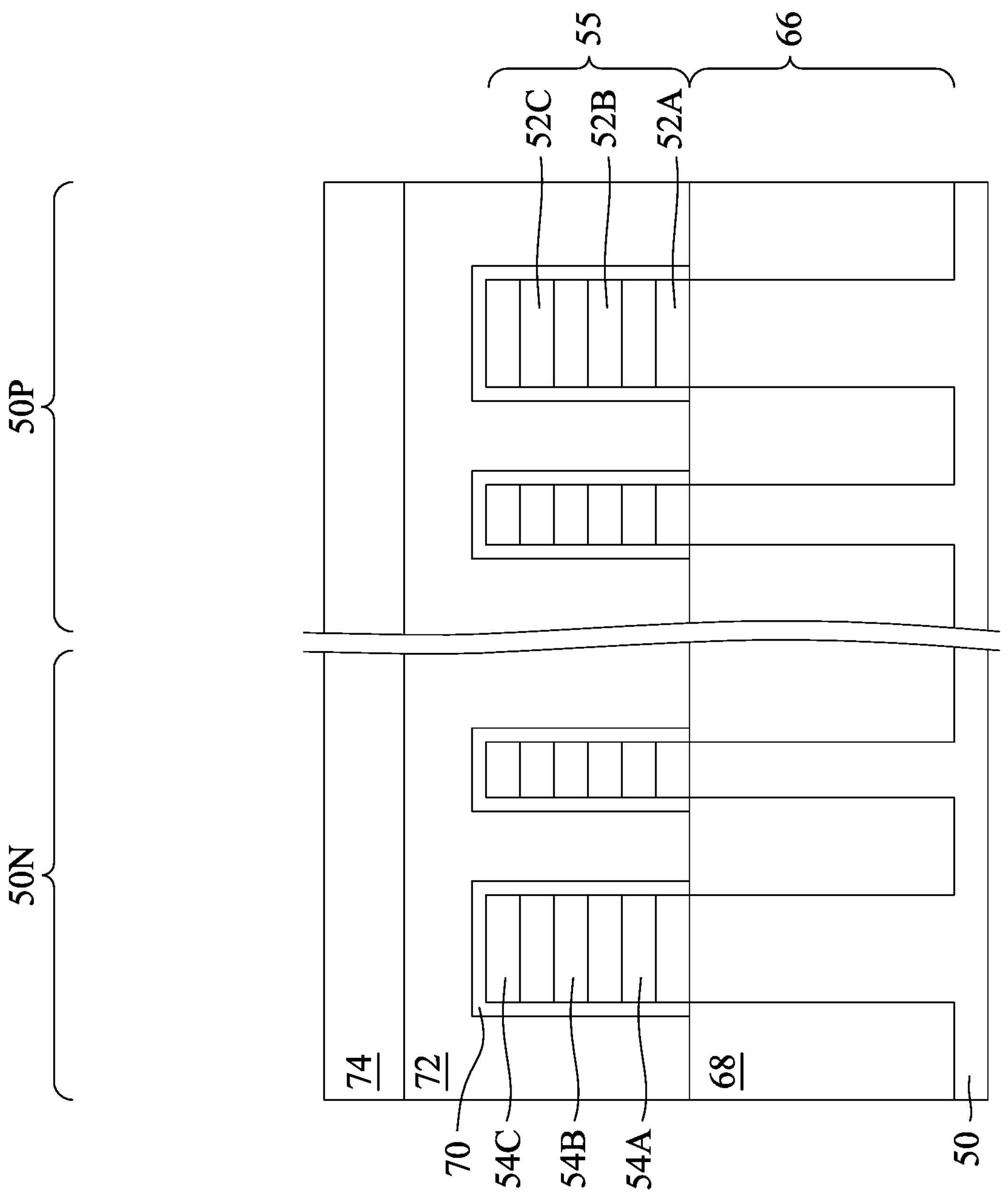
Figure 5B:
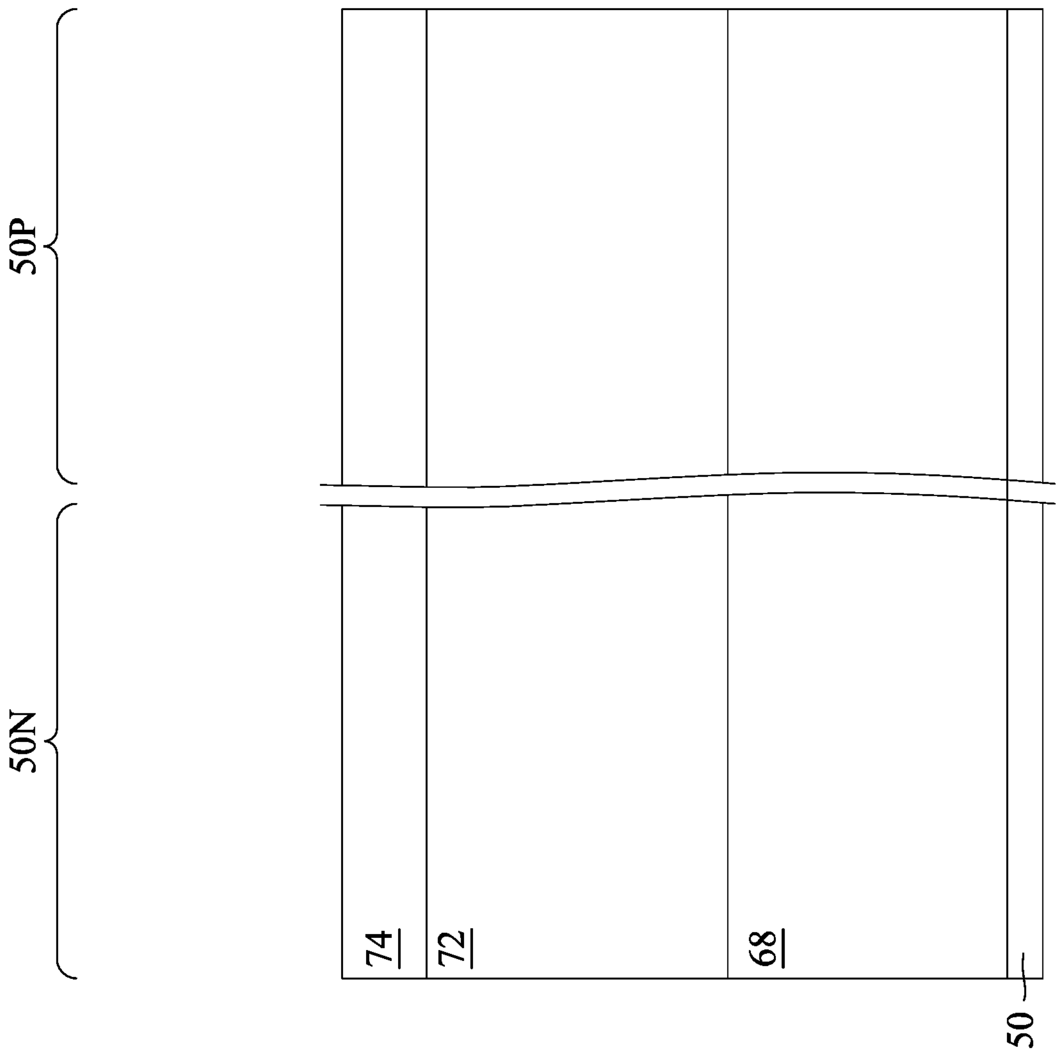

In FIGS. 5A and 5B, a dummy dielectric layer 70 is formed on the fins 66 and/or the nanostructures 55. The dummy dielectric layer 70 may be, for example, silicon oxide, silicon nitride, a combination thereof, or the like, and may be deposited or thermally grown according to acceptable techniques. A dummy gate layer 72 is formed over the dummy dielectric layer 70, and a mask layer 74 is formed over the dummy gate layer 72. The dummy gate layer 72 may be deposited over the dummy dielectric layer 70 and then planarized, such as by a CMP. The mask layer 74 may be deposited over the dummy gate layer 72. The dummy gate layer 72 may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 72 may be deposited by physical vapor deposition (PVD), CVD, sputter deposition, or other techniques for depositing the selected material. The dummy gate layer 72 may be made of other materials that have a high etching selectivity from the etching of isolation regions. The mask layer 74 may include, for example, silicon nitride, silicon oxynitride, or the like. In this example, a single dummy gate layer 72 and a single mask layer 74 are formed across the n-type region 50N and the p-type region 50P. It is noted that the dummy dielectric layer 70 is shown covering only the fins 66 and the nanostructures 55 for illustrative purposes only. In some embodiments, the dummy dielectric layer 70 may be deposited such that the dummy dielectric layer 70 covers the STI regions 68, such that the dummy dielectric layer 70 extends between the dummy gate layer 72 and the STI regions 68.

Figure 6A:
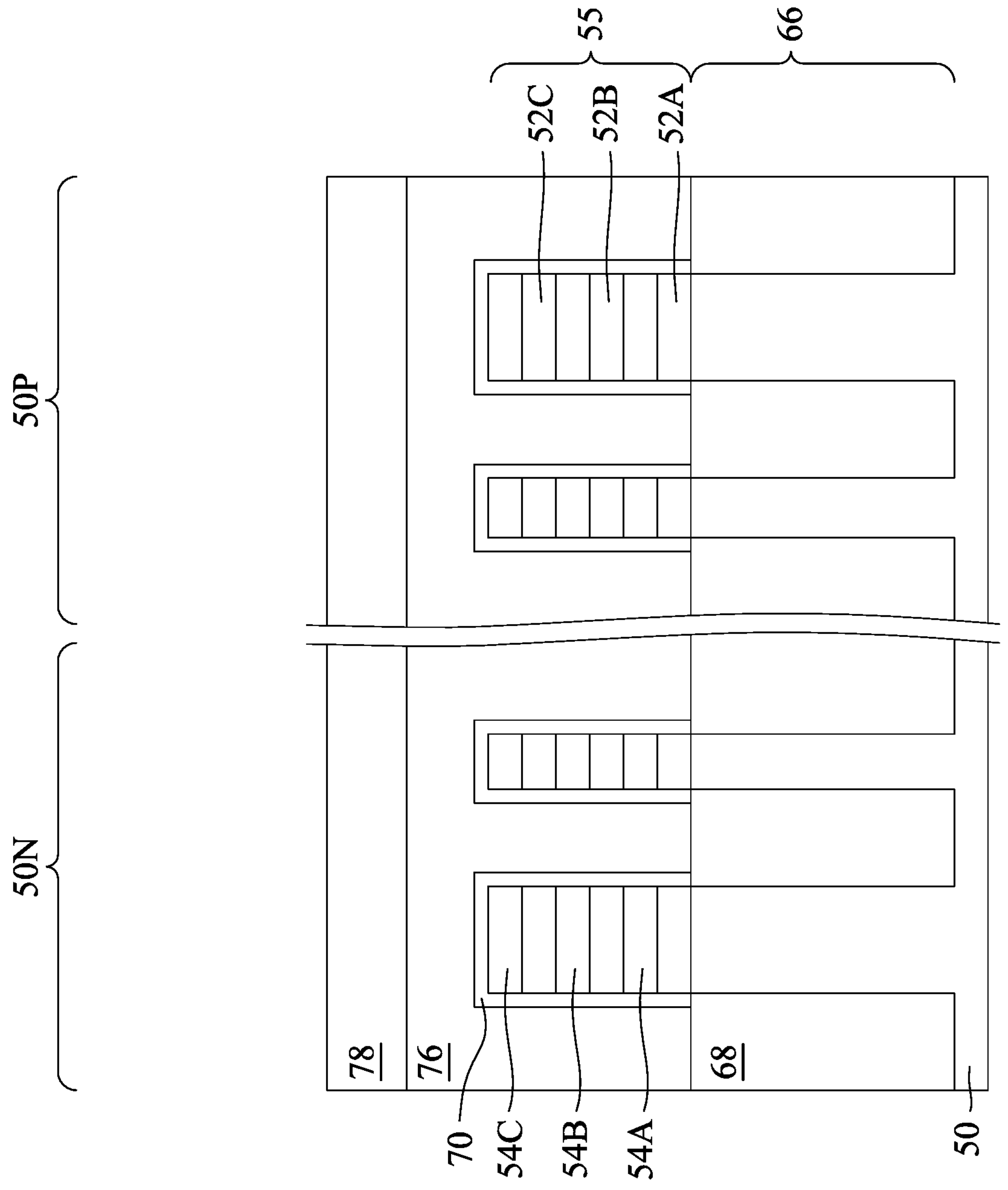
Figure 6B:
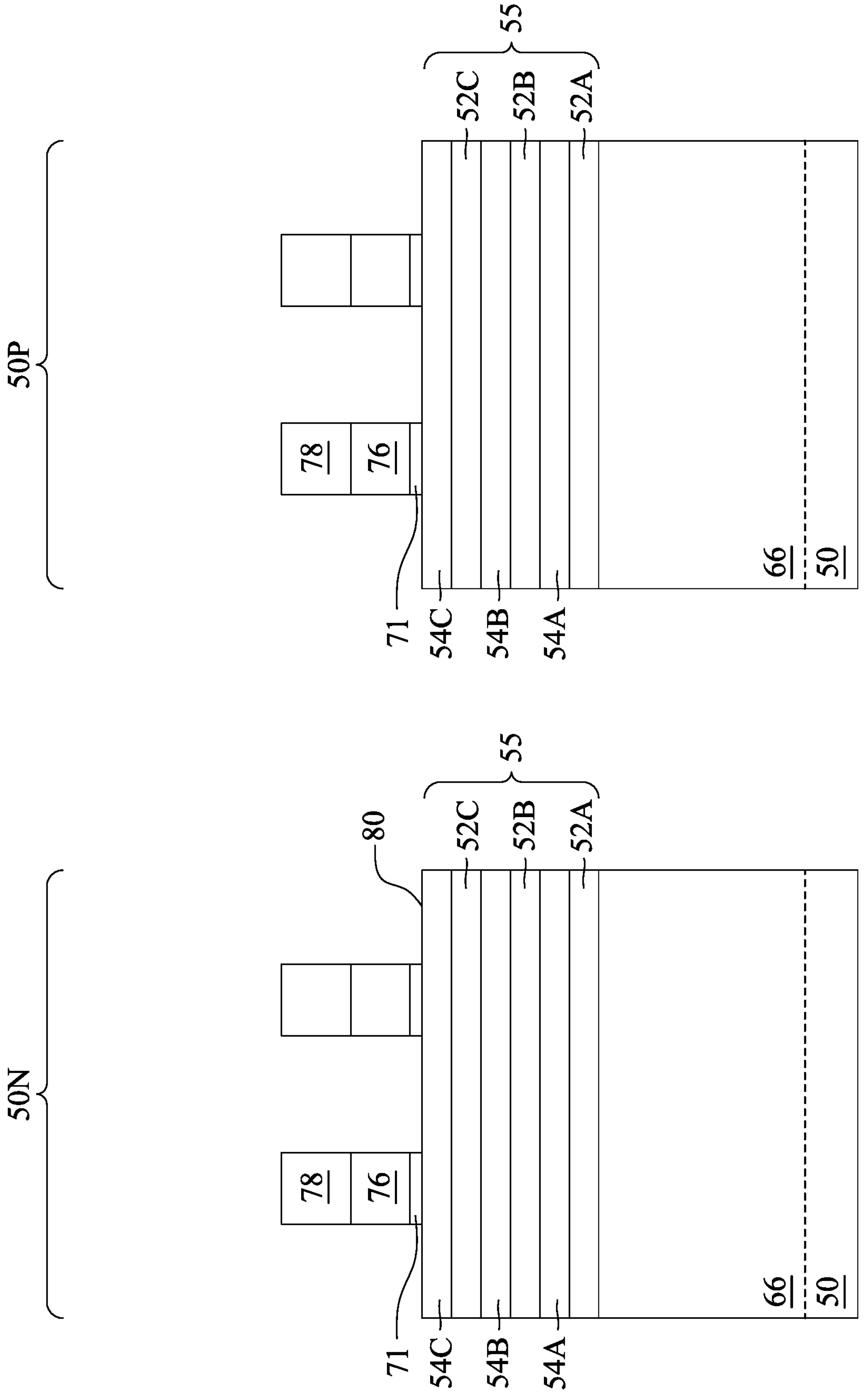
Figure 6C:
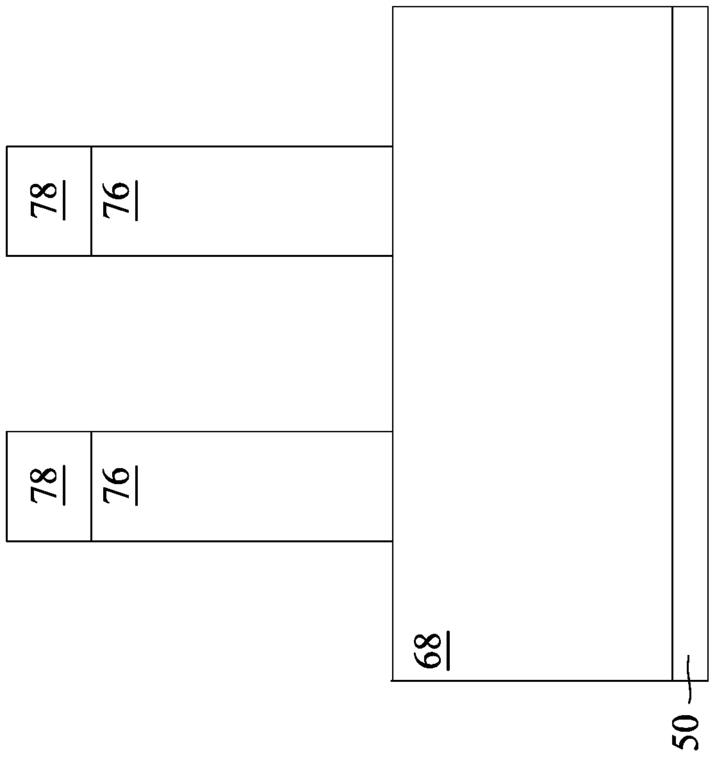

FIGS. 6A through 18C illustrate various additional steps in the manufacturing of embodiment devices. FIGS. 6C, 7A, 7C, 8A, 8C, 9A, 10A, 11A, 12A, 12C, 12E, 13A, 13C, 13D, 14A, 14C, 15A, 15C, 16A, 16B, 16C, 16D, 16E, 16F, 19C, 20C, 20D, 21C, 21D, 22C, and 22D illustrate features in either the regions 50N or the regions 50P. In FIGS. 6A, 6B, and 6C the mask layer 74 (see FIGS. 5A and 5B) may be patterned using acceptable photolithography and etching techniques to form masks 78. The pattern of the masks 78 then may be transferred to the dummy gate layer 72 and to the dummy dielectric layer 70 to form dummy gates 76 and dummy gate dielectrics 71, respectively. The dummy gates 76 cover respective channel regions of the fins 66. The pattern of the masks 78 may be used to physically separate each of the dummy gates 76 from adjacent dummy gates 76. The dummy gates 76 may also have a lengthwise direction substantially perpendicular to the lengthwise direction of respective fins 66.

Figure 7A:
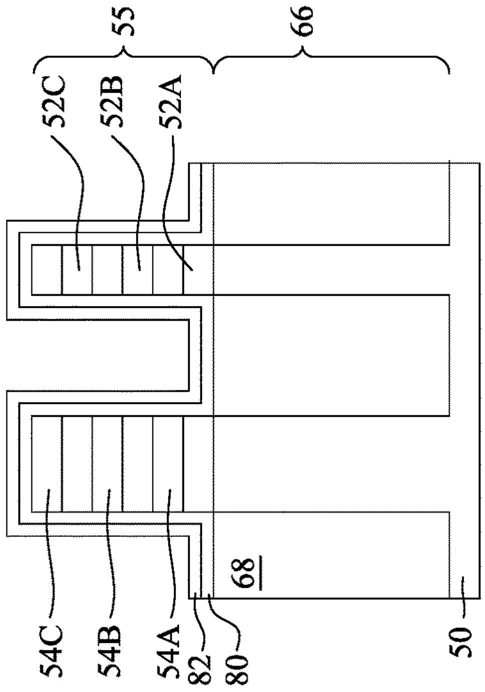
Figure 7B:
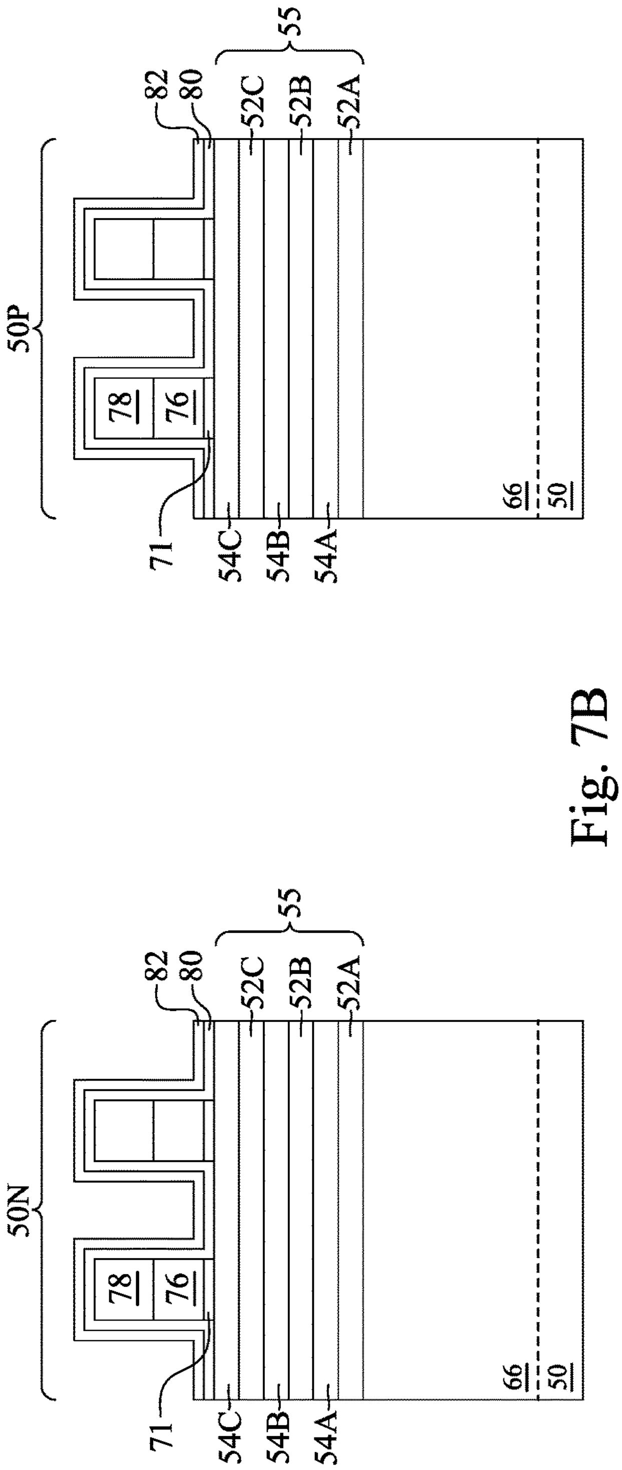
Figure 7C:
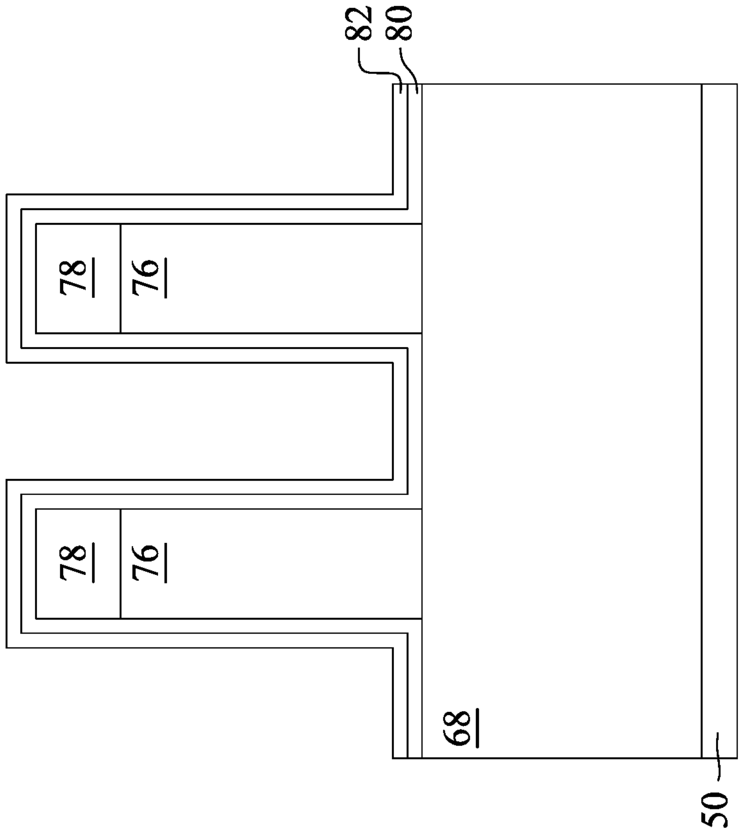

In FIGS. 7A, 7B, and 7C, a first spacer layer 80 and a second spacer layer 82 are formed over the structures illustrated in FIGS. 6A, 6B, and 6C, respectively. The first spacer layer 80 and the second spacer layer 82 will be subsequently patterned to act as spacers for forming self-aligned source/drain regions. In FIGS. 7A, 7B, and 7C, the first spacer layer 80 is formed on top surfaces of the STI regions 68; top surfaces and sidewalls of the fins 66, the nanostructures 55, and the masks 78; and sidewalls of the dummy gates 76 and the dummy gate dielectric 71. The second spacer layer 82 is deposited over the first spacer layer 80. The first spacer layer 80 may be formed of silicon oxide, silicon nitride, silicon oxynitride, or the like, using techniques such as thermal oxidation or deposited by CVD, ALD, or the like. The second spacer layer 82 may be formed of a material having a different etch rate than the material of the first spacer layer 80, such as silicon oxide, silicon nitride, silicon oxynitride, or the like, and may be deposited by CVD, ALD, or the like.

After the first spacer layer 80 is formed and prior to forming the second spacer layer 82, implants for lightly doped source/drain (LDD) regions (not separately illustrated) may be performed. In embodiments with different device types, similar to the implants discussed above in FIG. 4, a mask, such as a photoresist, may be formed over the n-type region 50N, while exposing the p-type region 50P, and appropriate type (e.g., p-type) impurities may be implanted into the exposed fins 66 and nanostructures 55 in the p-type region 50P. The mask may then be removed. Subsequently, a mask, such as a photoresist, may be formed over the p-type region 50P while exposing the n-type region 50N, and appropriate type impurities (e.g., n-type) may be implanted into the exposed fins 66 and nanostructures 55 in the n-type region 50N. The mask may then be removed. The n-type impurities may be the any of the n-type impurities previously discussed, and the p-type impurities may be the any of the p-type impurities previously discussed. The lightly doped source/drain regions may have a concentration of impurities in a range from about $1\times10^{15}$ atoms/$cm^3$ to about $1\times10^{19}$ atoms/$cm^3$. An anneal may be used to repair implant damage and to activate the implanted impurities.

Figure 8A:
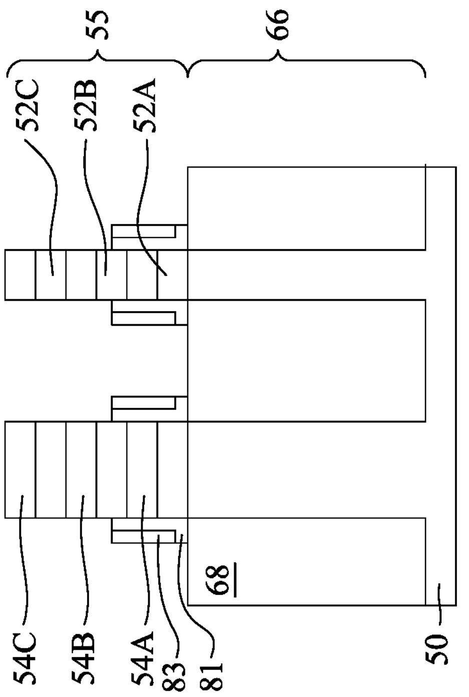
Figure 8B:
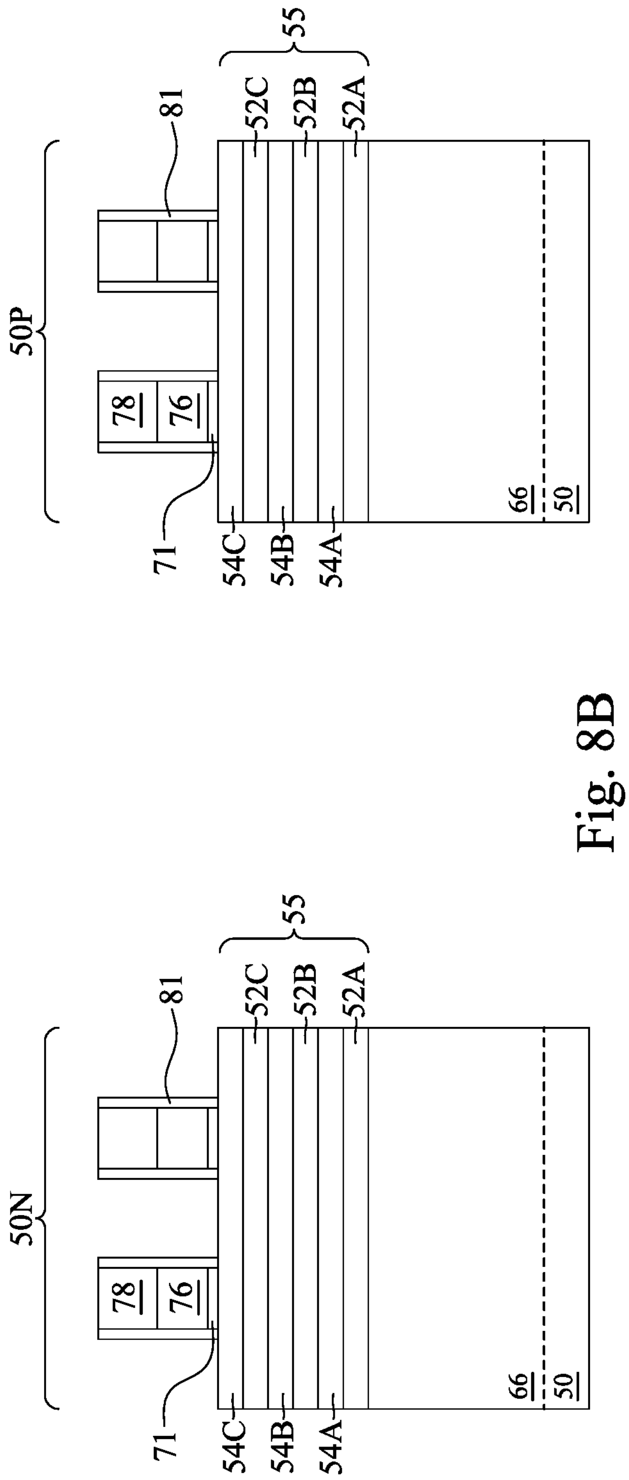
Figure 8C:
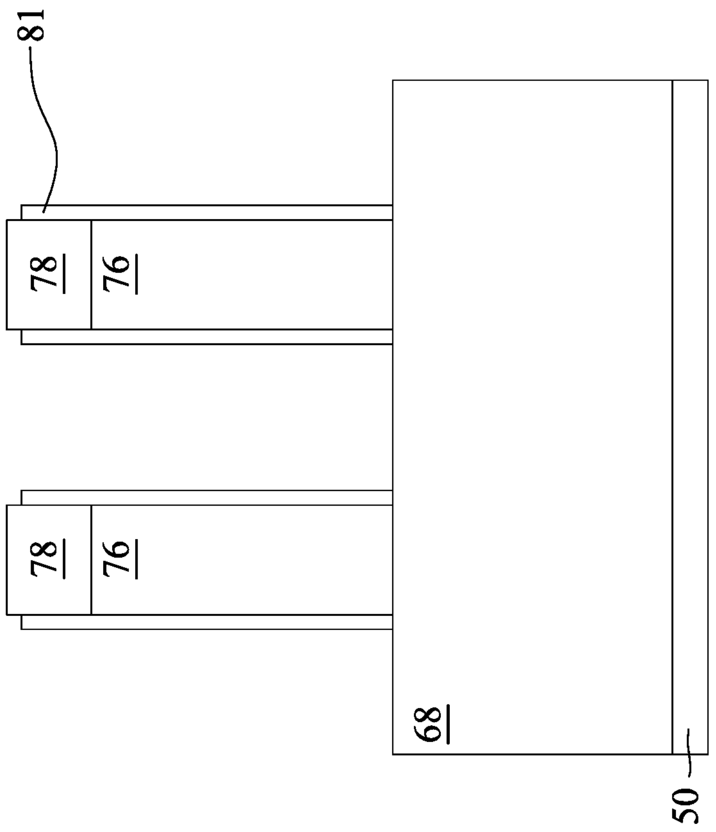

In FIGS. 8A, 8B, and 8C, the first spacer layer 80 and the second spacer layer 82 are etched to form first spacers 81 and second spacers 83. As will be discussed in greater detail below, the first spacers 81 and the second spacers 83 act to self-aligned subsequently formed source drain regions, as well as to protect sidewalls of the fins 66 and/or nanostructure 55 during subsequent processing. The first spacer layer 80 and the second spacer layer 82 may be etched using a suitable etching process, such as an isotropic etching process (e.g., a wet etching process), an anisotropic etching process (e.g., a dry etching process), or the like. In some embodiments, the material of the second spacer layer 82 has a different etch rate than the material of the first spacer layer 80, such that the first spacer layer 80 may act as an etch stop layer when patterning the second spacer layer 82 and such that the second spacer layer 82 may act as a mask when patterning the first spacer layer 80. For example, the second spacer layer 82 may be etched using an anisotropic etch process wherein the first spacer layer 80 acts as an etch stop layer, wherein remaining portions of the second spacer layer 82 form second spacers 83 as illustrated in FIG. 8A. Thereafter, the second spacers 83 acts as a mask while etching exposed portions of the first spacer layer 80, thereby forming first spacers 81 as illustrated in FIG. 8A.

As illustrated in FIG. 8A, the first spacers 81 and the second spacers 83 are disposed on sidewalls of the fins 66 and/or nanostructures 55. As illustrated in FIGS. 8B and 8C, in some embodiments, the second spacer layer 82 may be removed from over the first spacer layer 80 adjacent the masks 78, the dummy gates 76, and the dummy gate dielectrics 71, and the first spacers 81 are disposed on sidewalls of the masks 78, the dummy gates 76, and the dummy dielectric layers 60. In other embodiments, a portion of the second spacer layer 82 may remain over the first spacer layer 80 adjacent the masks 78, the dummy gates 76, and the dummy gate dielectrics 71.

It is noted that the above disclosure generally describes a process of forming spacers and LDD regions. Other processes and sequences may be used. For example, fewer or additional spacers may be utilized, different sequence of steps may be utilized (e.g., the first spacers 81 may be patterned prior to depositing the second spacer layer 82), additional spacers may be formed and removed, and/or the like. Furthermore, the n-type and p-type devices may be formed using different structures and steps.

Figure 9A:
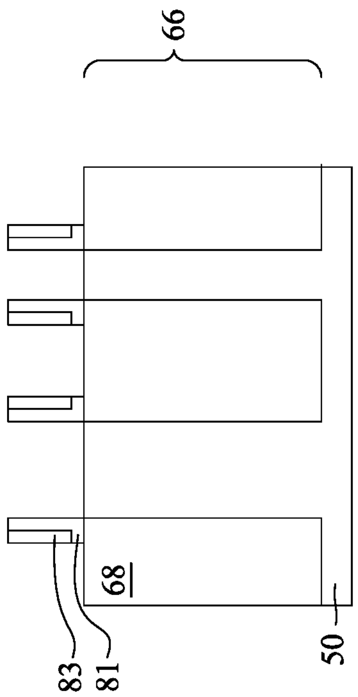
Figure 9B:
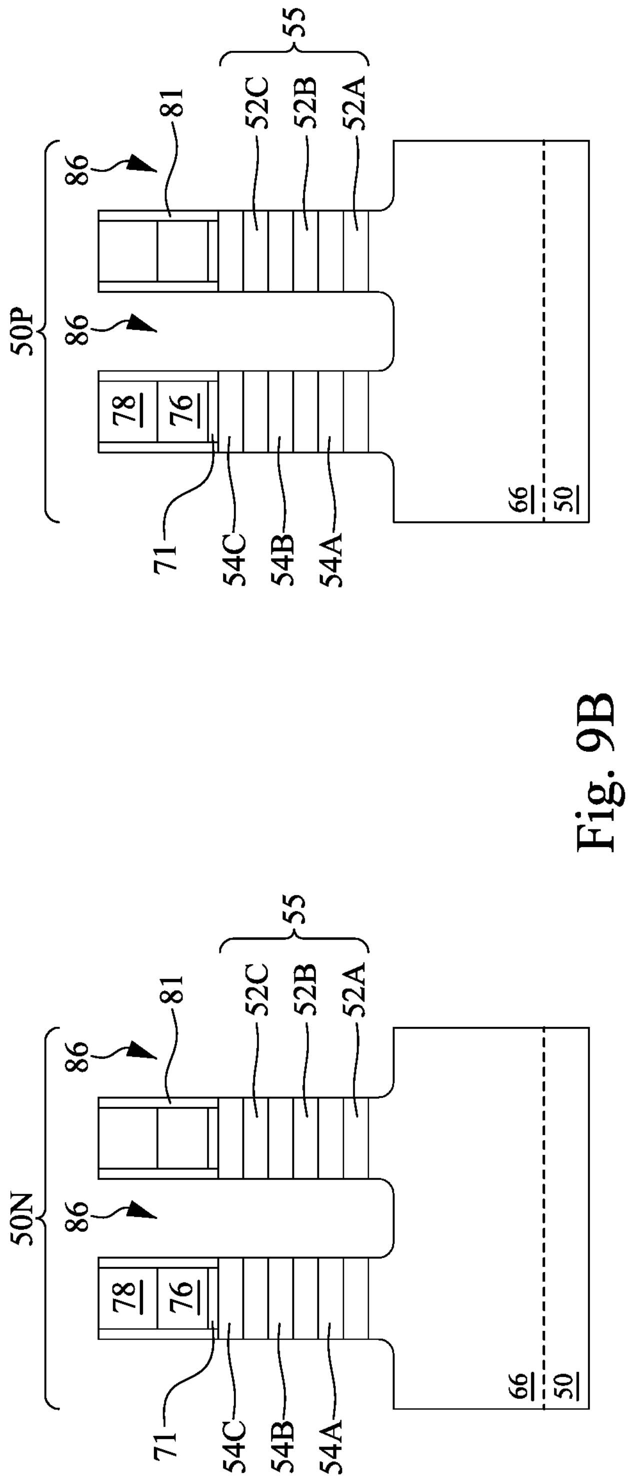

In FIGS. 9A and 9B, first recesses 86 are formed in the fins 66, the nanostructures 55, and the substrate 50, in accordance with some embodiments. Epitaxial source/drain regions will be subsequently formed in the first recesses 86. The first recesses 86 may extend through the first nanostructures 52 and the second nanostructures 54, and into the substrate 50. As illustrated in FIG. 9A, top surfaces of the STI regions 68 may be level with bottom surfaces of the first recesses 86. In various embodiments, the fins 66 may be etched such that bottom surfaces of the first recesses 86 are disposed below the top surfaces of the STI regions 68; or the like. The first recesses 86 may be formed by etching the fins 66, the nanostructures 55, and the substrate 50 using anisotropic etching processes, such as RIE, NBE, or the like. The first spacers 81, the second spacers 83, and the masks 78 mask portions of the fins 66, the nanostructures 55, and the substrate 50 during the etching processes used to form the first recesses 86. A single etch process or multiple etch processes may be used to etch each layer of the nanostructures 55 and/or the fins 66. Timed etch processes may be used to stop the etching of the first recesses 86 after the first recesses 86 reach a desired depth.

Figure 10A:
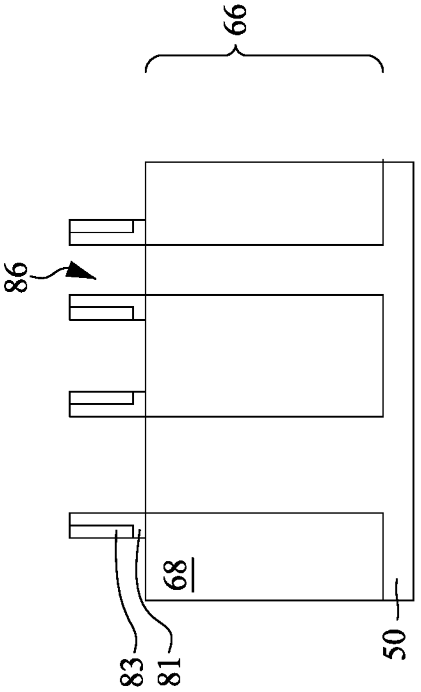
Figure 10B:
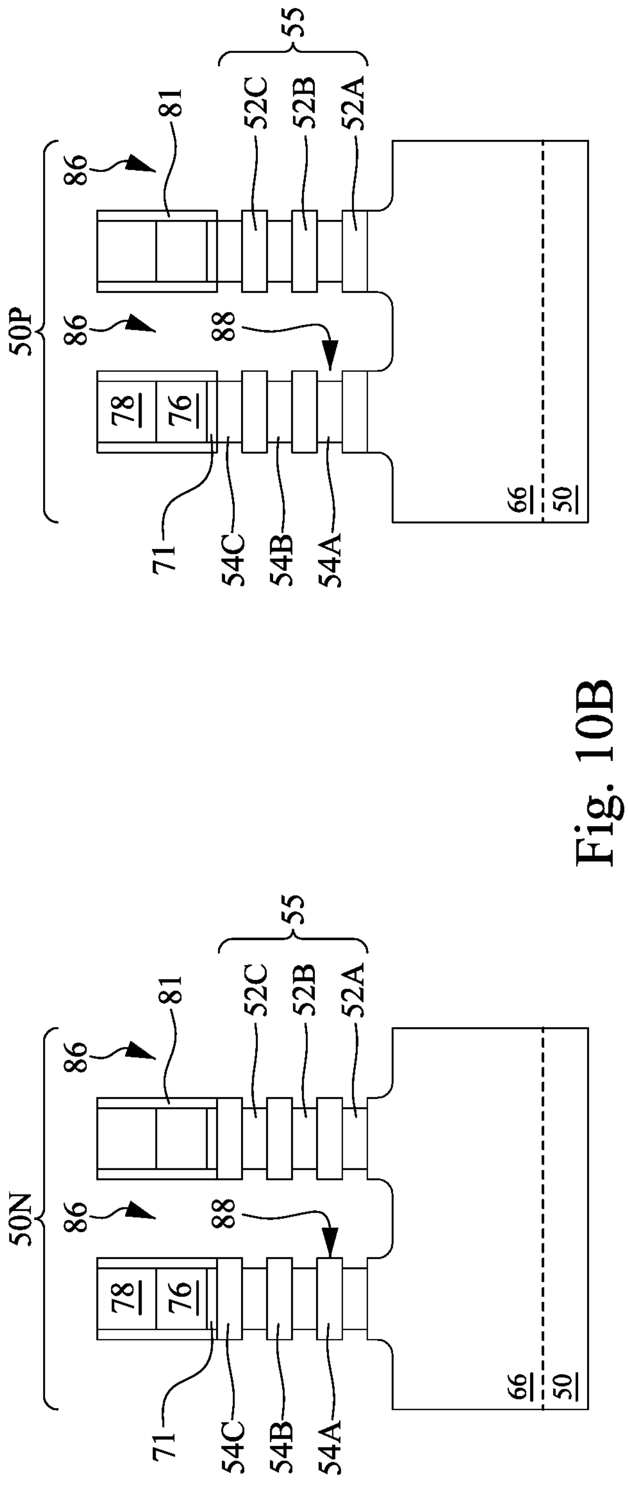

In FIGS. 10A and 10B, portions of sidewalls of the layers of the multi-layer stack 64 formed of the first semiconductor materials (e.g., the first nanostructures 52) exposed by the first recesses 86 are etched to form sidewall recesses 88 in the n-type region 50N, and portions of sidewalls of the layers of the multi-layer stack 64 formed of the second semiconductor materials (e.g., the second nanostructures 54) exposed by the first recesses 86 are etched to form sidewall recesses 88 in the p-type region 50P. Although sidewalls of the first nanostructures 52 and the second nanostructures 54 in sidewall recesses 88 are illustrated as being straight in FIG. 10B, the sidewalls may be concave or convex. The sidewalls may be etched using isotropic etching processes, such as wet etching or the like. The p-type region 50P may be protected using a mask (not shown) while etchants selective to the first semiconductor materials are used to etch the first nanostructures 52 such that the second nanostructures 54 and the substrate 50 remain relatively unetched as compared to the first nanostructures 52 in the n-type region 50N. Similarly, the n-type region 50N may be protected using a mask (not shown) while etchants selective to the second semiconductor materials are used to etch the second nanostructures 54 such that the first nanostructures 52 and the substrate 50 remain relatively unetched as compared to the second nanostructures 54 in the p-type region 50P. In an embodiment in which the first nanostructures 52 include, e.g., SiGe, and the second nanostructures 54 include, e.g., Si or SiC, a dry etch process with tetramethylammonium hydroxide (TMAH), ammonium hydroxide ($NH_4OH$), or the like may be used to etch sidewalls of the first nanostructures 52 in the n-type region 50N, and a wet or dry etch process with hydrogen fluoride, another fluorine-based etchant, or the like may be used to etch sidewalls of the second nanostructures 54 in the p-type region 50P.

Figure 11A:
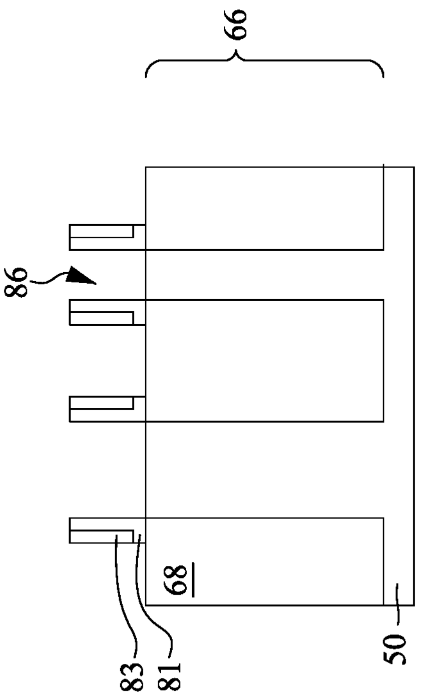
Figure 11B:
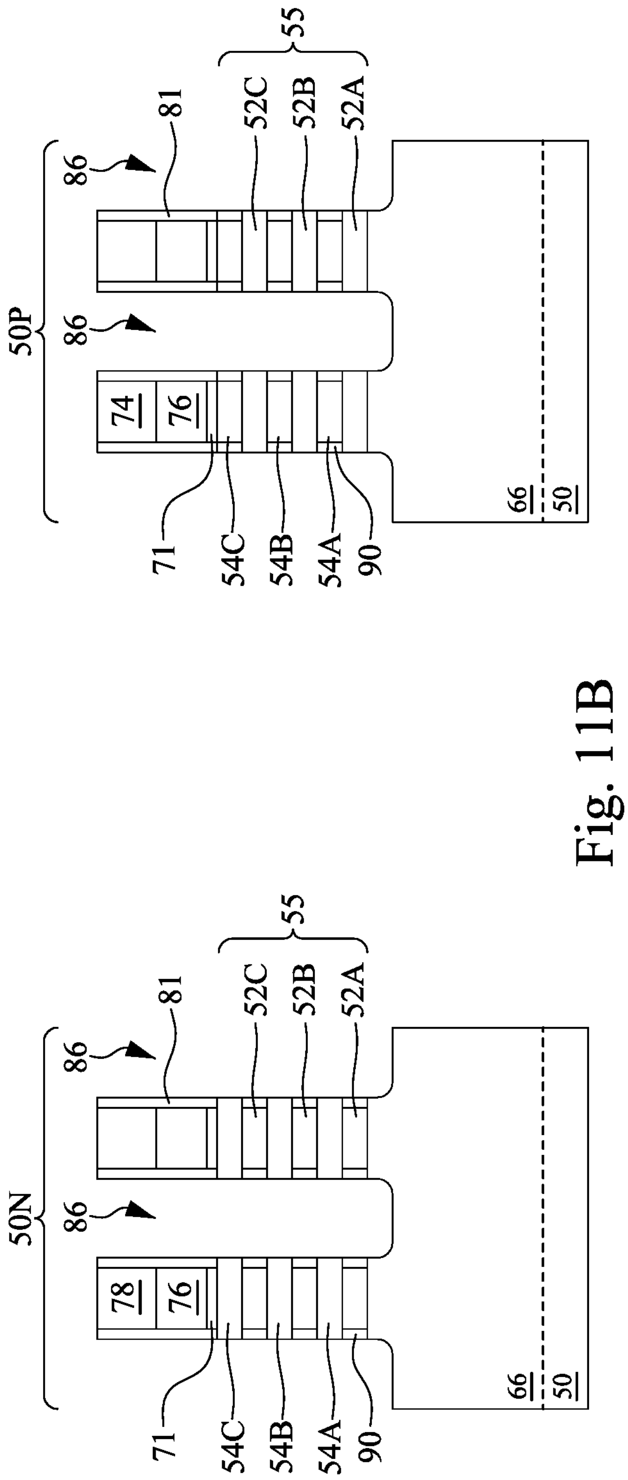
Figure 11C:
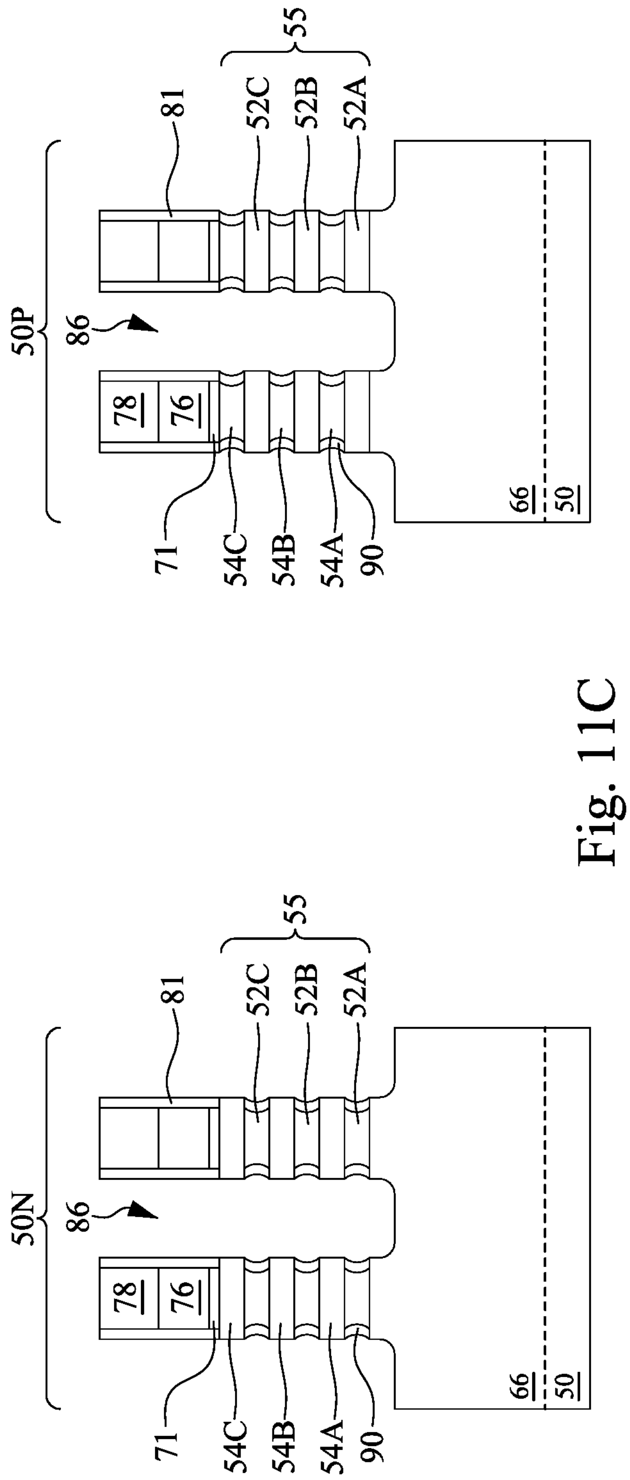

In FIGS. 11A-11C, first inner spacers 90 are formed in the sidewall recess 88. The first inner spacers 90 may be formed by depositing an inner spacer layer (not separately illustrated) over the structures illustrated in FIGS. 10A and 10B. The first inner spacers 90 act as isolation features between subsequently formed source/drain regions and a gate structure. As will be discussed in greater detail below, source/drain regions will be formed in the first recesses 86, while the first nanostructures 52 in the n-type region 50N and the second nanostructures 54 in the p-type region 50P will be replaced with corresponding gate structures.

The inner spacer layer may be deposited by a conformal deposition process, such as CVD, ALD, or the like. The inner spacer layer may comprise a material such as silicon nitride or silicon oxynitride, although any suitable material, such as low-dielectric constant (low-k) materials having a k-value less than about 3.5, may be utilized. The inner spacer layer may then be anisotropically etched to form the first inner spacers 90. Although outer sidewalls of the first inner spacers 90 are illustrated as being flush with sidewalls of the second nanostructures 54 in the n-type region 50N and flush with the sidewalls of the first nanostructures 52 in the p-type region 50P, the outer sidewalls of the first inner spacers 90 may extend beyond or be recessed from sidewalls of the second nanostructures 54 and/or the first nanostructures 52, respectively.

Moreover, although the outer sidewalls of the first inner spacers 90 are illustrated as being straight in FIG. 11B, the outer sidewalls of the first inner spacers 90 may be concave or convex. As an example, FIG. 11C illustrates an embodiment in which sidewalls of the first nanostructures 52 are concave, outer sidewalls of the first inner spacers 90 are concave, and the first inner spacers 90 are recessed from sidewalls of the second nanostructures 54 in the n-type region 50N. Also illustrated are embodiments in which sidewalls of the second nanostructures 54 are concave, outer sidewalls of the first inner spacers 90 are concave, and the first inner spacers 90 are recessed from sidewalls of the first nanostructures 52 in the p-type region 50P. The inner spacer layer may be etched by an anisotropic etching process, such as RIE, NBE, or the like. The first inner spacers 90 may be used to prevent damage to subsequently formed source/drain regions (such as the epitaxial source/drain regions 92, discussed below with respect to FIGS. 12A-12E) by subsequent etching processes, such as etching processes used to form gate structures.

Figure 12A:
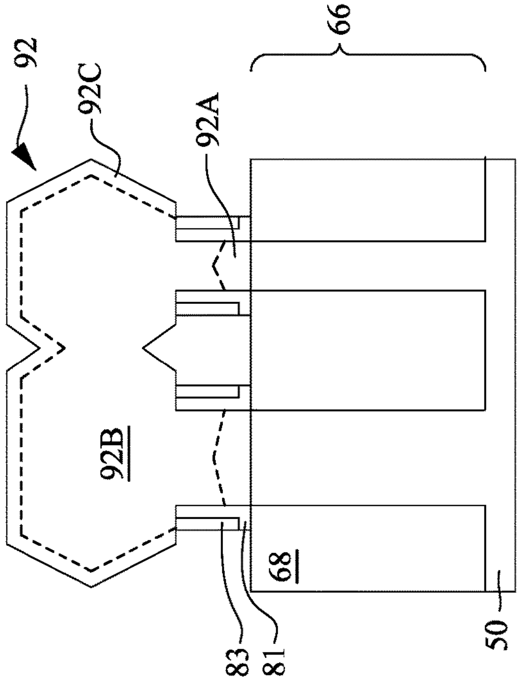
Figure 12B:
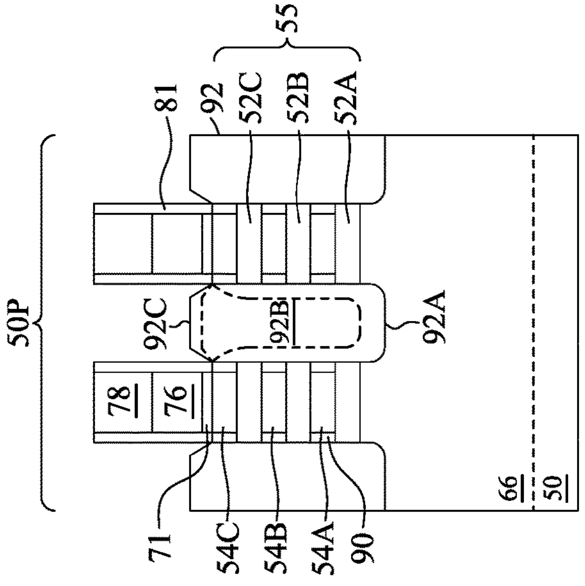
Figure 12B:
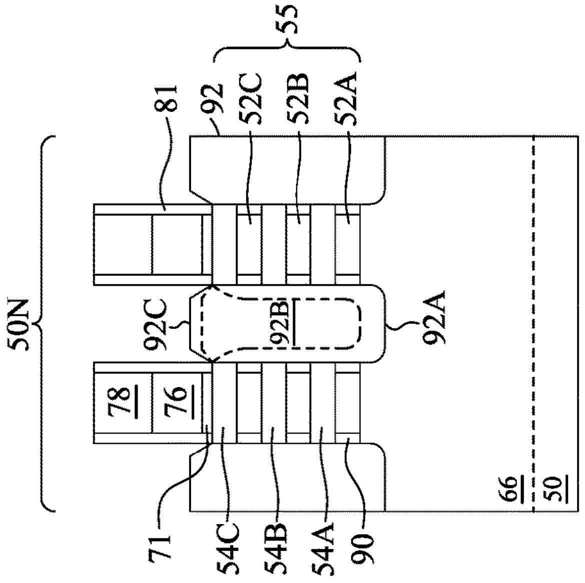

In FIGS. 12A-12E, epitaxial source/drain regions 92 are formed in the first recesses 86. In some embodiments, the source/drain regions 92 may exert stress on the second nanostructures 54 in the n-type region 50N and on the first nanostructures 52 in the p-type region 50P, thereby improving performance. As illustrated in FIG. 12B, the epitaxial source/drain regions 92 are formed in the first recesses 86 such that each dummy gate 76 is disposed between respective neighboring pairs of the epitaxial source/drain regions 92. In some embodiments, the first spacers 81 are used to separate the epitaxial source/drain regions 92 from the dummy gates 76 and the first inner spacers 90 are used to separate the epitaxial source/drain regions 92 from the nanostructures 55 by an appropriate lateral distance so that the epitaxial source/drain regions 92 do not short out with subsequently formed gates of the resulting nano-FETs.

The epitaxial source/drain regions 92 in the n-type region 50N, e.g., the NMOS region, may be formed by masking the p-type region 50P, e.g., the PMOS region. Then, the epitaxial source/drain regions 92 are epitaxially grown in the first recesses 86 in the n-type region 50N. The epitaxial source/drain regions 92 may include any acceptable material appropriate for n-type nano-FETs. For example, if the second nanostructures 54 are silicon, the epitaxial source/drain regions 92 may include materials exerting a tensile strain on the second nanostructures 54, such as silicon, silicon carbide, phosphorous doped silicon carbide, silicon phosphide, or the like. The epitaxial source/drain regions 92 may have surfaces raised from respective upper surfaces of the nanostructures 55 and may have facets.

The epitaxial source/drain regions 92 in the p-type region 50P, e.g., the PMOS region, may be formed by masking the n-type region 50N, e.g., the NMOS region. Then, the epitaxial source/drain regions 92 are epitaxially grown in the first recesses 86 in the p-type region 50P. The epitaxial source/drain regions 92 may include any acceptable material appropriate for p-type nano-FETs. For example, if the first nanostructures 52 are silicon germanium, the epitaxial source/drain regions 92 may comprise materials exerting a compressive strain on the first nanostructures 52, such as silicon-germanium, boron doped silicon-germanium, germanium, germanium tin, or the like. The epitaxial source/drain regions 92 may also have surfaces raised from respective surfaces of the multi-layer stack 64 and may have facets.

The epitaxial source/drain regions 92, the first nanostructures 52, the second nanostructures 54, and/or the substrate 50 may be implanted with dopants to form source/drain regions, similar to the process previously discussed for forming lightly-doped source/drain regions, followed by an anneal. The source/drain regions may have an impurity concentration of between about $1\times10^{19}$ atoms/cm$^3$ and about $1\times10^{21}$ atoms/cm$^3$. The n-type and/or p-type impurities for source/drain regions may be any of the impurities previously discussed. In some embodiments, the epitaxial source/drain regions 92 may be in situ doped during growth.

Figure 12C:
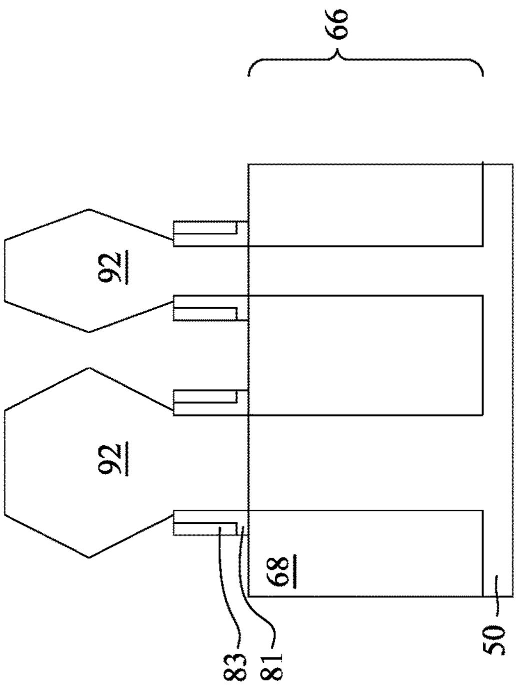

As a result of the epitaxy processes used to form the epitaxial source/drain regions 92 in the n-type region 50N and the p-type region 50P, upper surfaces of the epitaxial source/drain regions 92 have facets which expand laterally outward beyond sidewalls of the nanostructures 55. In some embodiments, these facets cause adjacent epitaxial source/drain regions 92 of a same nano-FET to merge as illustrated by FIG. 12A. In other embodiments, adjacent epitaxial source/drain regions 92 remain separated after the epitaxy process is completed as illustrated by FIG. 12C. In the embodiments illustrated in FIGS. 12A and 12C, the first spacers 81 may be formed to a top surface of the STI regions 68 thereby blocking the epitaxial growth. In some other embodiments, the first spacers 81 may cover portions of the sidewalls of the nanostructures 55 further blocking the epitaxial growth. In some other embodiments, the spacer etch used to form the first spacers 81 may be adjusted to remove the spacer material to allow the epitaxially grown region to extend to the surface of the STI region 68.

The epitaxial source/drain regions 92 may comprise one or more semiconductor material layers. For example, the epitaxial source/drain regions 92 may comprise a first semiconductor material layer 92A, a second semiconductor material layer 92B, and a third semiconductor material layer 92C. Any number of semiconductor material layers may be used for the epitaxial source/drain regions 92. Each of the first semiconductor material layer 92A, the second semiconductor material layer 92B, and the third semiconductor material layer 92C may be formed of different semiconductor materials and may be doped to different dopant concentrations. In some embodiments, the first semiconductor material layer 92A may have a dopant concentration less than the second semiconductor material layer 92B and greater than the third semiconductor material layer 92C. In embodiments in which the epitaxial source/drain regions 92 comprise three semiconductor material layers, the first semiconductor material layer 92A may be deposited, the second semiconductor material layer 92B may be deposited over the first semiconductor material layer 92A, and the third semiconductor material layer 92C may be deposited over the second semiconductor material layer 92B.

Figure 12D:
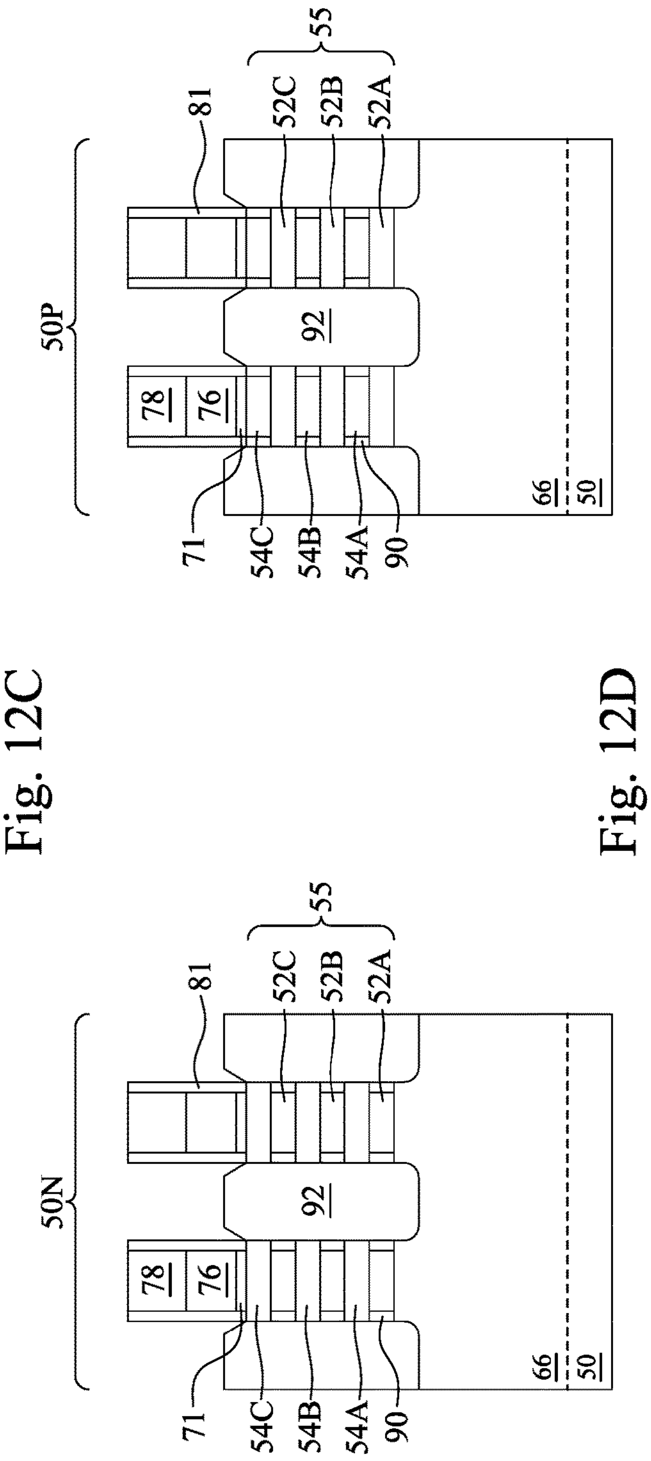

FIG. 12D illustrates an embodiment in which sidewalls of the first nanostructures 52 in the n-type region 50N and sidewalls of the second nanostructures 54 in the p-type region 50P are concave, outer sidewalls of the first inner spacers 90 are concave, and the first inner spacers 90 are recessed from sidewalls of the second nanostructures 54 and the first nanostructures 52, respectively. As illustrated in FIG. 12D, the epitaxial source/drain regions 92 may be formed in contact with the first inner spacers 90 and may extend past sidewalls of the second nanostructures 54 in the n-type region 50N and past sidewalls of the first nanostructures 52 in the p-type region 50P.

Figure 12E:
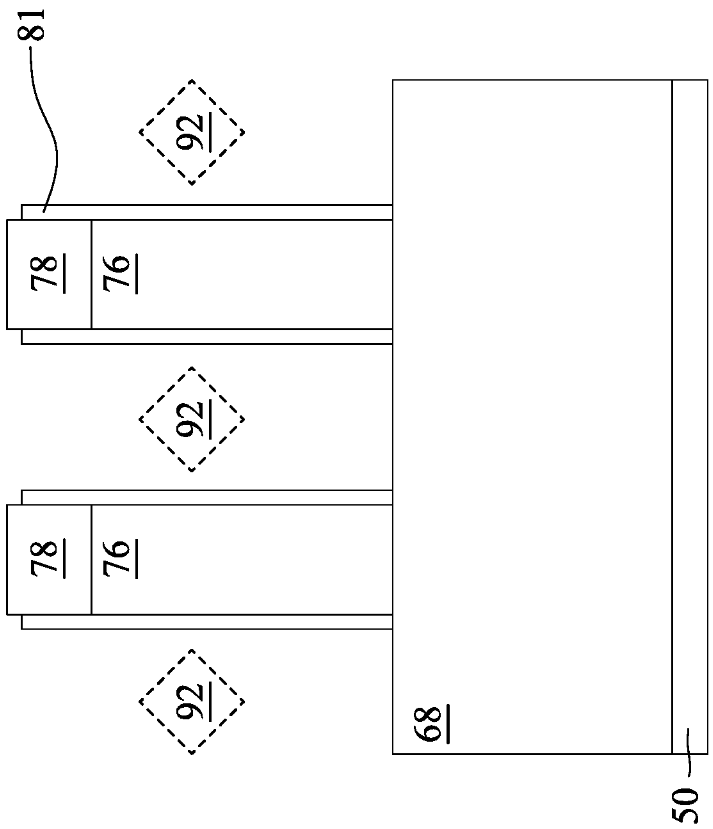
Figure 13A:
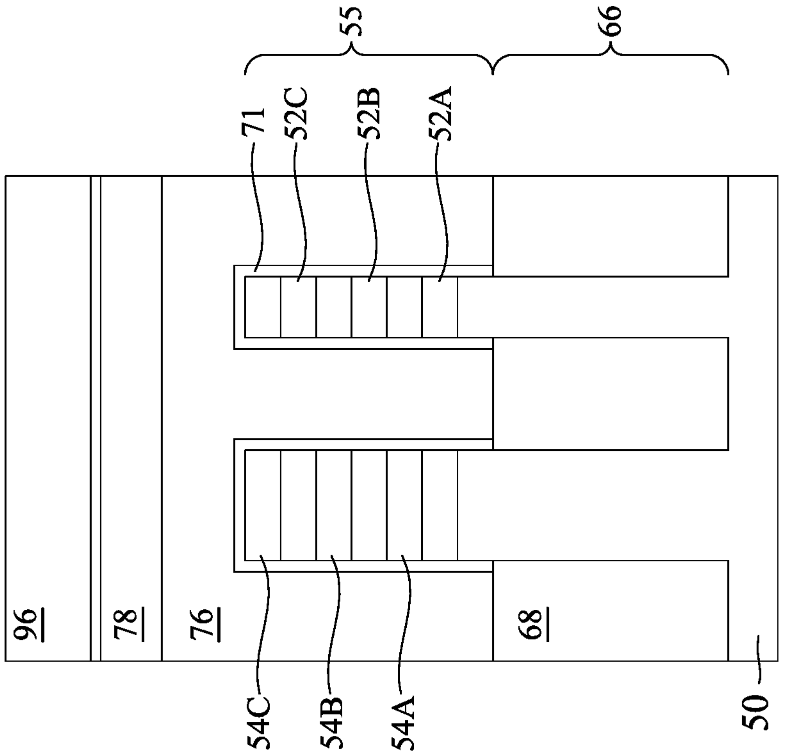
Figure 13B:
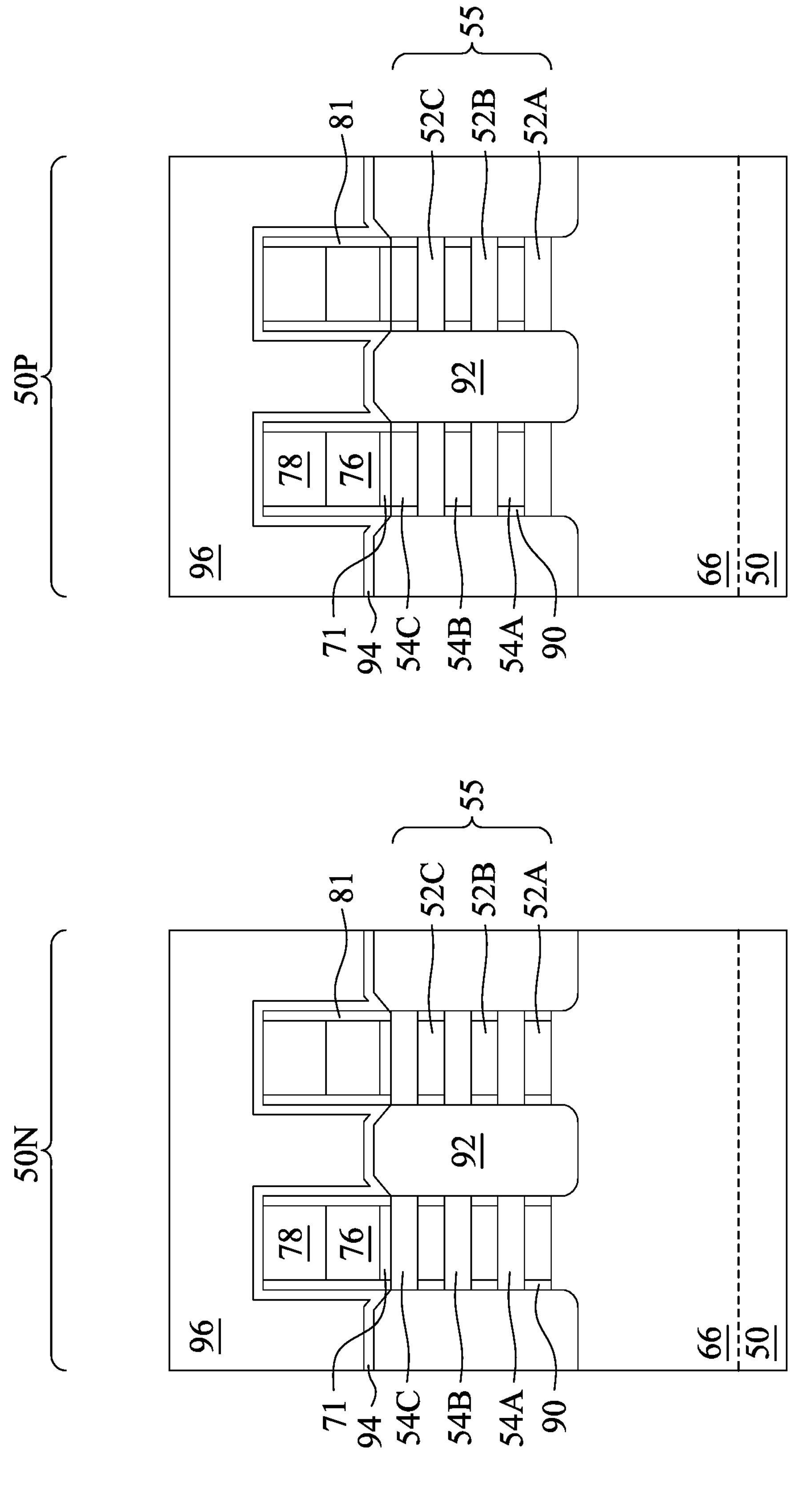
Figure 13D:
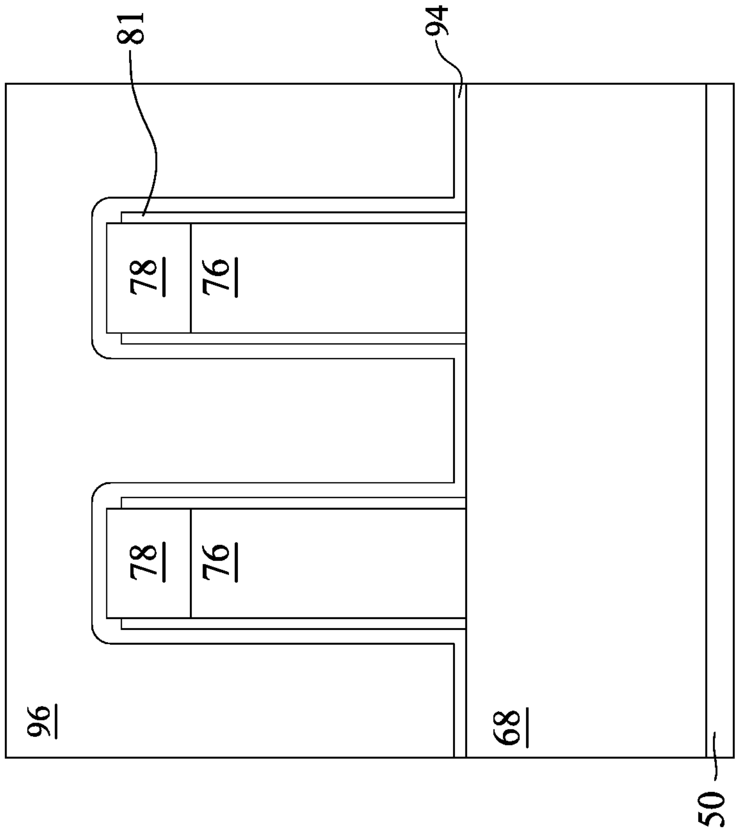
Figure 13C:
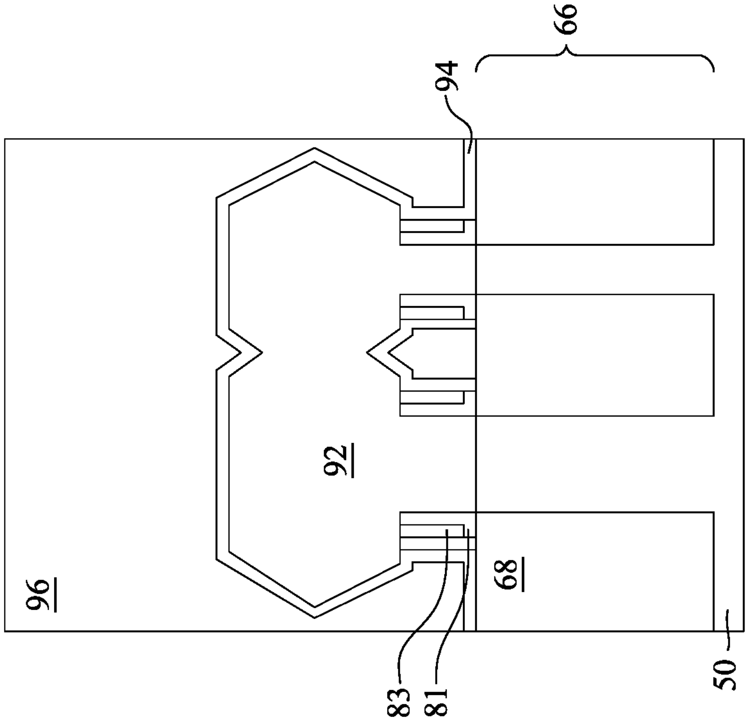

FIG. 12E illustrates that the source/drain regions 92 may merge between the fins 66, such as illustrated in FIG. 12A. The merged source/drain regions 92 are illustrated in dashed lines in FIG. 12E. In some embodiments, such as illustrated in FIG. 12C, the source/drain regions 92 may not be merged together.

In FIGS. 13A-13D, a first interlayer dielectric (ILD) 96 is deposited over the structure illustrated in FIGS. 6A, 12B, and 12A (the processes of FIGS. 7A-12D do not alter the cross-section illustrated in FIGS. 6A), respectively. The first ILD 96 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 94 is disposed between the first ILD 96 and the epitaxial source/drain regions 92, the masks 78, and the first spacers 81. The CESL 94 may comprise a dielectric material, such as, silicon nitride, silicon oxide, silicon oxynitride, or the like, having a different etch rate than the material of the overlying first ILD 96.

Figure 14A:
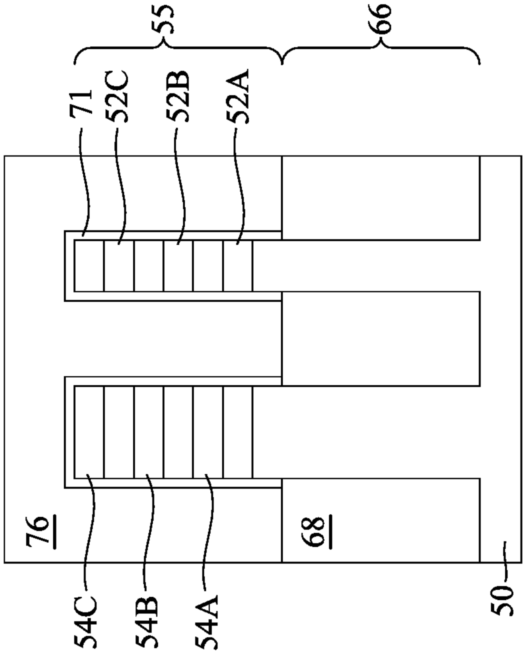
Figure 14B:
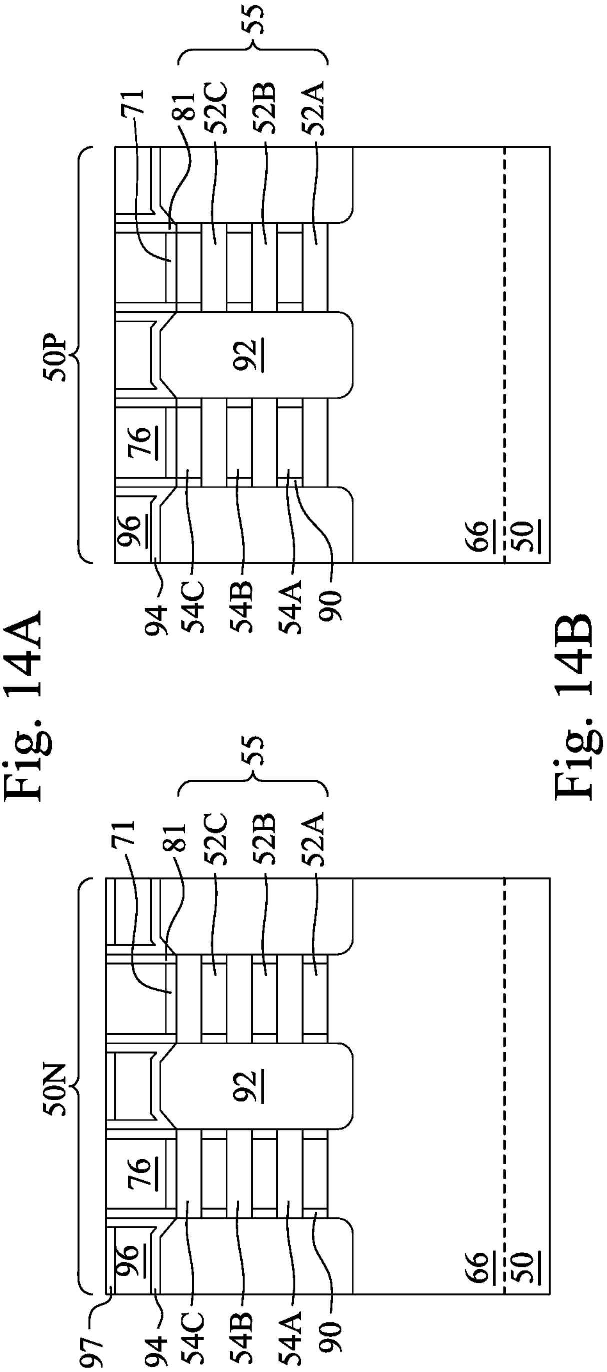
Figure 14C:
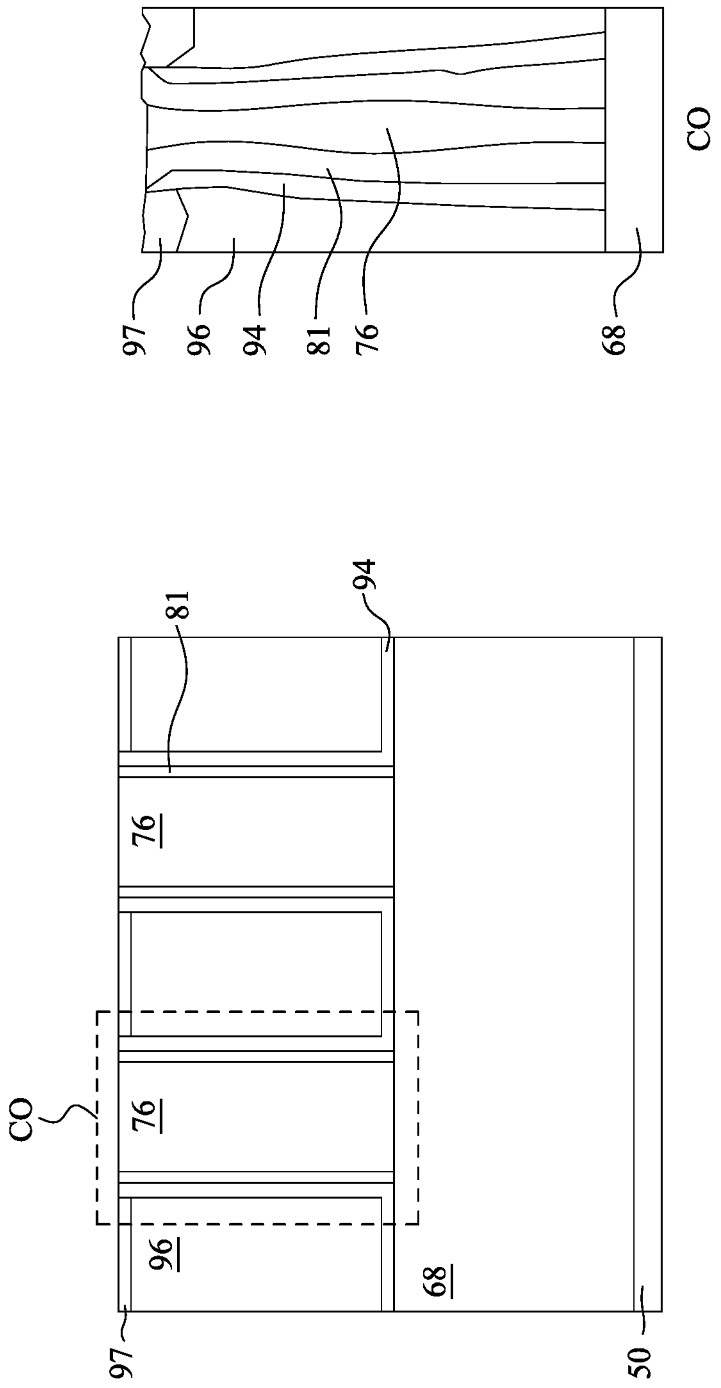

In FIGS. 14A-14C, a planarization process, such as a CMP, may be performed to level the top surface of the first ILD 96 with the top surfaces of the dummy gates 76 or the masks 78. The planarization process may also remove the masks 78 on the dummy gates 76, and portions of the first spacers 81 along sidewalls of the masks 78. After the planarization process, top surfaces of the dummy gates 76, the first spacers 81, and the first ILD 96 are level within process variations. Accordingly, the top surfaces of the dummy gates 72 are exposed through the first ILD 96. In some embodiments, the masks 78 may remain, in which case the planarization process levels the top surface of the first ILD 96 with top surface of the masks 78 and the first spacers 81. In some embodiments, such as illustrated in FIG. 14B in the n-type region 50N, the first ILD 96 may be recessed by an etching process, for example, and a hard mask 97 may be deposited over the first ILD 96. In other embodiments, the hard mask 97 may be omitted, such as illustrated in the p-type region 50P. The hard mask 97 may be formed using any suitable materials, such as silicon nitride by any suitable process, such as by CVD, followed by a planarization process, such as a CMP process to level upper surfaces of the materials and processes similar to those discussed for the CESL 94. FIG. 14C includes a call out box illustrating an enlarged view of the dashed rectangle CO.

Figure 15A:
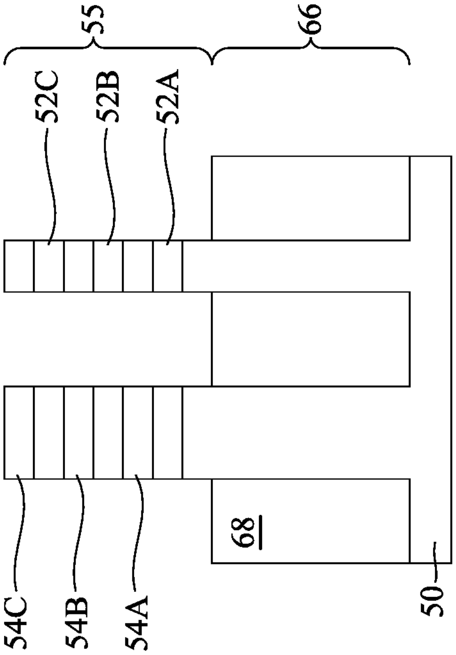
Figure 15B:
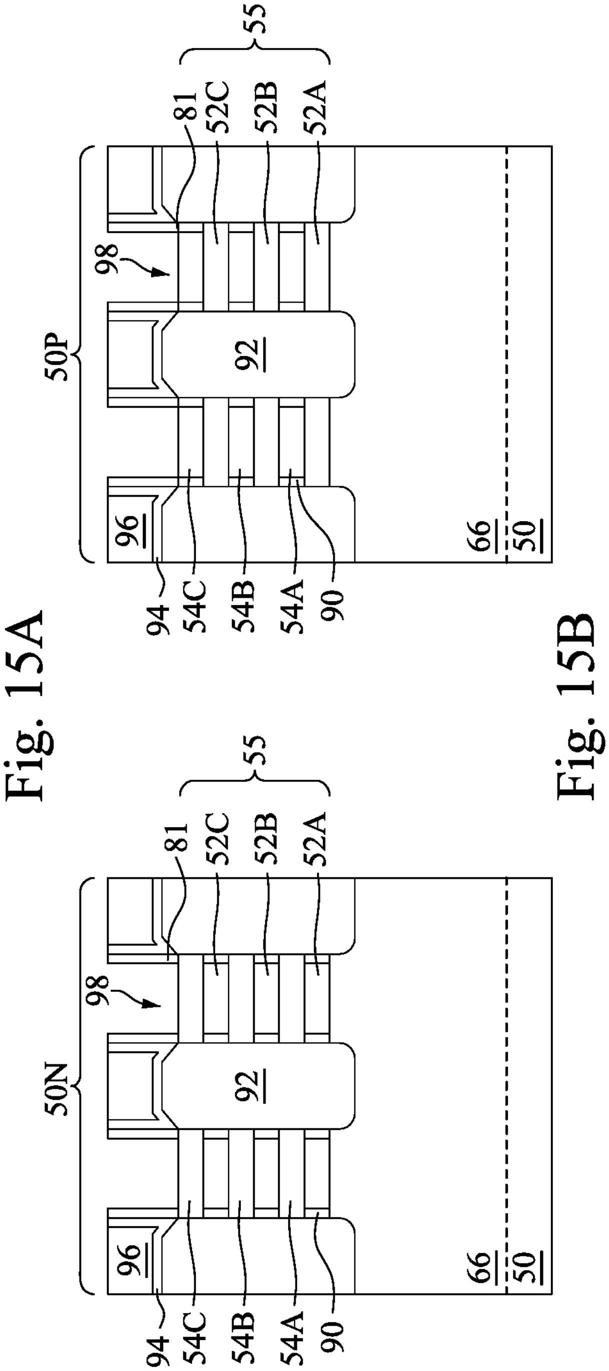
Figure 15C:
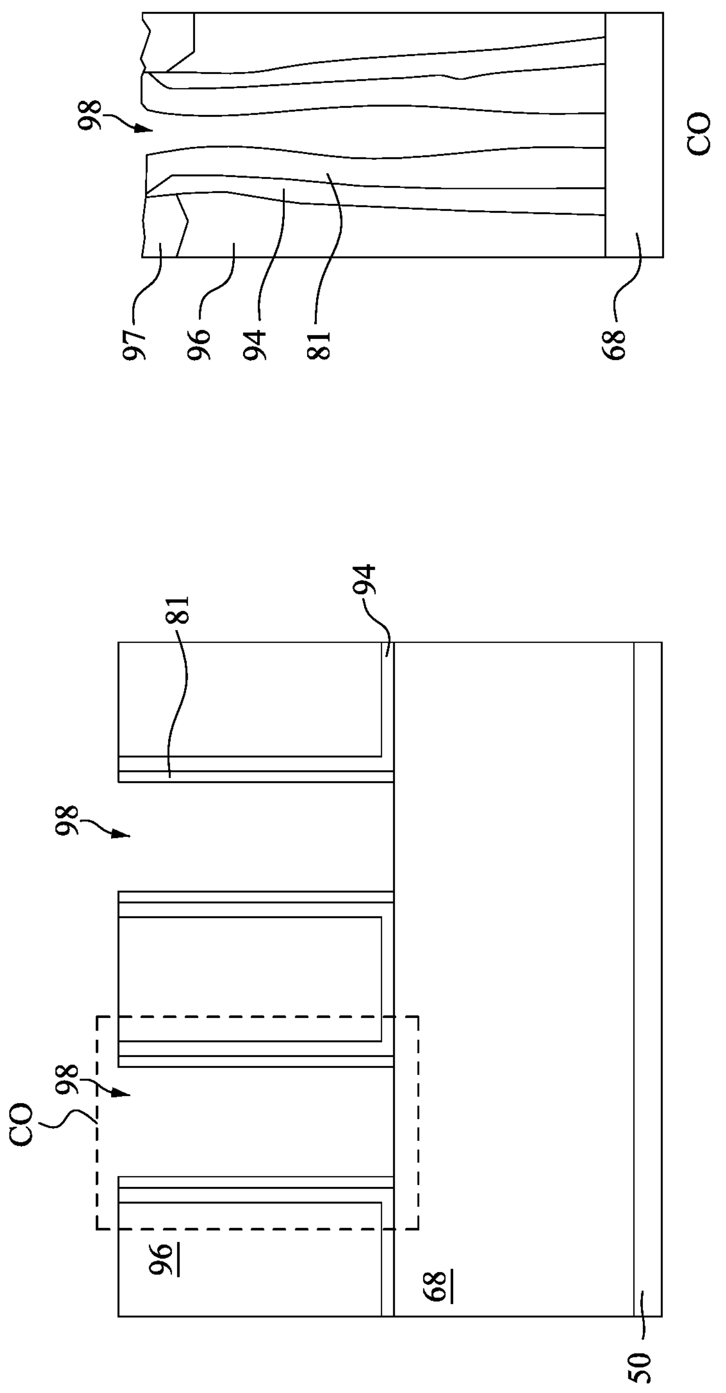

In FIGS. 15A-15C, the dummy gates 76, and the masks 78 if present, are removed in one or more etching steps, so that second recesses 98 are formed. Portions of the dummy dielectric layers 60 in the second recesses 98 are also be removed. In some embodiments, the dummy gates 76 and the dummy dielectric layers 60 are removed by an anisotropic dry etch process. For example, the etching process may include a dry etch process using reaction gas(es) that selectively etch the dummy gates 76 at a faster rate than the first ILD 96 or the first spacers 81. Each second recess 98 exposes and/or overlies portions of nanostructures 55, which act as channel regions in subsequently completed nano-FETs. Portions of the nanostructures 55 which act as the channel regions are disposed between neighboring pairs of the epitaxial source/drain regions 92. During the removal, the dummy dielectric layers 60 may be used as etch stop layers when the dummy gates 76 are etched. The dummy dielectric layers 60 may then be removed after the removal of the dummy gates 76. FIG. 15C includes a call out box for the dashed rectangle CO, illustrating an enlarged view of the removal of the dummy gates 76 and formation of the recess 98. Additional processes are performed on the recess 98 to thin the first spacers 81.

Figure 16A:
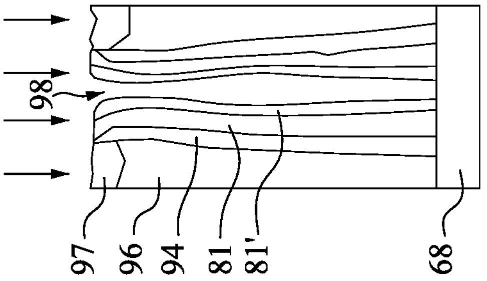
Figure 16B:
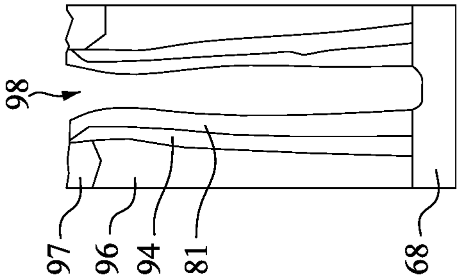
Figure 16C:
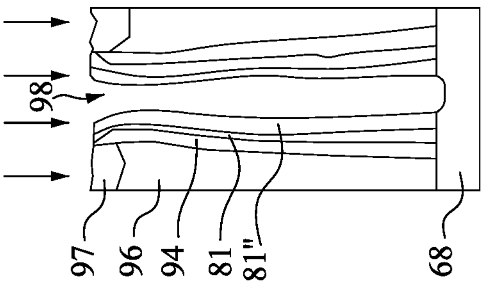
Figure 16D:
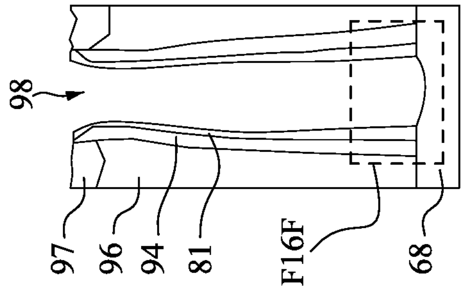
Figure 16E:
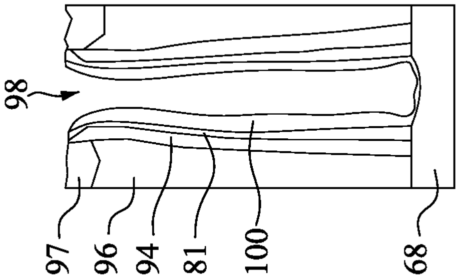
Figure 16F:
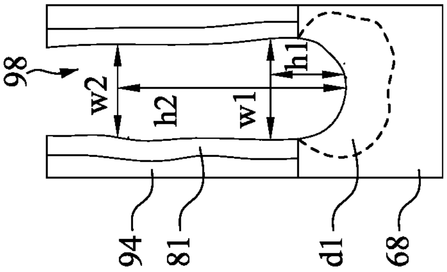

FIGS. 16A-16F illustrate a process that trims the first spacers 81. Each of the views of 16A-16E illustrated continuing processes on the call out box from FIG. 15C. FIG. 16F illustrates an enlarged view of the dashed box F16F of FIG. 16D. As noted above, if the first spacers 81 are trimmed using a traditional technique, then the etchant will attack the STI region 68 before it can be used up by the etching reactions. For example, if an oxygen plasma process is used to oxidize the first spacers 81, plasma effluents including ions and radicals have trouble reaching the bottom of the recesses 98, causing top-to-bottom non-uniformity in an oxide layer of the first spacers 81. When etchants are used to remove the oxide, the oxide removal is non-uniform and more etchants can attack the bottom STI regions 68, causing unwanted STI loss and risk of leakage current through a mushroom-type depression and large surface roughness.

In FIG. 16A, a first radical treatment process is performed on the first spacers 81 causing an oxidation sub-layer 81' to form from exposed surfaces of the first spacers 81. Exposed surfaces of the first nanostructures 52 in the p-type region 50P and exposed surfaces of the second nanostructures 54 in the n-type region 50N may also be oxidized by the first radical treatment process. The first radical treatment process utilizes radicals R* of oxygen ($O_2$), nitrogen ($N_2$), Hydrogen ($H_2$), or mixtures thereof. The radicals R* may be formed by producing a plasma of the process gas or gas mixture. The process of forming the plasma produces ions and radicals of the process gas or gas mixture. The effluents of the plasma may pass through a grounded gas distribution plate, which neutralizes the ions and reduces the energy of the radicals R*. The remaining effluents may pass through one or more additional gas distribution plates to further neutralize ions and reduce radical energy. When the remaining radicals R* reach the recesses 98, they combine with the exposed surfaces, including the first spacer 81 to oxidize a sub-layer 81' of the first spacer 81. This is just one example of how radicals may be formed. Other processes may be used, such as by remote excitation. The flow rate of the gas or gas mixture may be between about 100 sccm and 10000 sccm, the pressure may be between about 0.01 torr and 10 torr, and the process temperature may be between about 100° C. and 500° C.

In FIG. 16B, an etching process, such as a wet etch or dry etch may be used to remove the oxidized sub-layer 81', leaving behind a laterally thinned first spacer 81. If a wet etch is used, then the wet etch may be performed using any suitable etchant, for example, diluted HF. If a dry etch is used, then the dry etch may be performed by any suitable etchant, for example, HF vapor or $NF_3$ or a mixture thereof. As a result of the first radical treatment process and etch, the first spacers 81 may be thinned by about 0.5 to 5 nm. In addition to thinning the first spacers 81, the exposed oxidized surfaces of the first nanostructures 52 and second nanostructures 54 may be trimmed also. The etch also causes a trench to form in the upper (exposed) surface of the STI 68.

In FIG. 16C, a second radical treatment process may be used to thin the first spacer 81 a second time. The second radical treatment process is similar to the first radical treatment process and may use the same gas or gas mixture as the first radical treatment process, in some embodiments. In other embodiments, a different gas or gas mixture may be used. The second radical treatment process oxidizes a sub-layer 81" of the first spacers 81.

In FIG. 16D, another etch may be used to removed the oxidized sub-layer 81", leaving behind a laterally thinned first spacer 81. The etching may be similar to the first etch of the oxidized sub-layer 81', which may be a wet etch or dry etch using suitable etchant(s). As a result of the first radical treatment process and etch, the first spacers 81 may be thinned by an additional amount of about 0.5 to 5 nm, for a total thinning of about 1 nm to about 10 nm. In addition to thinning the first spacers 81, the exposed oxidized surfaces of the first nanostructures 52 and second nanostructures 54 may be trimmed also. Due to utilizing the radical oxidation processes, the upper surface of the STI region 68 suffers less damage than when utilizing usual trimming processes. The etch also causes the trench in the upper (exposed) surface of the STI 68 to deepen.

In FIG. 16E, a gate dielectric layer 100 may be formed in the recesses 98. More details on forming the gate dielectric layer 100 is provided below.

FIG. 16F is an enlarged view of the dashed box F16F of FIG. 16D. The dashed line d1 in FIG. 16F indicates where mushrooming may occur when utilizing usual trimming process rather than embodiment processes. FIG. 16F also indicates a width w1 at a first height h1=5 nm (measured from the bottom of the recess 98, vertically) and a width w2 at a second height h2=20 nm (measured from the bottom of the recess 98, vertically). Due to the better bottom profile and preservation of STI regions 68, the bias of w2−w1 is a positive number which may be between about 0.5 nm and 10 nm, indicating a round tip of the recess 98. Usual trimming processes would typically yield a negative bias, indicating a mushroom tip for the recess 98. Although, these relationships describe the recess 98, it should be appreciated that these same relationships apply to the subsequently formed gate electrode.

Figure 17A:
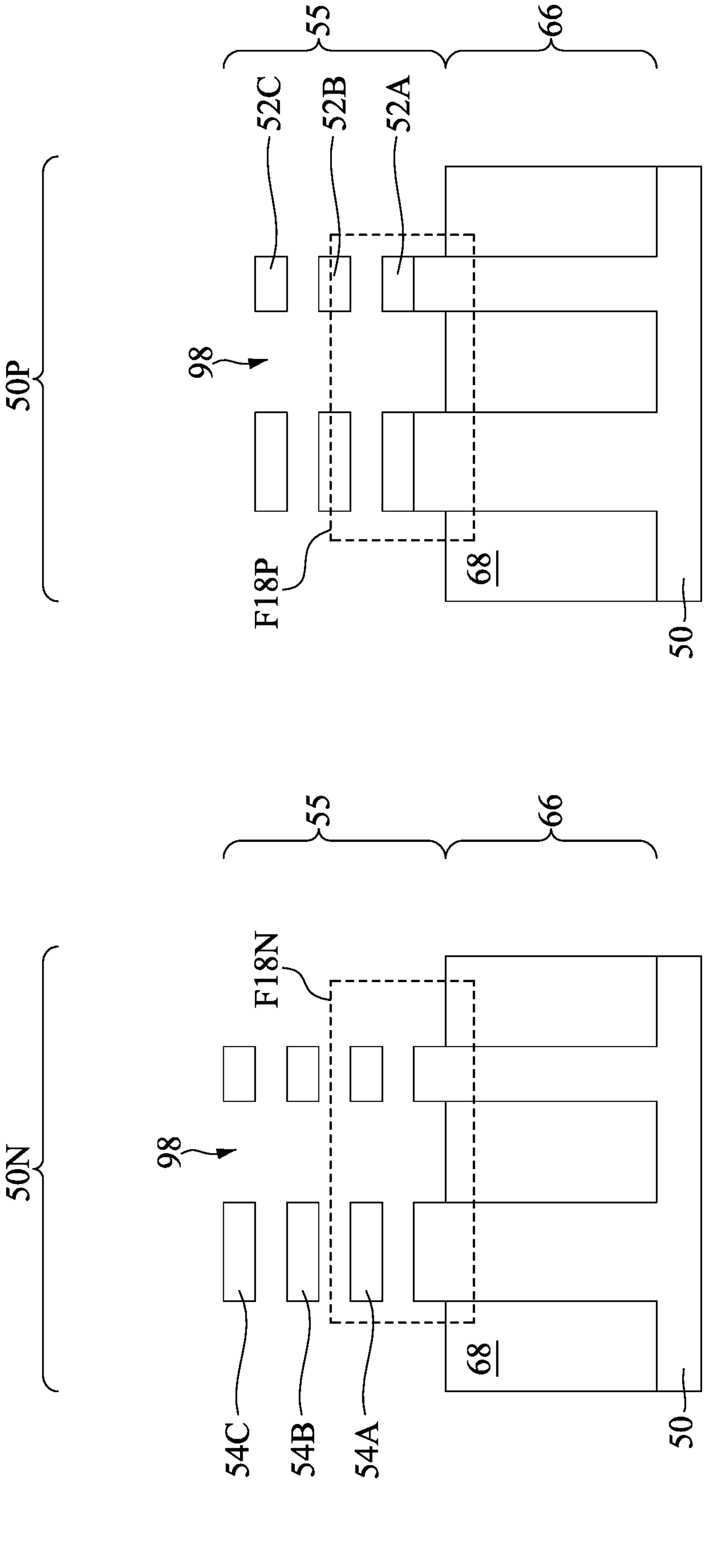
Figure 17B:
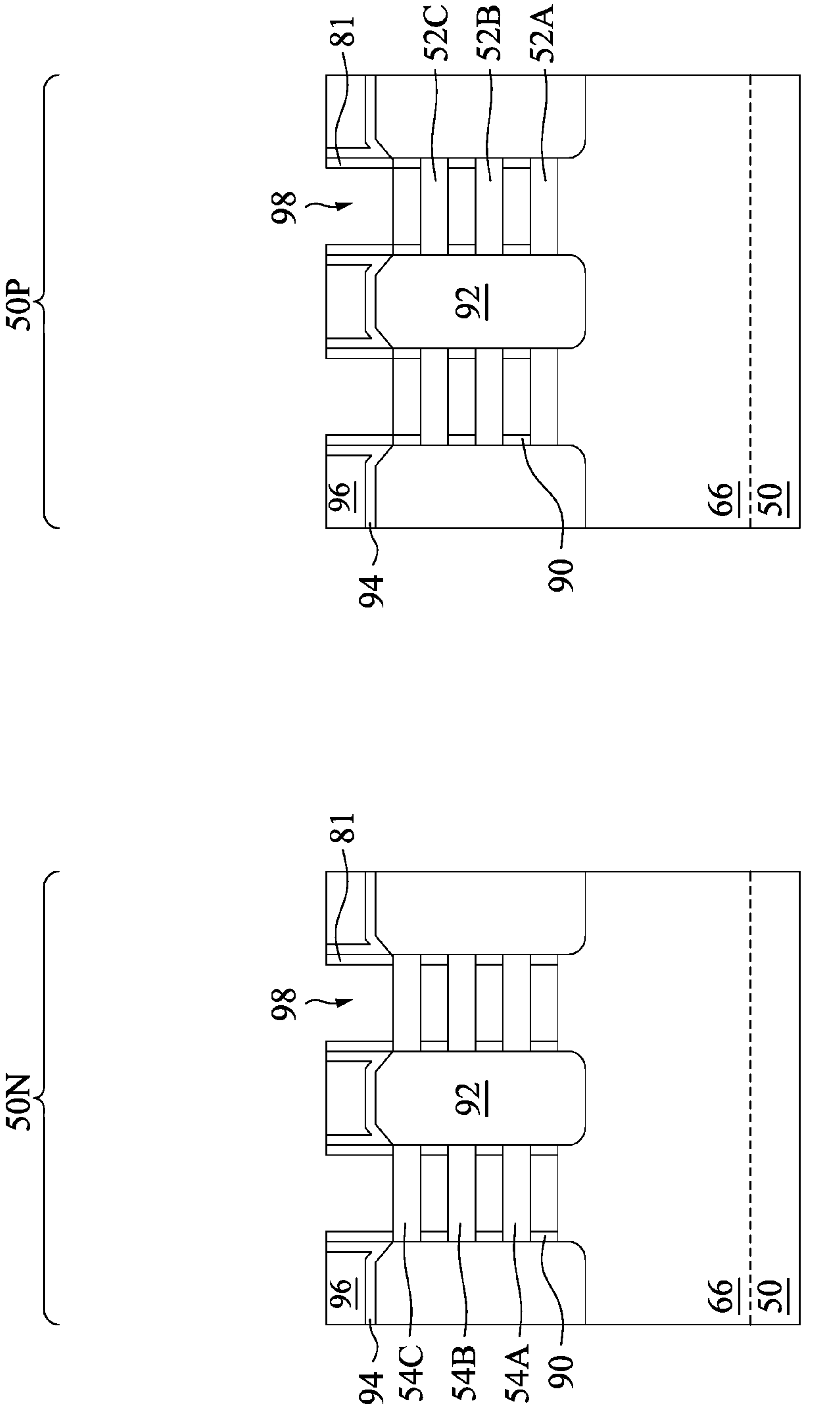

In FIGS. 17A-17B, the first nanostructures 52 in the n-type region 50N and the second nanostructures 54 in the p-type region 50P are removed extending the second recesses 98. The first nanostructures 52 may be removed by forming a mask (not shown) over the p-type region 50P and performing an isotropic etching process such as wet etching or the like using etchants which are selective to the materials of the first nanostructures 52, while the second nanostructures 54, the substrate 50, the STI regions 68 remain relatively unetched as compared to the first nanostructures 52. In embodiments in which the first nanostructures 52 include, e.g., SiGe, and the second nanostructures 54A-54C include, e.g., Si or SiC, tetramethylammonium hydroxide (TMAH), ammonium hydroxide (NH4OH), or the like may be used to remove the first nanostructures 52 in the n-type region 50N. The dashed boxes F18N and F18P in FIG. 16A will be discussed in greater detail with respect to FIGS. 18A and 18B.

The second nanostructures 54 in the p-type region 50P may be removed by forming a mask (not shown) over the n-type region 50N and performing an isotropic etching process such as wet etching or the like using etchants which are selective to the materials of the second nanostructures 54, while the first nanostructures 52, the substrate 50, the STI regions 68 remain relatively unetched as compared to the second nanostructures 54. In embodiments in which the second nanostructures 54 include, e.g., SiGe, and the first nanostructures 52 include, e.g., Si or SiC, hydrogen fluoride, another fluorine-based etchant, or the like may be used to remove the second nanostructures 54 in the p-type region 50P.

In other embodiments, the channel regions in the n-type region 50N and the p-type region 50P may be formed simultaneously, for example by removing the first nanostructures 52 in both the n-type region 50N and the p-type region 50P or by removing the second nanostructures 54 in both the n-type region 50N and the p-type region 50P. In such embodiments, channel regions of n-type nano-FETs and p-type nano-FETS may have a same material composition, such as silicon, silicon germanium, or the like. FIGS. 23A, 23B, 23C, and 23D illustrate a structure resulting from such embodiments where the channel regions in both the p-type region 50P and the n-type region 50N are provided by the second nanostructures 54 and comprise silicon, for example.

As seen in FIG. 17A, in the n-type region 50N, the second nanostructure 54C has been thinned from the top and the second nanostructures 54 and the exposed portions of the fins 66 have been slightly narrowed by the oxidation and etching processes described with respect to FIGS. 16A-F. Similarly, in the p-type region 50P, the first nanostructures 52 and exposed portions of the fins 66 have been slightly narrowed by the oxidation and etching processes of FIGS. 16A-F. The dashed boxes F18N and F18P in FIG. 17A will be discussed in greater detail with respect to FIGS. 18A and 18B.

Figure 18A:
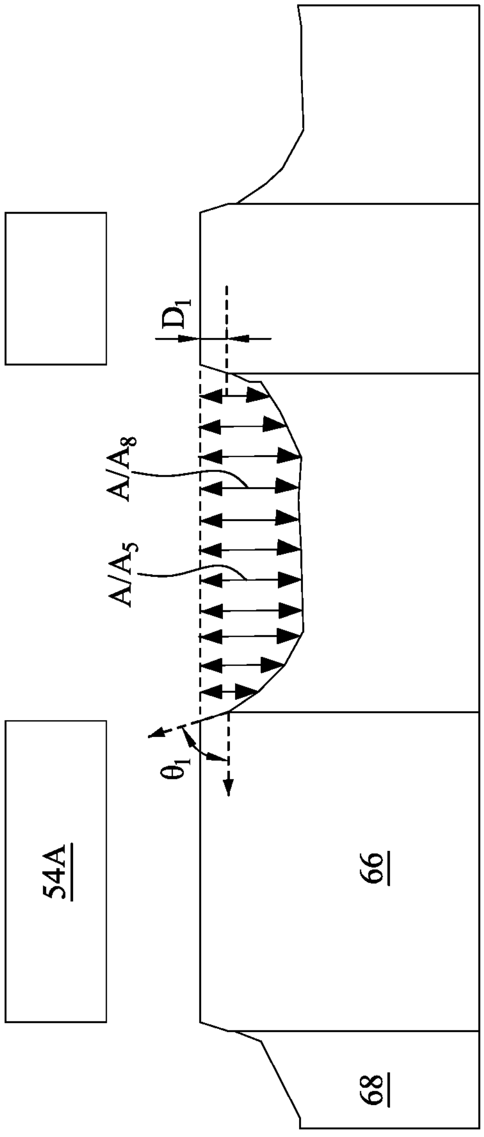
Figure 18B:
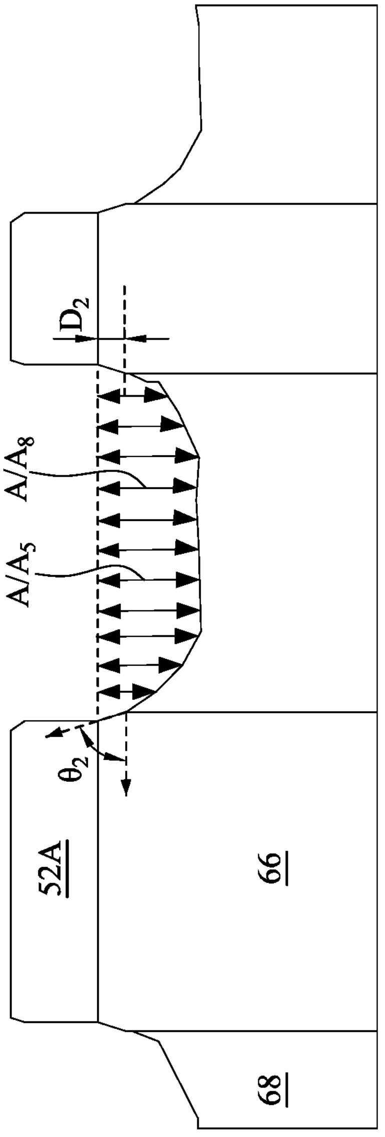

FIGS. 18A and 18B are enlarged views of the dashed boxes F18N and F18P of FIG. 17A, respectively. FIGS. 18A and 18B are each marked with vertical arrows $A_5$ and $A_8$. These are the fifth and eighth arrows A which are vertical measurements taken from an upper surface of the fins 66 to a surface of the STI regions 68 between two fins 66. Starting from the edge of the fins 66, measurements can be taken at regular intervals, such as every 1 nm. The average STI loss is the average of the measurements of the arrows A. Embodiment processes provide an STI loss between about 0 nm and 20 nm, such as between about 6 nm and 14 nm. Usual processes would result in an STI loss between about 20 nm and 40 nm. Embodiment processes may provide a STI loss reduction which is between 30% to 65% of the STI loss of typical processes.

The measurements of the arrows A can also measure the roughness of the surface of the STI regions 68. The standard deviation of the measurements of the arrows A can be calculated. The 3-σ (three sigma) of the standard deviation can be taken as representing the roughness of the surface of the STI regions 68. Embodiment processes provide a roughness between about 0 nm and 5 nm. Usual processes would result in a roughness between about 5 nm and 10 nm at the 3-σ. Embodiment processes may provide a roughness improvement which is between 25% to 75% of the roughness resulting from typical processes.

In FIGS. 18A and 18B, the interface angles θ1 and θ2, respectively, represent the angle created by taking a line from the top edge of the fins 66 to the uppermost interface of the sidewall of the fins 66 and the sidewall of the STI region 68 and comparing that line to a horizontal reference. Embodiment processes provide interface angles θ1 and θ2 between about 50° and 80°. Usual processes would result in interface angles θ1 and θ2 between about 80° and 90°, due to the more pronounced STI loss realized using usual processes. Embodiment processes provide a gentler transition from the sidewall of the fins 66 to the upper surface of the STI region 68. Also in FIGS. 18A and 18B, the sidewall exposure of the fins 66 is the distance D1 and D2, respectively. Embodiment processes provide sidewall exposure where D1 and D2 each are between about 0 and 10 nm, such as between about 2 nm and 8 nm. Usual processes would result in sidewall exposure where D1 and D2 would be between about 10 nm and 20 nm. Embodiment processes may provide a sidewall exposure which is between 10% to 75% of the sidewall exposure resulting from typical processes.

Figure 19A:
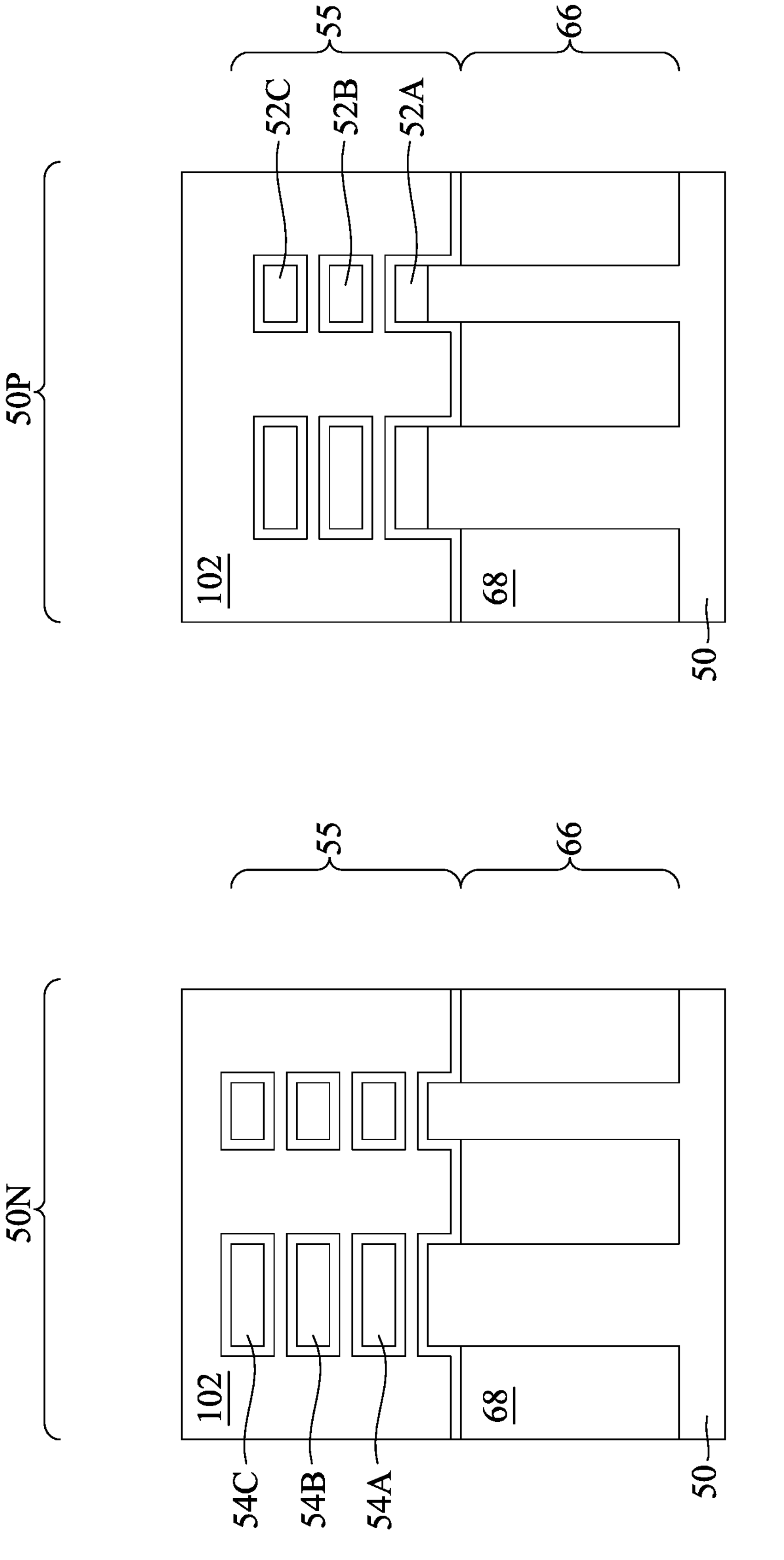
Figure 19B:
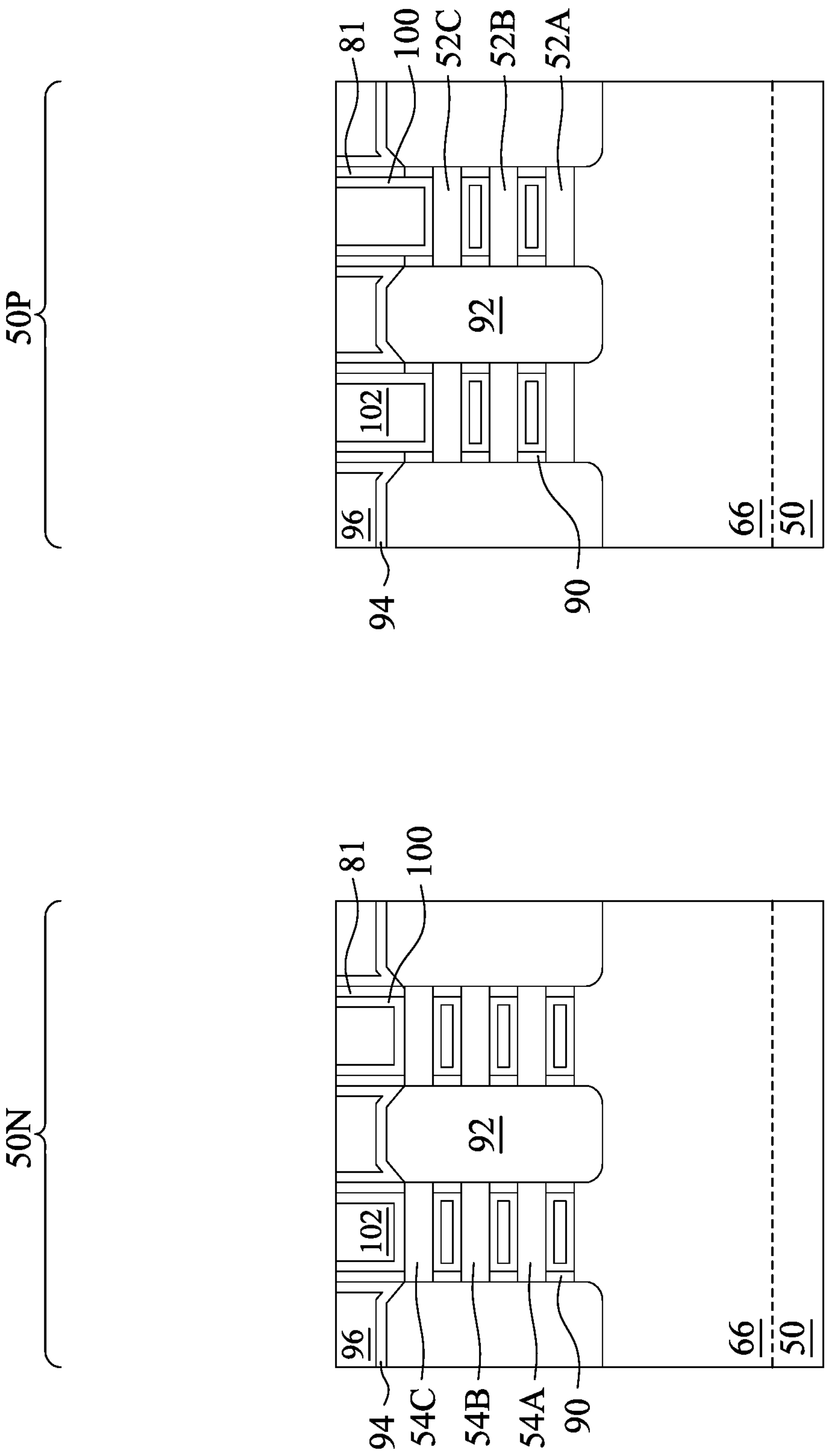
Figure 19C:
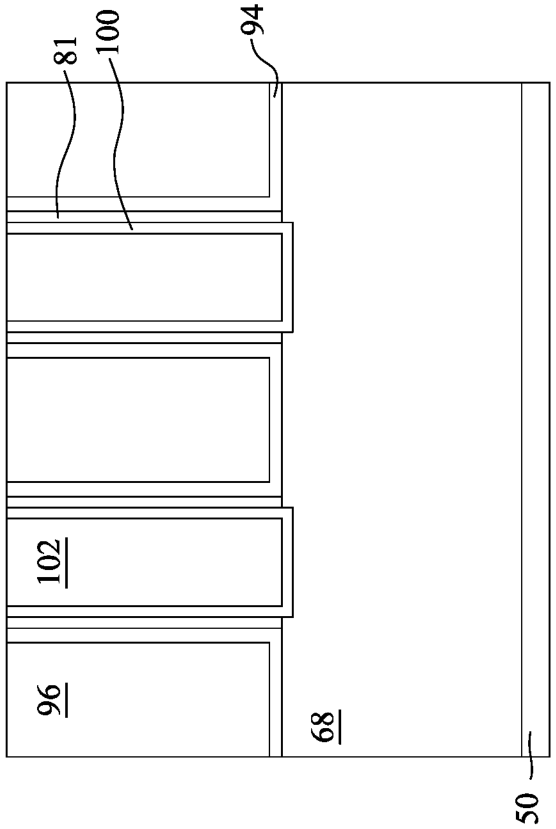
Figure 20A:
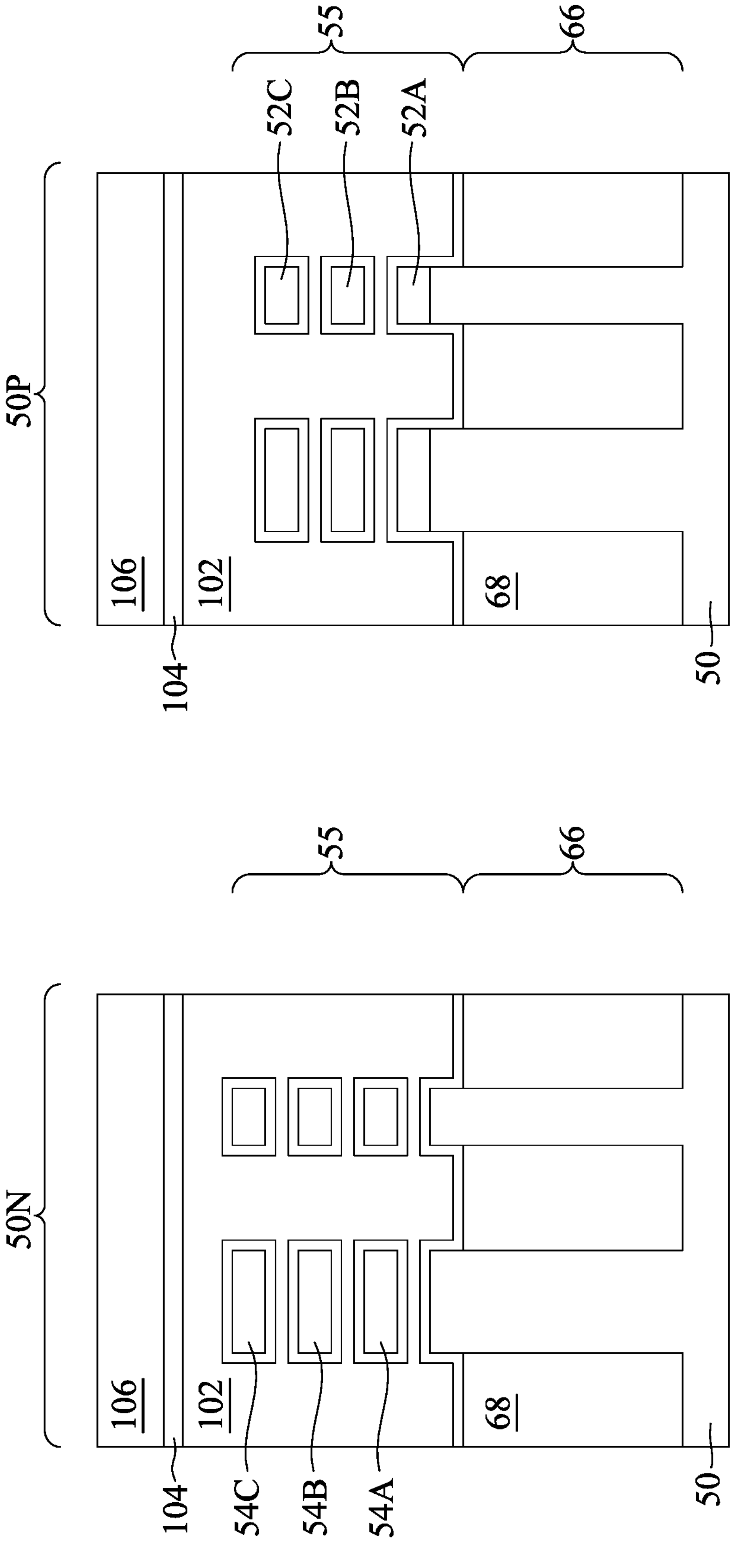
Figure 20B:
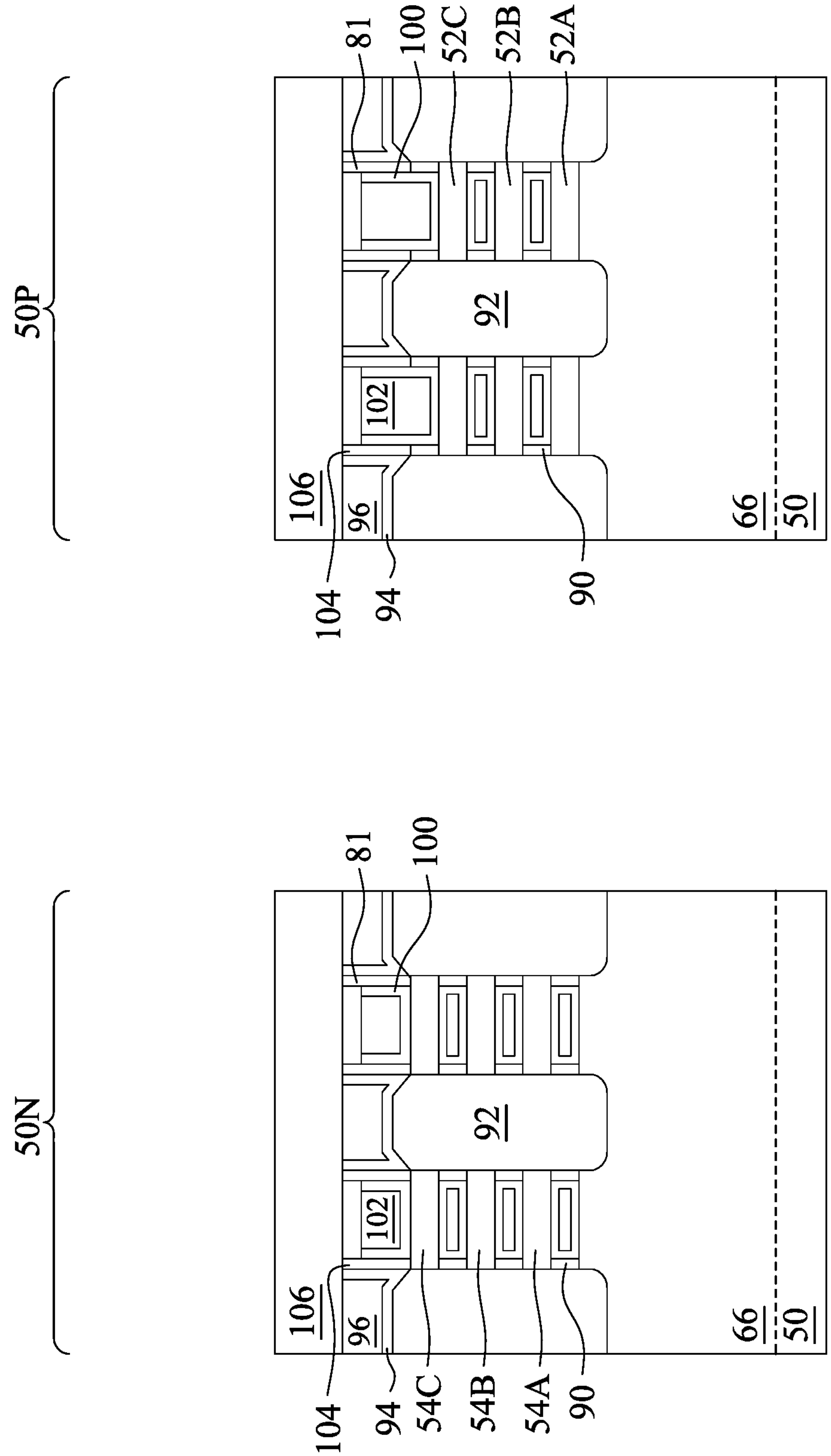
Figure 20D:
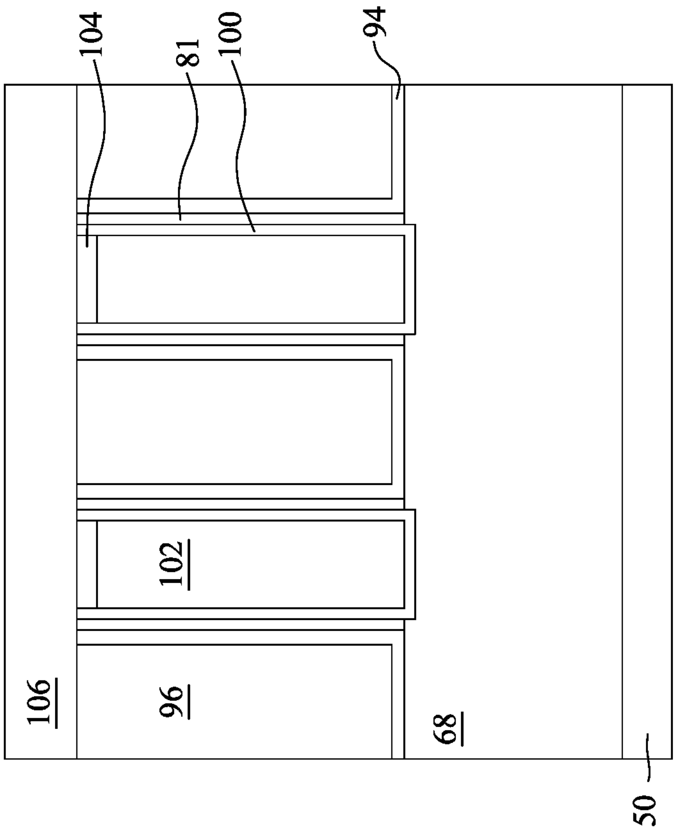
Figure 20C:
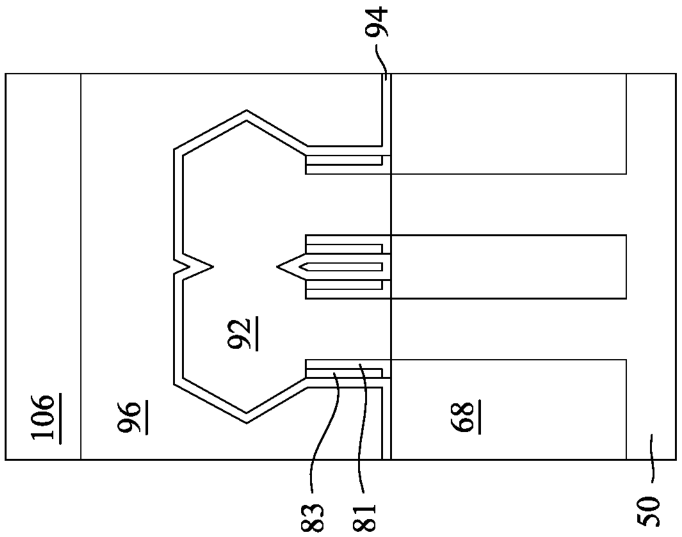
Figure 21A:
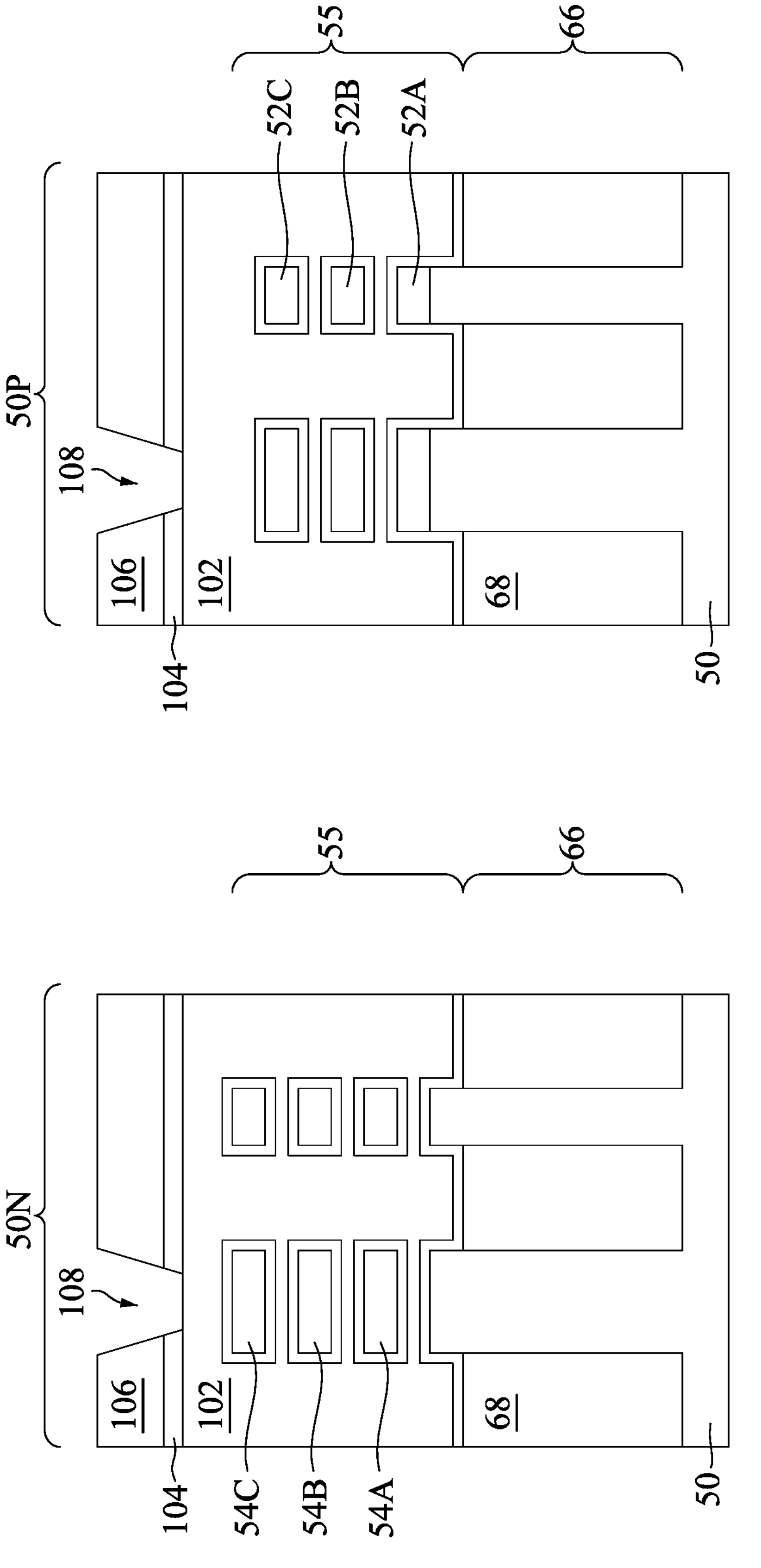
Figure 21B:
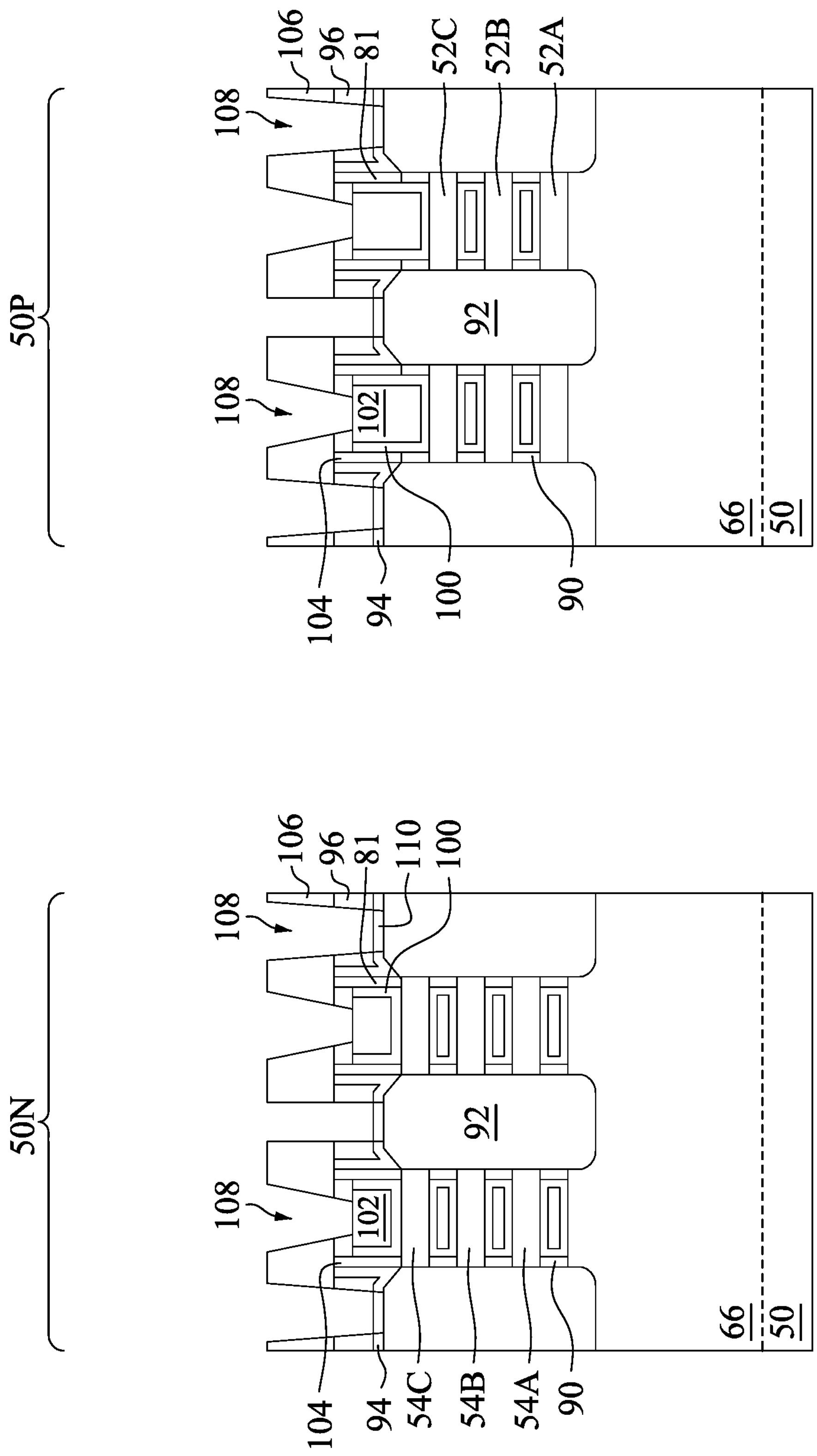
Figure 21D:
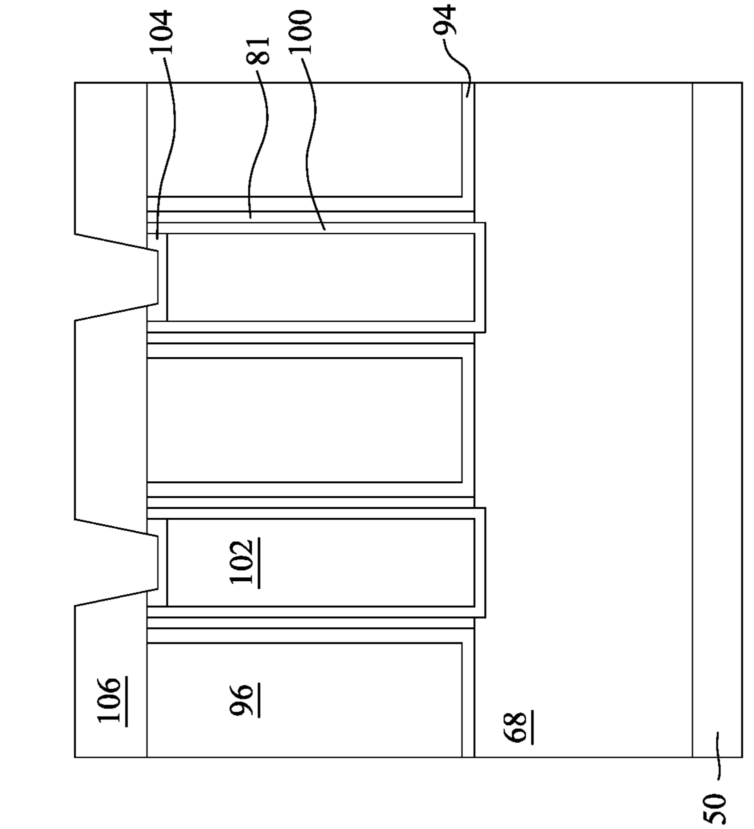
Figure 21C:
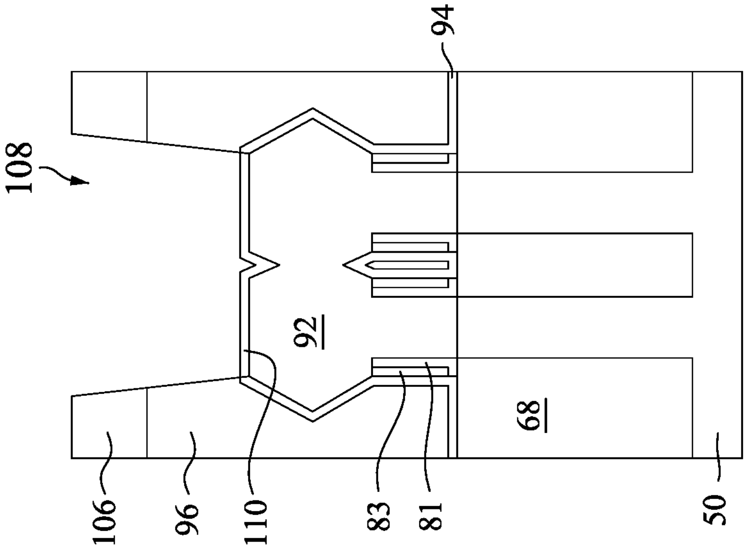
Figure 22A:
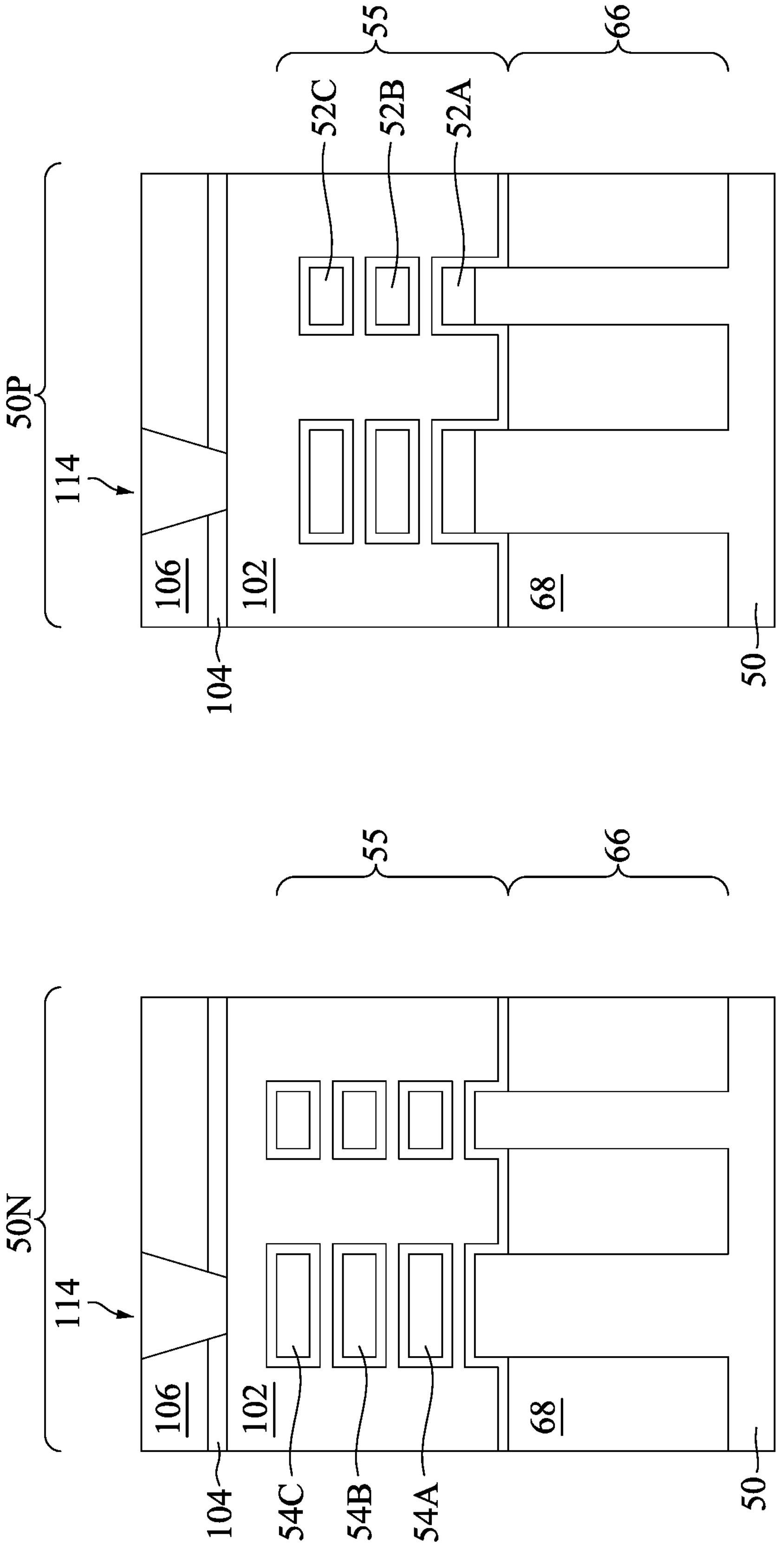
Figure 22B:
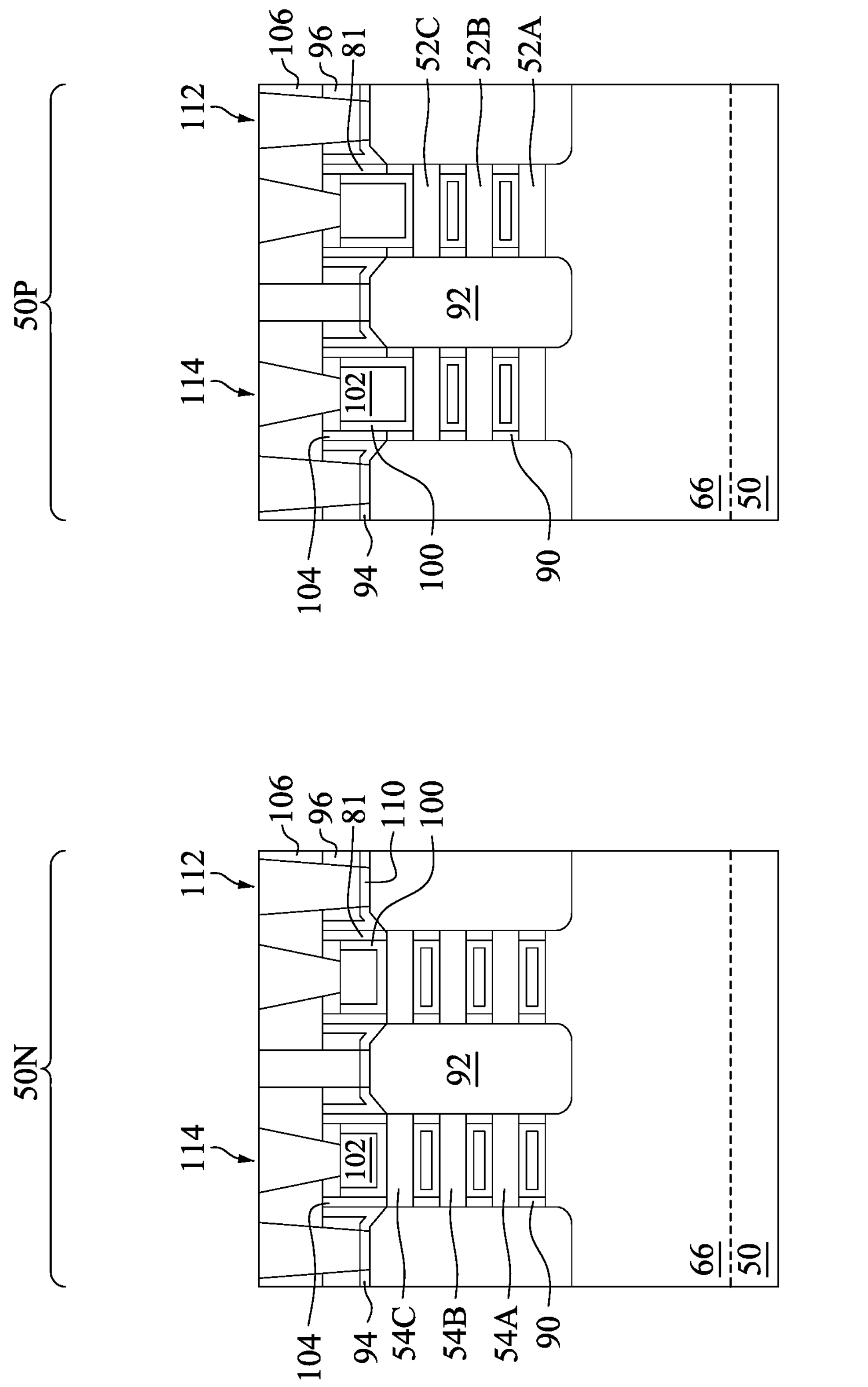
Figure 22C:
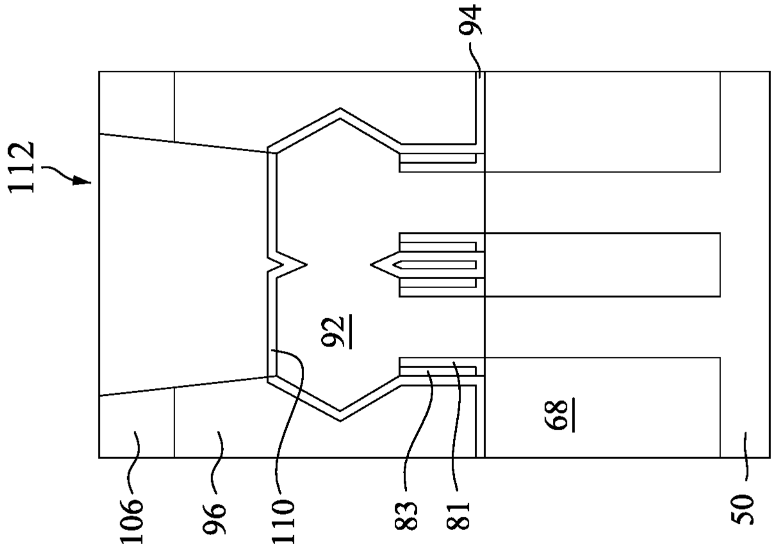
Figure 22D:
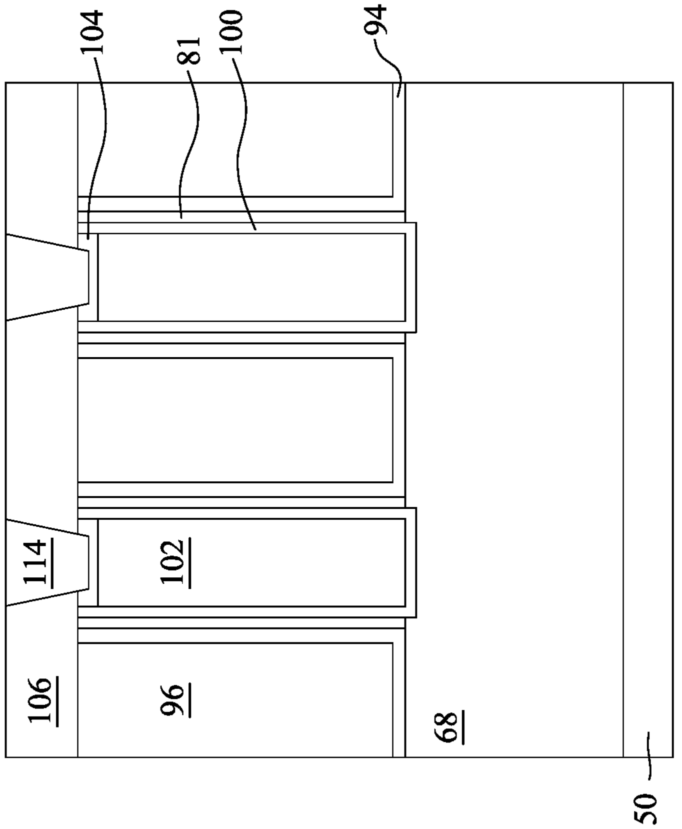

In FIGS. 19A-19C, gate dielectric layers 100 and gate electrodes 102 are formed for replacement gates. The gate dielectric layers 100 are deposited conformally in the second recesses 98. In the n-type region 50N, the gate dielectric layers 100 may be formed on top surfaces and sidewalls of the substrate 50 and on top surfaces, sidewalls, and bottom surfaces of the second nanostructures 54, and in the p-type region 50P, the gate dielectric layers 100 may be formed on top surfaces and sidewalls of the substrate 50 and on top surfaces, sidewalls, and bottom surfaces of the first nanostructures 52. The gate dielectric layers 100 may also be deposited on top surfaces of the first ILD 96, the CESL 94, the first spacers 81, and the STI regions 68.

In accordance with some embodiments, the gate dielectric layers 100 comprise one or more dielectric layers, such as an oxide, a metal oxide, the like, or combinations thereof. For example, in some embodiments, the gate dielectrics may comprise a silicon oxide layer and a metal oxide layer over the silicon oxide layer. In some embodiments, the gate dielectric layers 100 include a high-k dielectric material, and in these embodiments, the gate dielectric layers 100 may have a k value greater than about 7.0, and may include a metal oxide or a silicate of hafnium, aluminum, zirconium, lanthanum, manganese, barium, titanium, lead, and combinations thereof. The structure of the gate dielectric layers 100 may be the same or different in the n-type region 50N and the p-type region 50P. The formation methods of the gate dielectric layers 100 may include molecular-beam deposition (MBD), ALD, PECVD, and the like.

The gate electrodes 102 are deposited over the gate dielectric layers 100, respectively, and fill the remaining portions of the second recesses 98. The gate electrodes 102 may include a metal-containing material such as titanium nitride, titanium oxide, tantalum nitride, tantalum carbide, cobalt, ruthenium, aluminum, tungsten, combinations thereof, or multi-layers thereof. For example, although single layer gate electrodes 102 are illustrated in FIGS. 17A and 17B, the gate electrodes 102 may comprise any number of liner layers, any number of work function tuning layers, and a fill material. Any combination of the layers which make up the gate electrodes 102 may be deposited in the n-type region 50N between adjacent ones of the second nanostructures 54 and between the second nanostructure 54A and the substrate 50, and may be deposited in the p-type region 50P between adjacent ones of the first nanostructures 52.

The formation of the gate dielectric layers 100 in the n-type region 50N and the p-type region 50P may occur simultaneously such that the gate dielectric layers 100 in each region are formed from the same materials, and the formation of the gate electrodes 102 may occur simultaneously such that the gate electrodes 102 in each region are formed from the same materials. In some embodiments, the gate dielectric layers 100 in each region may be formed by distinct processes, such that the gate dielectric layers 100 may be different materials and/or have a different number of layers, and/or the gate electrodes 102 in each region may be formed by distinct processes, such that the gate electrodes 102 may be different materials and/or have a different number of layers. Various masking steps may be used to mask and expose appropriate regions when using distinct processes.

After the filling of the second recesses 98, a planarization process, such as a CMP, may be performed to remove the excess portions of the gate dielectric layers 100 and the material of the gate electrodes 102, which excess portions are over the top surface of the first ILD 96. The remaining portions of material of the gate electrodes 102 and the gate dielectric layers 100 thus form replacement gate structures of the resulting nano-FETs. The gate electrodes 102 and the gate dielectric layers 100 may be collectively referred to as "gate structures."

In FIGS. 20A-20D, the gate structure (including the gate dielectric layers 100 and the corresponding overlying gate electrodes 102) is recessed, so that a recess is formed directly over the gate structure and between opposing portions of first spacers 81. A gate mask 104 comprising one or more layers of dielectric material, such as silicon nitride, silicon oxynitride, or the like, is filled in the recess, followed by a planarization process to remove excess portions of the dielectric material extending over the first ILD 96. Subsequently formed gate contacts (such as the gate contacts 114, discussed below with respect to FIGS. 23A and 23B) penetrate through the gate mask 104 to contact the top surface of the recessed gate electrodes 102.

As further illustrated by FIGS. 20A-20D, a second ILD 106 is deposited over the first ILD 96 and over the gate mask 104. In some embodiments, the second ILD 106 is a flowable film formed by FCVD. In some embodiments, the second ILD 106 is formed of a dielectric material such as PSG, BSG, BPSG, USG, or the like, and may be deposited by any suitable method, such as CVD, PECVD, or the like.

In FIGS. 21A-21D, the second ILD 106, the first ILD 96, the CESL 94, and the gate masks 104 are etched to form third recesses 108 exposing surfaces of the epitaxial source/drain regions 92 and/or the gate structure. The third recesses 108 may be formed by etching using an anisotropic etching process, such as RIE, NBE, or the like. In some embodiments, the third recesses 108 may be etched through the second ILD 106 and the first ILD 96 using a first etching process; may be etched through the gate masks 104 using a second etching process; and may then be etched through the CESL 94 using a third etching process. A mask, such as a photoresist, may be formed and patterned over the second ILD 106 to mask portions of the second ILD 106 from the first etching process and the second etching process. In some embodiments, the etching process may over-etch, and therefore, the third recesses 108 extend into the epitaxial source/drain regions 92 and/or the gate structure, and a bottom of the third recesses 108 may be level with (e.g., at a same level, or having a same distance from the substrate), or lower than (e.g., closer to the substrate) the epitaxial source/drain regions 92 and/or the gate structure. Although FIG. 19B illustrate the third recesses 108 as exposing the epitaxial source/drain regions 92 and the gate structure in a same cross section, in various embodiments, the epitaxial source/drain regions 92 and the gate structure may be exposed in different cross-sections, thereby reducing the risk of shorting subsequently formed contacts. After the third recesses 108 are formed, silicide regions 110 are formed over the epitaxial source/drain regions 92. In some embodiments, the silicide regions 110 are formed by first depositing a metal (not shown) capable of reacting with the semiconductor materials of the underlying epitaxial source/drain regions 92 (e.g., silicon, silicon germanium, germanium) to form silicide or germanide regions, such as nickel, cobalt, titanium, tantalum, platinum, tungsten, other noble metals, other refractory metals, rare earth metals or their alloys, over the exposed portions of the epitaxial source/drain regions 92, then performing a thermal anneal process to form the silicide regions 110. The un-reacted portions of the deposited metal are then removed, e.g., by an etching process. Although silicide regions 110 are referred to as silicide regions, silicide regions 110 may also be germanide regions, or silicon germanide regions (e.g., regions comprising silicide and germanide). In an embodiment, the silicide region 110 comprises TiSi, and has a thickness in a range between about 2 nm and about 10 nm.

Next, in FIGS. 22A-22D, contacts 112 and 114 (may also be referred to as contact plugs) are formed in the third recesses 108. The contacts 112 and 114 may each comprise one or more layers, such as barrier layers, diffusion layers, and fill materials. For example, in some embodiments, the contacts 112 and 114 each include a barrier layer and a conductive material, and are electrically coupled to the underlying conductive feature (e.g., gate structure 102 and/or silicide region 110 in the illustrated embodiment). The contacts 114 are electrically coupled to the gate structure 102 and may be referred to as gate contacts, and the contacts 112 are electrically coupled to the silicide regions 110 and may be referred to as source/drain contacts. The barrier layer may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD 106.

Figure 23D:
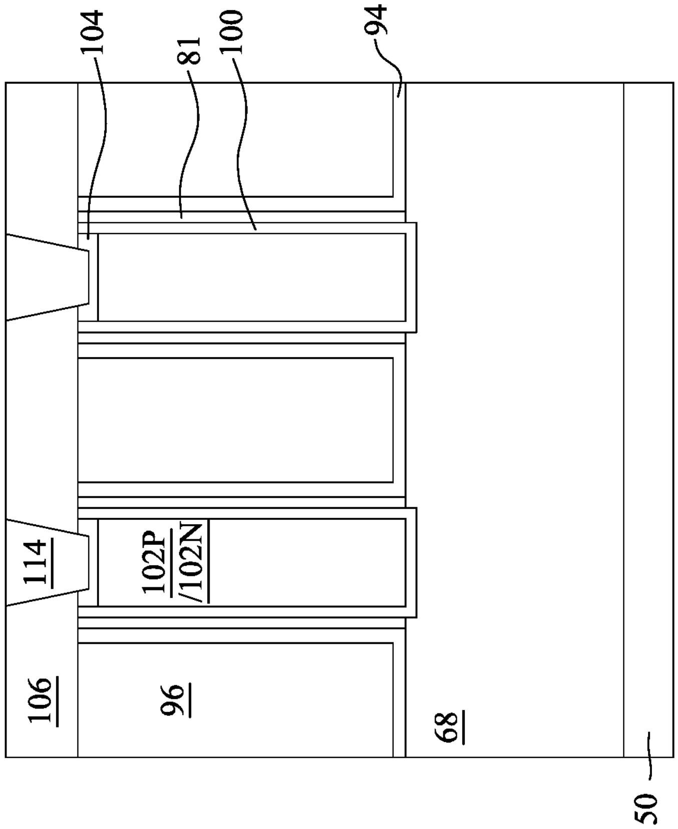
Figure 23C:
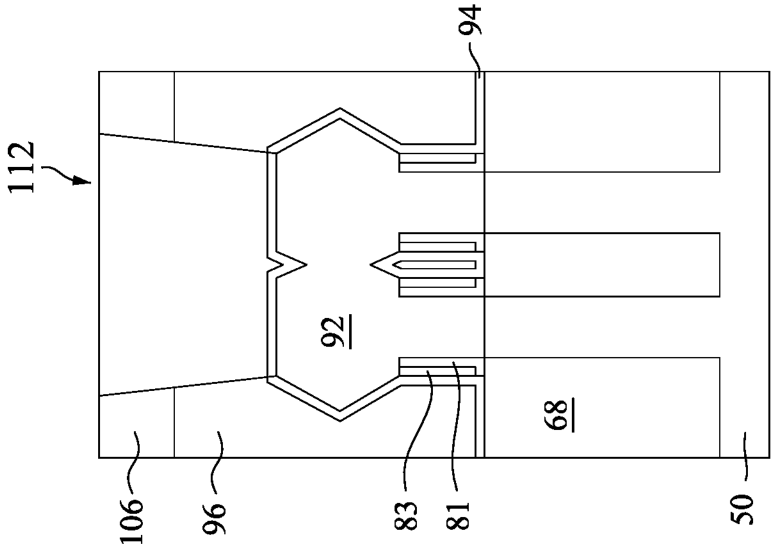

FIGS. 23A-23D illustrate cross-sectional views of a device according to some alternative embodiments. FIG. 23A illustrates reference cross-section A-A' illustrated in FIG. 1. FIG. 23B illustrates reference cross-section B-B' illustrated in FIG. 1. FIG. 23C illustrates reference cross-section C-C' illustrated in FIG. 1. FIG. 23D illustrates reference cross-section D-D' illustrated in FIG. 1. In FIGS. 23A-23D, like reference numerals indicate like elements formed by like processes as the structure of FIGS. 22A-22D. However, in FIGS. 23A-23C, channel regions in the n-type region 50N and the p-type region 50P comprise a same material. For example, the second nanostructures 54, which comprise silicon, provide channel regions for p-type nano-FETs in the p-type region 50P and for n-type nano-FETs in the n-type region 50N. The structure of FIGS. 23A-23D may be formed, for example, by removing the first nanostructures 52 from both the p-type region 50P and the n-type region 50N simultaneously; depositing the gate dielectric layers 100 and the gate electrodes 102P (e.g., gate electrode suitable for a p-type nano-FET) around the second nanostructures 54 in the p-type region 50P; and depositing the gate dielectric layers 100 and the gate electrodes 102N (e.g., a gate electrode suitable for a n-type nano-FET) around the second nanostructures 54 in the n-type region 50N. In such embodiments, materials of the epitaxial source/drain regions 92 may be different in the n-type region 50N compared to the p-type region 50P as explained above.

Figure 24:
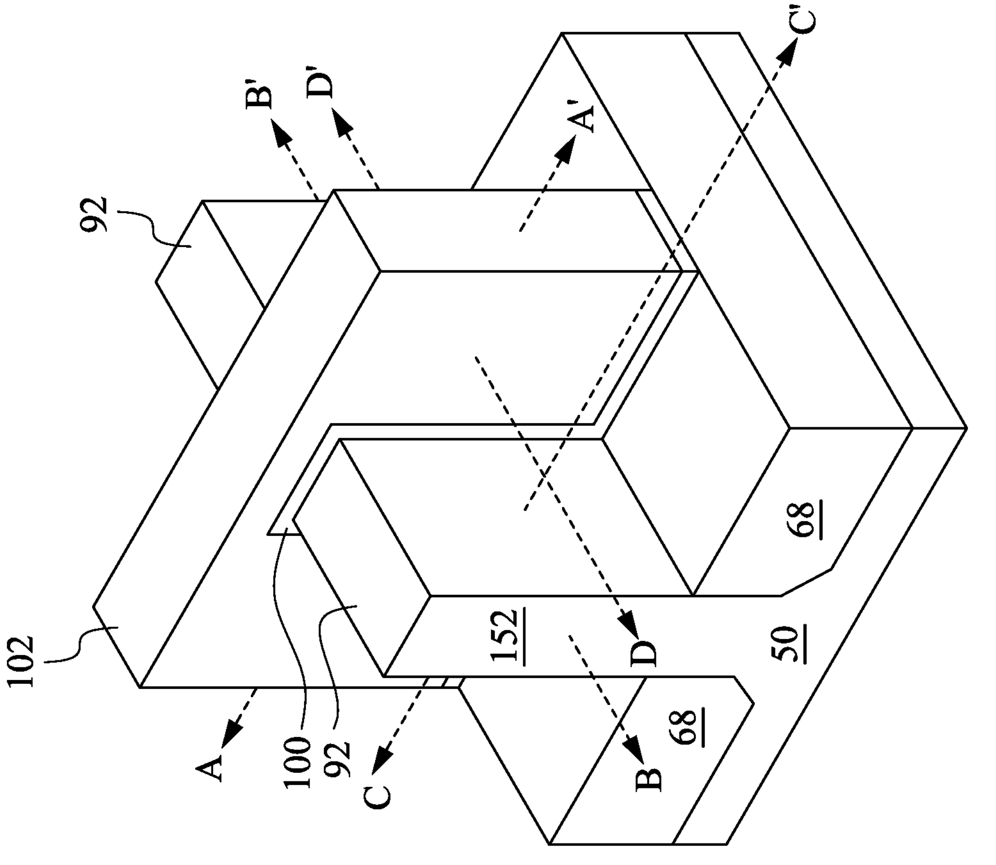
FIG. 24 illustrates an example of a field-effect transistor (FET) in a three-dimensional view, in accordance with some embodiments.

The process described above with respect to the nanoFET, can also be applied to a FinFET device. FIG. 24 illustrates an example of a FinFET in a three-dimensional view, in accordance with some embodiments. Similar reference numbers are used for similar elements and it should be understood that the materials and processes used to form such elements may be the same or similar to those described above. The FinFET comprises a fin 152 on a substrate 50 (e.g., a semiconductor substrate). Isolation regions 68 are disposed in the substrate 50, and the fin 152 protrudes above and from between neighboring isolation regions 68. Although the isolation regions 68 are described/illustrated as being separate from the substrate 50, as used herein the term "substrate" may be used to refer to just the semiconductor substrate or a semiconductor substrate inclusive of isolation regions. Additionally, although the fin 152 is illustrated as a single, continuous material as the substrate 50, the fin 152 and/or the substrate 50 may comprise a single material or a plurality of materials. In this context, the fin 152 refers to the portion extending between the neighboring isolation regions 68.

A gate dielectric layer 100 is along sidewalls and over a top surface of the fin 152, and a gate electrode 102 is over the gate dielectric layer 100. Source/drain regions 92 are disposed in opposite sides of the fin 152 with respect to the gate dielectric layer 100 and gate electrode 102. Source/drain region(s) 92 may refer to a source or a drain, individually or collectively dependent upon the context. FIG. 24 further illustrates reference cross-sections that are used in later figures. Cross-section A-A' is along a longitudinal axis of the gate electrode 102 and in a direction, for example, perpendicular to the direction of current flow between the source/drain regions 92 of the FinFET. Cross-section A-A' is similar to the cross-section A-A' of FIG. 1. Cross-section B-B' is perpendicular to cross-section A-A' and is along a longitudinal axis of the fin 152 and in a direction of, for example, a current flow between the source/drain regions 92 of the FinFET. Cross-section B-B' is similar to the cross-section B-B' of FIG. 1. Cross-section C-C' is parallel to cross-section A-A' and extends through a source/drain region 92 of the FinFET. Cross-section C-C' is similar to the cross-section C-C' of FIG. 1. Cross-section D-D' is also perpendicular to cross-section A-A', parallel to cross-section B-B', and is between adjacent source drain regions 92. Cross-section D-D' is similar to the cross-section D-D' of FIG. 1. Subsequent figures refer to these reference cross-sections for clarity. The FinFET may be an n-type transistor or a p-type transistor, and the materials and doping discussed above may be used, mutatis mutandis, in the FinFET, depending on the type of transistor being formed.

Some embodiments discussed herein are discussed in the context of FinFETs formed using a gate-last process. In other embodiments, a gate-first process may be used. Also, some embodiments contemplate aspects used in planar devices, such as planar FETs, nanostructure (e.g., nanosheet, nanowire, gate-all-around, or the like) field effect transistors (NSFETs), or the like.

Figure 25B:
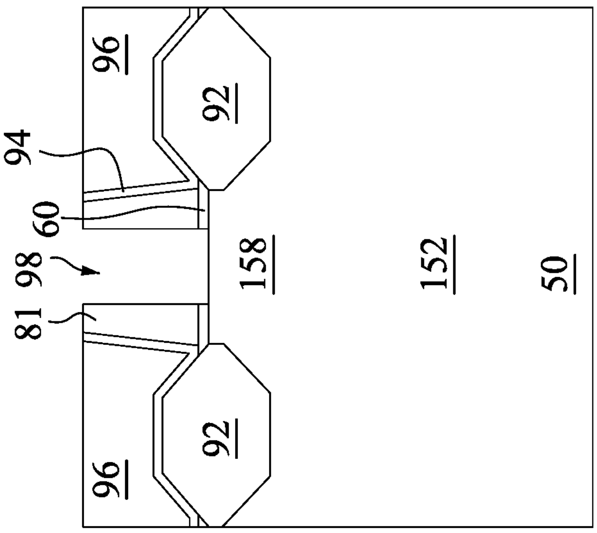
FIGS. 25A, 25B, 25C, 26A, 26B, and 26C are cross-sectional views of intermediate stages in the manufacturing of nano-FETs, in accordance with some embodiments.
Figure 25A:
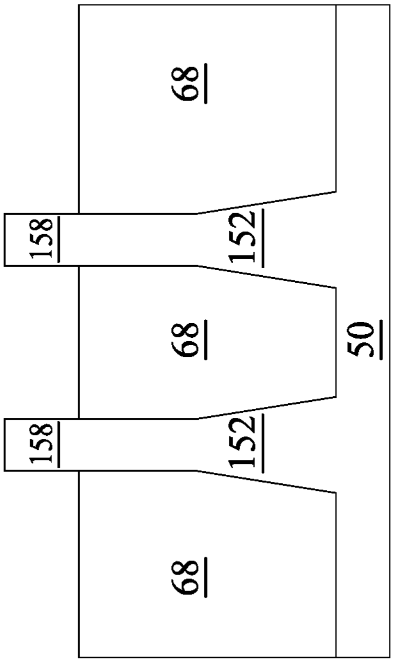
Figure 25C:
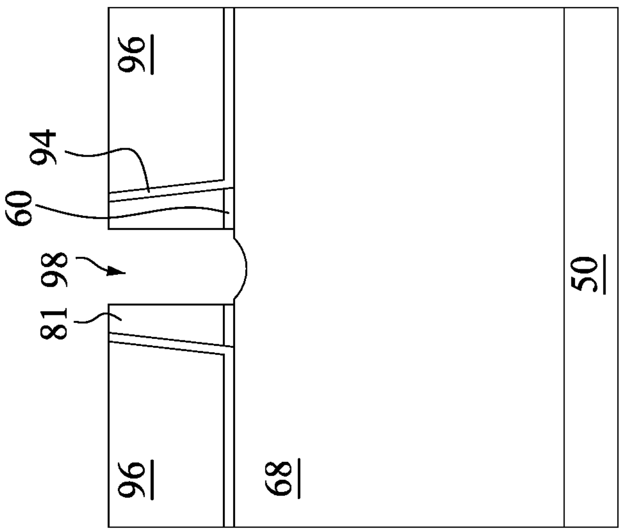

Referring to FIGS. 25A, 25B, and 25C, FIG. 25A is along the reference cross-section A-A', FIG. 25B is along the reference cross-section B-B', and FIG. 25C is along the reference cross-section D-D' of FIG. 24. In FIGS. 25A-25C, the substrate 50 may be patterned to form the fins 152, the patterning may be done using processes similar to those described above with respect to FIG. 3 for forming the fins 66. The STI regions 68 may be formed, leveled, and recessed so that the channel regions 158 protrude from the STI regions 68, similar to that described above with respect to FIG. 4. A dummy dielectric layer 60 may be deposited over the channel regions 158 and along the STI regions 68, followed by a dummy gate electrode layer and dummy mask layer, similar to that described above with respect to FIGS. 5A and 5B. The dummy mask layer may then be patterned to form dummy gate stacks including a dummy gate dielectric 60, dummy gate electrode, and dummy mask layer, similar to that described above with respect to FIGS. 6A-6C. Gate spacers 81 and 83 may be formed, similar to that described with respect to FIGS. 7A-7C and 8A-8C. Next, recesses may be formed in the fins 152, similar to that described with respect to FIGS. 9A-9B, as applied to the nanostructures 55. The source/drain regions 92 may be formed in the recesses, similar to that described with respect to FIGS. 12A-12E. An ESL 94 followed by an ILD layer 96 may be formed over the masks and the source/drain regions 92, similar to that described with respect to FIGS. 13A-13D. Next, the ILD layer 96 may be leveled and the gate masks removed to expose the dummy gate electrode, similar to that described with respect to FIGS. 14A-14C.

Next, the dummy gate electrode may be removed to form the recesses 98. The processes described above with respect to FIGS. 16A-16F may then be performed to thin the spacers 81 using a radical process to oxidize a layer of the spacers 81, followed by an etch process to remove the oxidized layer of the spacers 81. The radical process may then be repeated followed by another etch process to further thin the spacers 81. Because the embodiment processes are used to thin the spacers 81, loss of the material of the STI region 68 is mitigated or reduced.

Figure 26B:
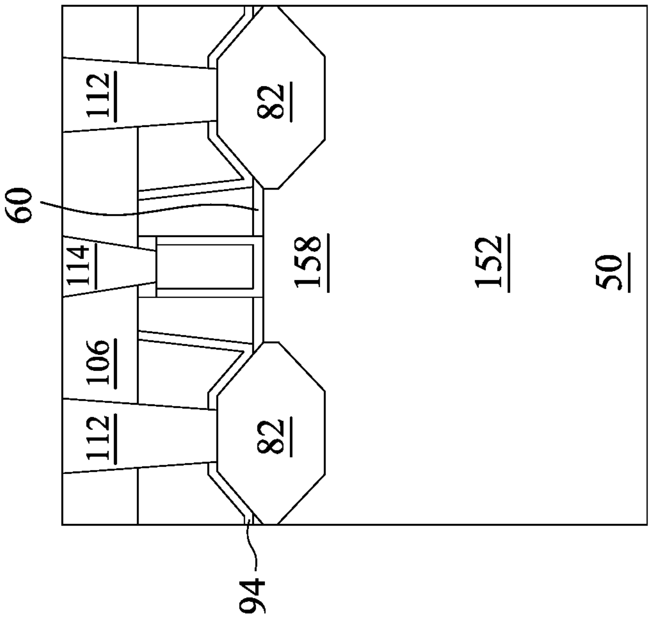
Figure 26A:
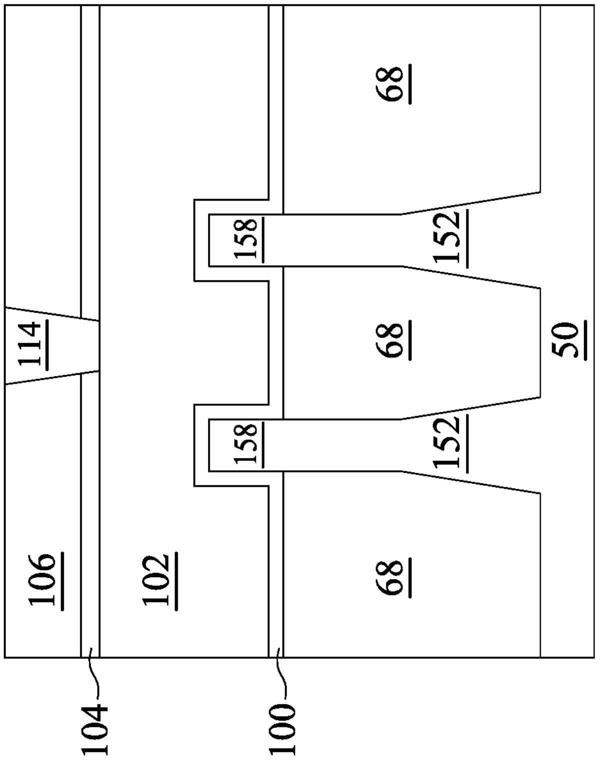
Figure 26C:
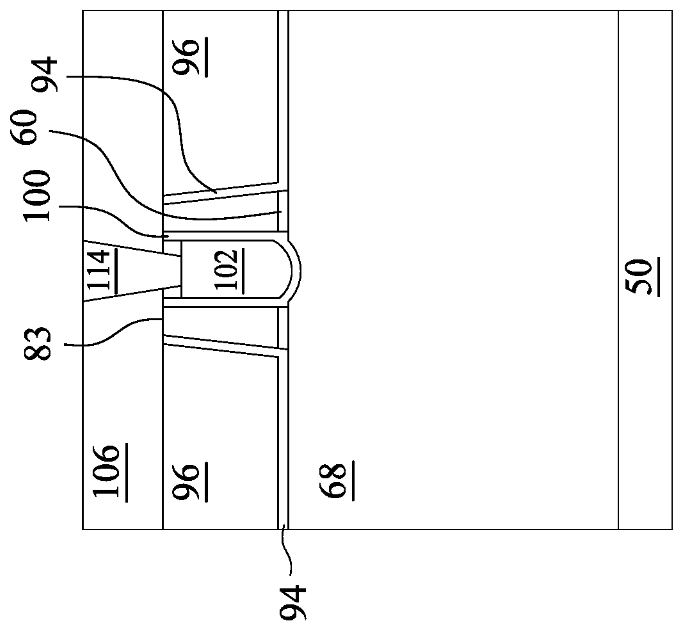

Referring to FIGS. 26A, 26B, and 26C, FIG. 26A is along the reference cross-section A-A', FIG. 26B is along the reference cross-section B-B', and FIG. 26C is along the reference cross-section D-D' of FIG. 24. In FIGS. 26A-26C a gate dielectric 100 is deposited and a gate electrode 102 is deposited. Appropriate work function layers may be incorporated, depending on if the FinFET is an n-type transistor or p-type transistor, such as discussed above with respect to FIGS. 19A-19C. The gate electrode 102 may then be recessed and a gate mask 104 formed thereover, followed by a second ILD 106, similar to that described with respect to FIGS. 20A-20D. Openings for source/drain contacts 112 and gate contacts 114 may be formed, similar to that described with respect to FIGS. 21A-21D. Then, source/drain contacts 112 and gate contacts 114 may be formed in the openings, similar to that described with respect to FIGS. 22A-22D.

Embodiments may achieve advantages. For example, embodiments reduce STI loss during a spacer trim process which provides reduced height-to-width aspect ratio for forming a gate electrode. Especially in in embodiments utilizing larger mesa-style fins, STI loss mitigation helps reduce leakage current which is otherwise more difficult to control due to the larger bulk of the mesa-style fins. Leakage current in regular fins is also reduced by controlling the STI loss. In addition to reducing STI loss, the sidewall spacers are thinned in a more uniform manner top-to-bottom so that a consistent result from the thinning is obtained. Further, the surface smoothness of the STI structure is increased. Also, during the trim process, because the STI loss is mitigated, the sidewall exposure of the fin above the interface of the STI region and fin is reduced, along with an associated angle between the point where the STI region interfaces the sidewall and the upper surface of the fin.

One embodiment is a method including removing a dummy gate over a semiconductor fin, to reveal a spacer lining an opening. The method also includes oxidizing an outer layer of the spacer by a radical treatment process to form an oxidized layer of the spacer. The method also includes etching the oxidized layer of the spacer to remove the oxidized layer. The method also includes forming a replacement metal gate in the opening. In an embodiment, the radical treatment process utilizes radicals generated from an oxygen, nitrogen, or hydrogen-based gas or gas mixture. In an embodiment, the method may include: after etching the oxidized layer of the spacer, performing a second radical treatment process to form a second oxidized layer of the spacer; and etching the second oxidized layer of the spacer to remove the second oxidized layer. In an embodiment, etching the oxidized layer removes a portion of an isolation region at a bottom of the opening. In an embodiment, a thickness of the portion removed is on average between 0 nm and 20 nm. In an embodiment, following removal of the portion of the isolation region, a remainder portion of the isolation region is disposed at a bottom trench of the opening, where a surface roughness of the remainder portion of the isolation region is between 0 nm and 5 nm. In an embodiment, removing the dummy gate exposes a channel region of the semiconductor fin, and the method may include: oxidizing exposed surfaces of the channel region by the radical treatment process to form an oxidation layer of the channel region; and trimming the channel region by etching the oxidation layer of the channel region in the same process as etching the oxidized layer of the spacer. Prior to forming the replacement metal gate, a width of the opening 5 nm above a bottom of the opening is a first width, a width of the opening 20 nm above the bottom of the opening is a second width, where the second width minus the first width is between 0.5 nm and 10 nm.

Another embodiment is a method including performing a radical oxidation process on a first vertical liner of an opening, the radical oxidation process oxidizing a first layer of the first vertical liner. The method also includes etching the first layer to remove the first layer, a height to width ratio of the opening being lessened by etching the first layer. The method also includes depositing a gate dielectric in the opening on the first vertical liner. The method also includes depositing a gate electrode over the gate dielectric. In an embodiment, the opening exposes an isolation region, and the method may include etching the isolation region to form a trench in the isolation region, where etching the isolation region is performed in the same process as etching the first layer. In an embodiment, the trench has an average depth between 0 nm and 20 nm, the average depth being non-zero. In an embodiment, etching the isolation region exposes a sidewall of a semiconductor fin by a non-zero distance between 0 nm and 10 nm. In an embodiment, an angle from an interface of the isolation region and the sidewall to an upper point of the sidewall is between 50° and 80°. In an embodiment, after etching the first layer, the opening has a positive bias and a bottom of the opening has a round tip shape.

Another embodiment is a device including a first channel region of a transistor disposed over a fin, the fin may include a semiconductor material extending in a first direction. The gate structure lining the first channel region and extending over an isolation region in a second direction perpendicular to the first direction, a first portion of the gate structure extending downward into an indent in an upper surface of the isolation region. The device also includes an epitaxial structure embedded in the fin on either side of the first channel region, the epitaxial structure laterally surrounded by a first interlayer dielectric. In an embodiment, a first distance is from sidewall to sidewall of the gate structure at a position 5 nm up from a bottom surface of the gate structure; a second distance is from sidewall to sidewall of the gate structure at a position 20 nm up from the bottom surface of the gate structure; and the second distance minus the first distance is between 0.5 nm and 10 nm. In an embodiment, the gate structure extends from the first channel region to a second channel region of an adjacent transistor, where an average loss of the isolation region under the gate structure is between 0 nm and 20 nm. In an embodiment, roughness of the isolation region under the gate structure is between 0 nm and 5 nm. In an embodiment, a first ray has an endpoint at an upper interface between the isolation region and the fin and a second point at a top edge of the fin; and where an angle between the first ray and a horizontal reference is between 50° and 80°. In an embodiment, a sidewall of the fin is exposed from the isolation region by a distance between about 0 nm and 10 nm.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:

removing a dummy gate over a semiconductor fin, to reveal a spacer lining an opening;

oxidizing an outer layer of the spacer by a radical treatment process to form a first oxidized layer of the spacer;

etching the first oxidized layer of the spacer to remove the first oxidized layer;

after etching the first oxidized layer of the spacer, performing a second radical treatment process to form a second oxidized layer of the spacer;

etching the second oxidized layer of the spacer to remove the second oxidized layer; and forming a replacement metal gate in the opening.

2. The method of claim 1, wherein the radical treatment process utilizes radicals generated from an oxygen, nitrogen, or hydrogen-based gas or gas mixture.

3. The method of claim 1, wherein etching the first oxidized layer removes a portion of an isolation region at a bottom of the opening.

4. The method of claim 3, wherein a thickness of the portion removed is on average between 0 nm and 20 nm.

5. The method of claim 3, wherein following removal of the portion of the isolation region, a remainder portion of the isolation region is disposed at a bottom trench of the opening, wherein a surface roughness of the remainder portion of the isolation region is between 0 nm and 5 nm.

6. The method of claim 1, wherein removing the dummy gate exposes a channel region of the semiconductor fin, further comprising:

oxidizing exposed surfaces of the channel region by the radical treatment process to form an oxidation layer of the channel region; and trimming the channel region by etching the oxidation layer of the channel region in the same process as etching the first oxidized layer of the spacer.

7. The method of claim 1, wherein prior to forming the replacement metal gate, a width of the opening 5 nm above a bottom of the opening is a first width, a width of the opening 20 nm above the bottom of the opening is a second width, wherein the second width minus the first width is between 0.5 nm and 10 nm.

8. The method of claim 1, wherein the radical treatment process utilizes radicals generated from an oxygen-based gas, a nitrogen-based gas, or a hydrogen-based gas.

9. The method of claim 1, wherein oxidizing the outer layer of the spacer by the radical treatment process comprises:

generating a plasma including ions and radicals; and neutralizing the ions.

10. A method comprising:

performing a first radical oxidation process on a first vertical liner of an opening, the first radical oxidation process oxidizing a first layer of the first vertical liner, wherein the first radical oxidation process includes generating a first plasma and neutralizing ions of the first plasma;

etching the first layer to remove the first layer, a height to width ratio of the opening being lessened by etching the first layer;

performing a second radical oxidation process on remaining portions of the first vertical liner, the second radical oxidation process oxidizing a second layer of the first vertical liner, wherein the second radical oxidation process includes generating a second plasma and neutralizing ions of the second plasma;

etching the second layer to remove the second layer, a height to width ratio of the opening being lessened by etching the second layer;

depositing a gate dielectric in the opening on the first vertical liner; and depositing a gate electrode over the gate dielectric.

11. The method of claim 10, wherein the opening exposes an isolation region, further comprising etching the isolation region to form a trench in the isolation region, wherein etching the isolation region is performed in the same process as etching the first layer.

12. The method of claim 11, wherein the trench has an average depth between 0 nm and 20 nm, the average depth being non-zero.

13. The method of claim 11, wherein etching the isolation region exposes a sidewall of a semiconductor fin by a non-zero distance between 0 nm and 10 nm.

14. The method of claim 13, wherein an angle from an interface of the isolation region and the sidewall to an upper point of the sidewall is between 50° and 80°.

15. The method of claim 10, wherein after etching the first layer, the opening has a positive bias and a bottom of the opening has a round tip shape.

16. The method of claim 10, wherein the first radical oxidation process is a different process than the second radical oxidation process.

17. A method comprising:

forming a fin protruding from a substrate;

forming an isolation region adjacent the fin, the fin protruding above an upper surface of the isolation region;

forming a dummy gate extending over the fin and over the upper surface of the isolation region;

forming a first spacer and a second spacer on opposing sides of the dummy gate;

removing the dummy gate to form a recess between the first spacer and the second spacer, wherein sidewalls of the recess expose a sidewall of the first spacer and a sidewall of the second spacer;

performing a radical treatment process on the first spacer to form a first modified layer on the first spacer, wherein the radical treatment process includes generating radicals, wherein the radicals react with material of the first spacer to form the first modified layer;

etching the first modified layer, wherein etching the first modified layer recesses the upper surface of the isolation region, wherein performing the radical treatment process and etching the first modified layer are performed multiple times;

depositing a gate dielectric in the recess; and depositing a gate electrode over the gate dielectric.

18. The method of claim 17, wherein a roughness of the isolation region under the gate dielectric is between 0 nm and 5 nm.

19. The method of claim 17, wherein etching the first modified layer recesses the upper surface of the isolation region to a depth in a range of 0 nm to 20 nm.

20. The method of claim 17, wherein the radical treatment process simultaneously oxidizes exposed surfaces of the fin to form an oxidized layer on the fin, and etching the first modified layer simultaneously etches the oxidized layer on the fin to trim the fin.

* * * * *